United States Patent
Nakagawa et al.

[19]
[11] Patent Number: 6,118,149
[45] Date of Patent: Sep. 12, 2000

[54] TRENCH GATE MOSFET

[75] Inventors: Akio Nakagawa, Yokohama; Yusuke Kawaguchi, Kanagawa-ken, both of Japan

[73] Assignee: Kabushiki Kaisha Toshiba, Kawasaki, Japan

[21] Appl. No.: 09/039,389

[22] Filed: Mar. 16, 1998

[30] Foreign Application Priority Data

Mar. 17, 1997 [JP] Japan .................................. 9-063283
Jul. 31, 1997 [JP] Japan .................................. 9-206931

[51] Int. Cl.[7] ................................................... H01L 29/94
[52] U.S. Cl. ........................... 257/330; 257/331; 257/332; 257/341; 257/342
[58] Field of Search ..................................... 257/330, 331, 257/332, 334, 341–342

[56] References Cited

U.S. PATENT DOCUMENTS 5,796,125  8/1998  Matsudai et al. .................... 257/141

FOREIGN PATENT DOCUMENTS 2-79475  3/1990  Japan .

OTHER PUBLICATIONS

B. J. Baliga, et al., "The Accumulation–Mode Field–Effect Transistor: A New UltraLow On–Resistance MOSFET," IEEE Electron Device Letters, vol. 13, No. 8, (Aug. 1992), pp. 427–429.

J. P. Colinge, et al., "Silicon–On–Insulator 'Gate–All–Around Device'," IEEE IEDM Technical Digest, (1990), pp. 595–598.

*Primary Examiner*—John Guay
*Attorney, Agent, or Firm*—Oblon, Spivak, McClelland, Maier & Neustadt, P.C.

[57] ABSTRACT

The present invention discloses a semiconductor device which can be used as a switching element for portable appliances and realize a low breakdown voltage and a low ON resistance. More specifically, the semiconductor device is constructed in such a manner that a semiconductor layer is vertically or laterally sandwiched between gate electrodes through insulation films. In this polycrystalline semiconductor layer, a source region and a drain region are formed in both end portions thereof which contain an impurity at a concentration higher than the concentration in the middle portion thereof, and, in the middle portion, a channel region is formed, whereby carriers can be made to flow throughout the whole channel region.

8 Claims, 35 Drawing Sheets

TRENCH GATE MOSFET

BACKGROUND OF THE INVENTION

The present invention relates mainly to a semiconductor device using polycrystalline silicon and, more particularly, a semiconductor device having a planar channel region.

Recently, as a result of the development of the integration technique, various portable appliances such as portable telephones and electronic pocket notebooks have come to be actually used.

This type of portable appliances each use a battery as its power source, in which case, in view of reducing the switching loss thereof, a power MOSFET is used as a switching element having a low breakdown voltage and a low resistance.

Further, in the case of this type of portable appliances, the power source voltage tends to be lowered in view of low power consumption and long useful life; and thus, the power MOSFET which is the switching element of such a portable appliance is required to have its ON resistance lowered.

As has been described above, a semiconductor device for switching is required to have its ON resistance lowered to such an extent that the semiconductor device can be used also for portable appliances etc.

On the other hand, as a switching semiconductor device with a low breakdown voltage of about 8V to 60V, lateral MOSFET is known.

FIG. 1 is a plan view showing the structure of this type of lateral MOSFET, and FIG. 2 is a sectional view taken along the line 2—2 in FIG. 1 and seen in the direction indicated by arrows. This type of lateral MOSFET is constituted in such a manner that, on the surface of a p-type semiconductor substrate 1, a p-type well layer 2 is selectively formed, and, on the p-type well layer 2, an n-type drain layer 3 is selectively formed. On the p-type well layer 2, an n-type source layer 4 is formed at a position spaced apart from the n-type drain layer 3.

On that portion of the p-type well layer 2 which lies between the n-type drain layer 3 and the n-type source layer 4, a gate insulation film 5 is formed. On the gate insulation film 5, a gate electrode 6 is formed. On the n-type drain layer 3, a drain electrode 7 is formed. On the p-type well layer 2 ad the n-type source layer 4, a source electrode 8 is formed.

This lateral MOSFET operates as follows:

If, when a positive voltage is applied to the drain electrode 7 and a negative voltage is applied to the source electrode 8, a positive voltage which is more positive than the voltage at the source is applied to the gate electrode 6, then that surface portion of the p-type well layer 2 which is adjacent to the gate insulation film 5 is inverted into the n conductivity type, and thus, electrons flow from the n-type source layer 4 to the n-type drain layer 3 through the inversion layer. That is, the element is brought into conduction.

In case such a lateral MOSFET is used for the switching of a large current, it is important in view of suppressing the loss to hold down the resistance (ON resistance) in the ON state of the lateral MOSFET. Here, the ON resistance of the lateral MOSFET is, for the most part, the resistance of the channel portion 109. Due to this, in order to decrease the ON resistance of the lateral MOSFET, the width of the channel thereof should be enlarged. However, if the channel width is enlarged, the area occupied by the lateral MOSFET is increased.

Further, in the case of a lateral MOSFET having a low breakdown voltage of, e.g. 30V, the ON resistance thereof is about 40 $\Omega\cdot mm^2$; and, any further decrease of the ON resistance has its limit.

As has been described above, in the case of a lateral MOSFET, there is the problem that, if the channel width is widened, the area occupied by the element is increased.

Further, in the case of a lateral MOSFET, current flows through only the surface thereof; and thus, there is a limit to the reduction of the ON resistance thereof.

Next, a description of a semiconductor device of the vertical trench structure will be described below. FIG. 3 is a sectional view showing the structure of a vertical trench type semiconductor device. This semiconductor device is constructed in such a manner that, on an n+ type substrate 11 composed of monocrystalline silicon, an n− type base layer 12 is formed, and, in the surface of the n− type base layer 12, a p-type base layer (well) 13 is formed. In the surface of the p-type base layer 13, an n+ type source layer 14 is selectively formed. In the surface of the n+ type source layer 14, trenches 15 are selectively formed extending to a depth reaching the n-type substrate 11. In the respective trench 15, a gate electrode 17 is buried through an insulation film 16. On the surface of this semiconductor layer, an insulation layer 18 is selectively formed so as to expose the p-type base layer 13 and the n+ type source layer 14 in the vicinity thereof.

A source electrode 19 is formed so as to be contacted with the surface portions of the p-type base layer 13 and the n+ type source layer 14 which portions lie between the insulation layers. Further, on the opposite surface, with reference to the source electrode 19, of the n+ type substrate 11, a drain electrode 20 is formed.

The MOSFET of such a vertical trench structure, the interval W between the trenches becomes 2 μm at the minimum. Such a MOSFET is formed in such a manner that, in order to prevent the operation of the parasitic npn transistor, the source electrode 19 is formed in a state contacted with both of the n+ type source layer 14 and the p-type base layer 13 so as to electrically short-circuit the two layers to each other.

Further, FIG. 4 shows the n+, n− n+ structure which is the structure obtained by omitting the p-type layer from the structure shown in FIG. 3. However, the n+ n− n+ structure has the defect that the breakdown voltage is lowered since the provision of a wider trench interval W is necessary.

For instance, in case a MOSFET of the n+ n− n+ structure is composed of monocrystalline silicon, there arises the problem that, even if the trenches are formed with a narrow trench interval of 0.5 μm or less, the holes generated in the depletion layer are accumulated in the n− type base layer 12 to cause a parasitic bipolar operation, so that the breakdown voltage is deteriorated. Due to this, the breakdown voltage is lower than in the case the MOSFET is composed of polycrystalline silicon.

BRIEF SUMMARY OF THE INVENTION

It is the object of the present invention to provide a semiconductor device which can be used also as a switching element for portable appliances, and the breakdown voltage and the ON resistance of which can both be lowered.

Another object of the present invention is to provide a semiconductor device constituted in such a manner that the ON resistance thereof can be reduced to a substantial degree without increasing the area occupied by the element.

The essential point of the present invention lies in the fact that a power element is formed with a structure using thin films on the basis of the knowledge, found by the present inventor, that the channel mobility of a thin-film transistor composed of polycrystalline silicon can be improved, by applying an appropriate treatment, to the same level as a MOSFET composed of monocrystalline silicon.

By the "appropriate treatment" mentioned above, it is meant that, for instance, amorphous silicon is deposited into a thin film and, thereafter, annealed at a temperature of 600° C. for about 8 to 20 hours. By this treatment, the amorphous silicon film can be made to grow into a high-quality polycrystalline silicon film.

Another essential point of the present invention lies in the structure of a lateral MOSFET constituted in such a manner that trench gates are provided between the source and drain, the channel width is widened in proportion to the depth of the trenches, and the current is made to flow along the trenches. As a result, in the case of the present invention, the ON resistance of the MOSFET can be decreased to a substantial degree without increasing the area occupied by the element as compared with the planar structure.

Yet another essential point of the present invention lies in the structure of a vertical trench type semiconductor device constructed in such a manner that the channel region between the trenches and the region of contact with the source electrode are formed in a state separated from each other, whereby the trench interval can be shortened, and the semiconductor device is composed of polycrystalline silicon, whereby the operation of the parasitic bipolar transistor is eliminated. As a result, a high switching speed and the cut-off of a large current can be realized all together, in the semiconductor device having a narrow trench interval structure.

On the basis of the above-described essential points of the present invention, the below-described concrete technical means are adopted. The first to fourth present inventions which will first be described below pertain to thin-film transistors composed of polycrystalline silicon.

A semiconductor device according to the first invention is characterized by comprising a first polycrystalline semiconductor layer which has a planar shape, both end portions thereof containing an impurity at a higher concentration than the concentration of the middle portion thereof to form a source region and a drain region, respectively, the middle portion forming a channel region; a plurality of gate electrodes which are disposed so as to sandwich the middle portion of the first polycrystalline semiconductor from both sides thereof through an insulation film; a source electrode formed on the source region, and a drain electrode formed on the drain region.

Further, the semiconductor device according to the second invention is characterized in that, in the first invention, the polycrystalline semiconductor layer comprises a plurality of polycrystalline semiconductor layers.

Further, the semiconductor device according to the third invention is characterized in that, in the first or second invention, the thickness of the polycrystalline semiconductor layer is 800 nm or less.

Further, the semiconductor device according to the fourth invention is characterized in that, in any of the first to third inventions, the semiconductor device comprises a second polycrystalline semiconductor layer formed simultaneously with the formation of some region of the first polycrystalline semiconductor layer, and a CMOS transistor formed in the second polycrystalline semiconductor layer.

Thus, according to the first invention, the above-described means are adopted, so that, by sandwiching the thin-film polycrystalline semiconductor layer between the gate electrodes, the whole middle portion of the polycrystalline semiconductor layer can be rendered into a channel, thus realizing a high mobility, and therefore, this semiconductor device can be used also as a switching element for portable appliances. Thus, a low breakdown voltage and a low ON resistance can be realized.

Further, according to the second invention, the semiconductor device is constituted in such a manner that a plurality of polycrystalline semiconductor layers of which a high mobility can be expected are disposed electrically in parallel to one another, so that, in addition to the effects of the first invention, there can be obtained the effect that the ON resistance can be more decreased.

Further, according to the third invention, the thickness of the polycrystalline semiconductor layer is so small as 800 nm or less, so that the whole polycrystalline semiconductor layer in its thickness direction becomes a channel, and thus, the same channel mobility as in the case of monocyrstalline silicon can be achieved, so that, in addition to the effects of the first or second invention, there is obtained the effect that the ON resistance can be further decreased.

Further, according to the fourth invention, the effects of one of the first to third inventions can be achieved, and in addition, in case the first polycrystalline semiconductor layer constitutes a power element, an intelligent semiconductor device consisting of a control circuit comprising the CMOS and of the power element can be realized.

Further, the fifth to tenth inventions pertain to semiconductor devices such as vertical trench structure.

A semiconductor device according to the fifth invention is characterized by comprising a source electrode; a substrate of a first conductivity type formed on the source electrode; a high-resistance layer of a second conductivity type formed on the substrate of the first conductivity type; a base layer of the first conductivity type formed in the high-resistance layer of the second conductivity type; a diffused layer of the first conductivity type formed in the surface of the base layer of the first conductivity type in a state extending from the surface of the base layer of the first conductivity type to a depth reaching the substrate of the first conductivity type; a source layer of the second conductivity type formed in the surface legions of the diffused layer of the first conductivity type and the base layer of the first conductivity type; a conductive material layer formed on the diffused layer of the first conductivity type and on the source layer of the second conductivity type; a drain layer of the second conductivity type selectively formed on the surface of the high-resistance layer of the second conductivity type; a drain electrode formed on the drain layer of the second conductivity type; and gate electrodes formed in a state buried through gate insulation films in a plurality of trenches formed, in the surface portion between the drain layer of the second conductivity type and the source layer of the second conductivity type, the trenches extending to an intermediate depth of the high-resistance layer of the second conductivity type.

Further, the semiconductor device according to the sixth invention is characterized by comprising a drain electrode; a drain layer of a second conductivity type formed on the drain electrode; a high-resistance layer of the second conductivity type formed on the drain layer of the second conductivity type; base layers of a first conductivity type selectively formed in the high-resistance layer of the second conductivity type and disposed approximately in parallel to each other; source layers of the second conductivity type selectively formed in the surface of the base layers of the first conductivity type and disposed approximately in parallel to each other; a source electrode formed on the source layers of the second conductivity type; and gate electrodes formed in a buried state through gate insulation films in a plurality of trenches formed, in the surface portion between the source layers of the second conductivity type, the trenches extending to an intermediate depth of the high-resistance layer of the second conductivity type; wherein the trenches each have a planar shape extending in a direction approximately perpendicular to the source layers of second conductivity type.

Further, the semiconductor device according to the seventh invention is characterized by comprising, in the sixth invention, a drain layer of the first conductivity type in lieu of the drain layer of the second conductivity type formed on the drain electrode.

Further, the semiconductor device according to the eighth invention is characterized by comprising a drain electrode; a substrate of a second conductivity type formed on the drain electrode; a high-resistance layer of the second conductivity type formed on the substrate of the second conductivity type; a buried layer of the second conductivity type formed in the high-resistance layer of the second conductivity type, the buried layer having a resistance lower than that of the high-resistance layer of the second conductivity type; a drain layer of the second conductivity type formed in the surface of the buried layer of the second conductivity type; a base layer of a first conductivity type formed in the surface region of the high-resistance layer of the second conductivity type, which is different from the region in which the drain layer of the second conductivity type; a source layer of the second conductivity type formed in the surface of the base layer of the first conductivity type; a source electrode formed on the source layer of the second conductivity type; and gate electrodes formed in a buried state through gate insulation films in a plurality of trenches formed, in the surface portion between the source layer of the second conductivity type and the drain layer of the second conductivity type, the trenches extending to an intermediate depth of the high-resistance layer of the second conductivity type.

Further, the semiconductor device according to the ninth invention is characterized by comprising a drain electrode; a drain layer of a second conductivity type formed on the drain electrode; a high-resistance layer of the second conductivity type formed on the drain layer of the second conductivity type; a base layer of a first conductivity type formed on the high-resistance layer of the second conductivity type; a rectilinear contact layer of the first conductivity type selectively formed in the surface of the base layer of the first conductivity type; a source layer of the second conductivity type formed in the surface of a region of the base layer of the first conductivity type which region is different from the region in which the rectilinear contact layer of the first conductivity type is disposed; gate electrodes formed in a state buried through gate insulation films in a plurality of trenches which are formed in the surface of the source layer of the second conductivity type in a state extending from the surface of the source layer of the second conductivity type to a depth reaching the high-resistance of the second conductivity type; and a source electrode formed in contact with the rectilinear contact layer of the first conductivity type and the portion of the source layer of the second conductivity type which portion lies in the vicinity of the rectilinear contact layer of the first conductivity type; wherein the drain layer of the second conductivity type, the high-resistance layer of the second conductivity type, the base layer of the first conductivity type, the rectilinear contact layer of the first conductivity type, and the source layer of the second conductivity type are formed of polycrystalline silicon.

Further, the semiconductor device according to the ninth invention is characterized in that, in the tenth invention, the length-direction of the rectilinear contact layer of the first conductivity type and the length-direction of each of the trenches are approximately perpendicular to each other.

Thus, in the fifth to tenth inventions, according to the above-described structure, the two-layer wiring on the upper surface is disused, so that the wiring resistance which poses a problem in connection with an aluminum (Al) wiring etc. can be decreased; and thus, this structure is very suited for large-current elements.

Further, according to the fifth to eighth invention, the above-described means are adapted, so that the width of the channel can be widened, with the element's area kept invariable, in accordance with the depth and the mounting density of the trenches: and therefore, the resistance of the channel portion of the element can be decreased, that is, the resistance of the element itself can be decreased, whereby the ON resistance thereof can be decreased.

Further, according to the eighth invention, a low-resistance buried layer of the second conductivity type is provided, so that the current is made to flow in a state spreading throughout the whole width of the channel; and thus, there can be obtained the effect that the ON resistance can be decreased with ease yet with certainty.

Further, according to the ninth invention, the gate electrodes of the trench structure and the contact region to the source electrode are formed in a state separated from each other, so that narrow trench intervals can be realized. Further, the respective semiconductor layers are formed of polycrystalline silicon, whereby the parasitic transistor operation is eliminated, so that a high switching speed and the cut-off of a large current can be realized at the same time.

Further, according to the tenth invention, the length-direction of the rectilinear contact layer of the first conductivity type and the length-direction of the respective trenches stand in a relationship of being approximately perpendicular to each other, and therefore, in addition to the effects of the ninth invention, there can be obtained the effect that the electrons injected from the source electrode can smoothly flow through the channel region between the trenches.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE SEVERAL VIEWS OF DRAWING

The accompanying drawings, which are incorporated in and constitute a part of the specification, illustrated presently preferred embodiments of the present invention and, together with the general description given above and the detailed description of the preferred embodiments given below, serve to explain the principles of the present invention.

FIG. 12 and seen in the direction indicated by arrows;

FIG. 33 and seen in the direction indicated by arrows;

DETAILED DESCRIPTION OF THE INVENTION

Figure 1:
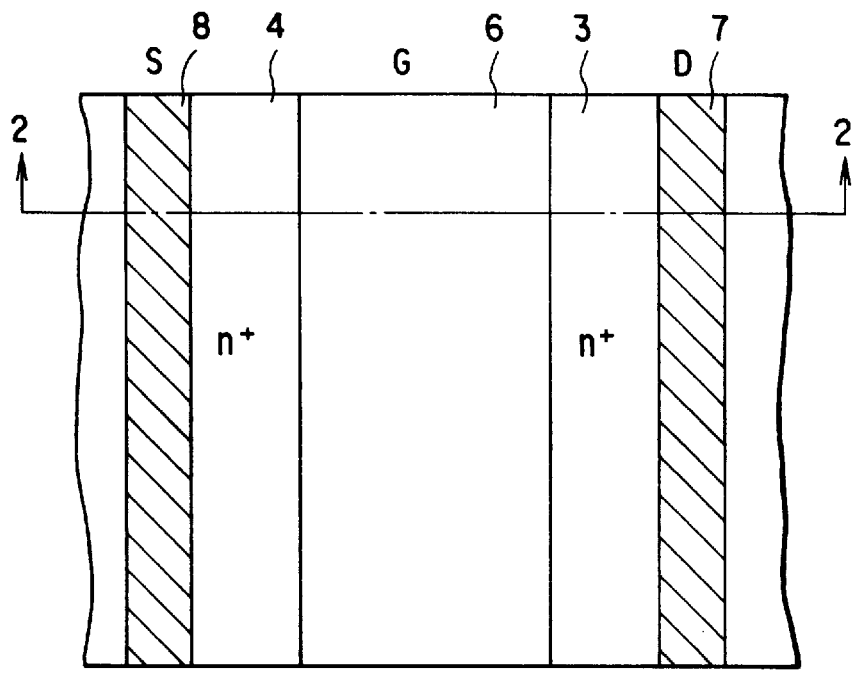
FIG. 1 is a plan view showing the structure of a conventional lateral MOSFET.
Figure 2:
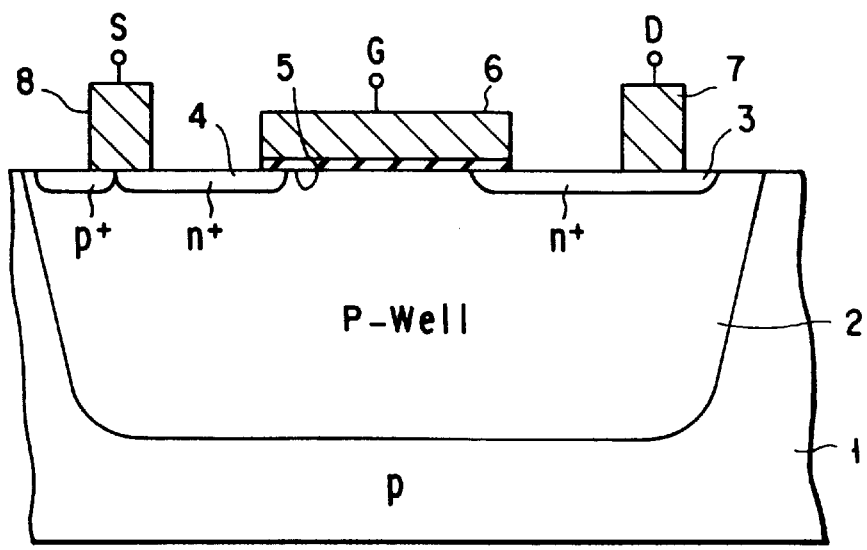
FIG. 2 is a sectional view taken along the line 2—2 in FIG. 1 and seen in the direction indicated by arrows.
Figure 3:
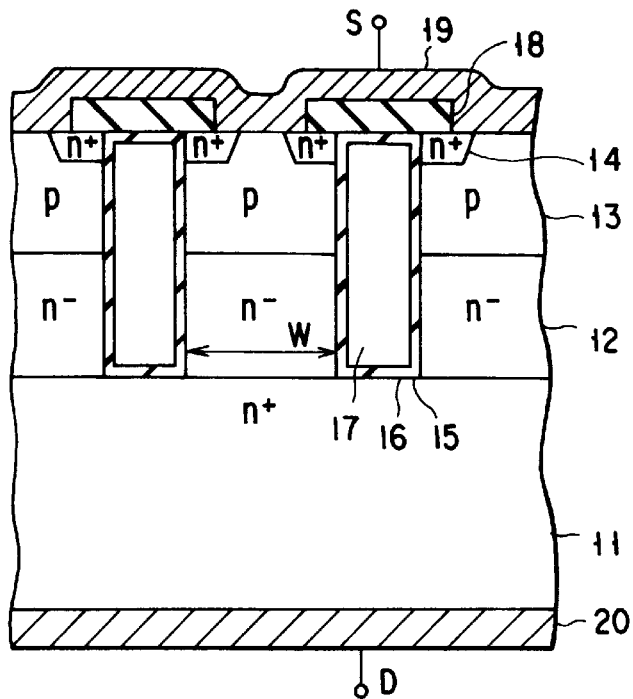
FIG. 3 and FIG. 4 are sectional views showing conventional vertical MOSFETs, respectively.
Figure 4:
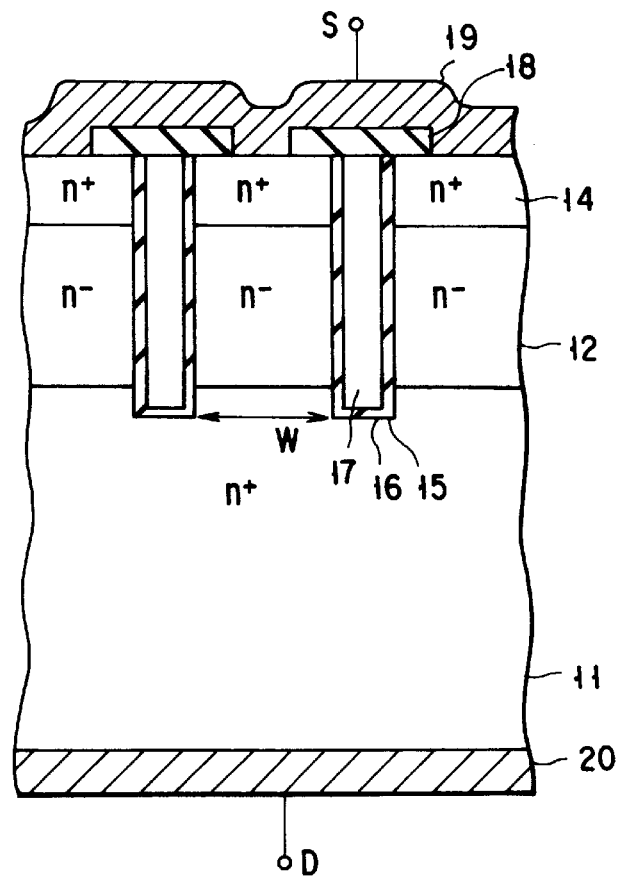

Embodiments of the present invention will now be described referring to the drawings. In this description, the polycrystalline silicon is used in the first to sixth and eighteenth embodiments, and the monocrystalline silicon is used in the seventh to seventeenth and nineteenth to twenty-six embodiments. But the polycrystalline silicon may be used suitably in the fifteenth to seventeenth embodiments.
(First Embodiment)

Figure 5:
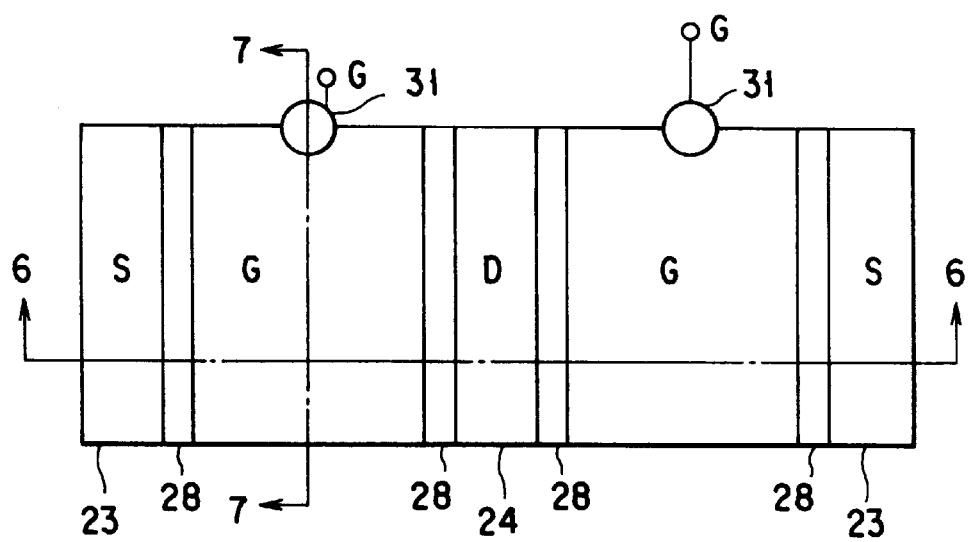
FIG. 5 is a plan view showing the structure of the semiconductor device according to a first embodiment of the present invention.
Figure 6:
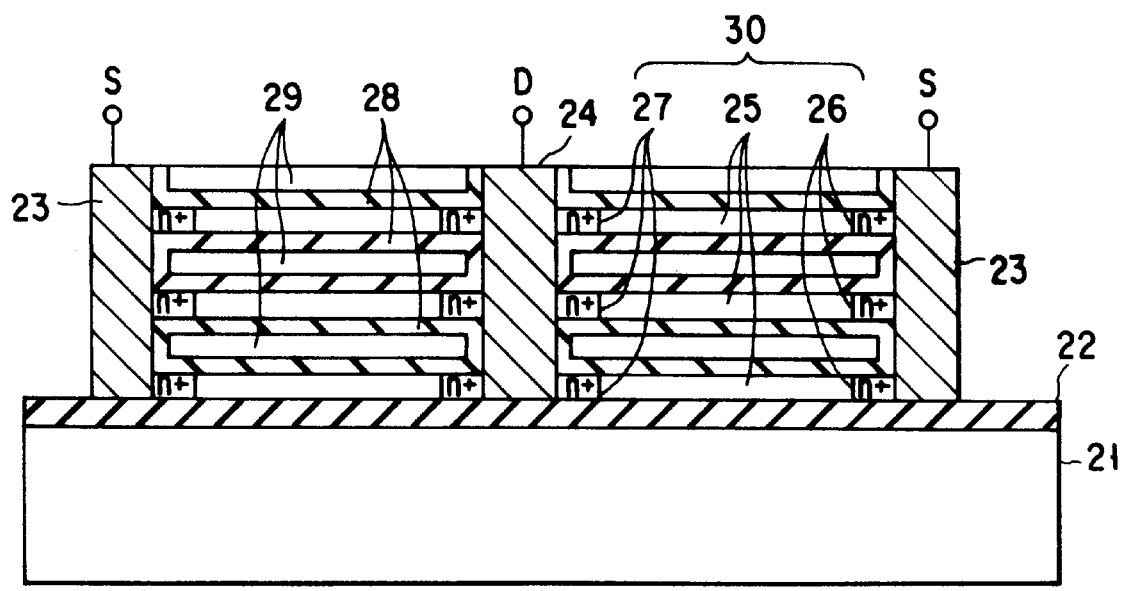
FIG. 6 is a sectional view taken along the line 6—6 in FIG. 5 and seen in the direction indicated by arrows.
Figure 7:
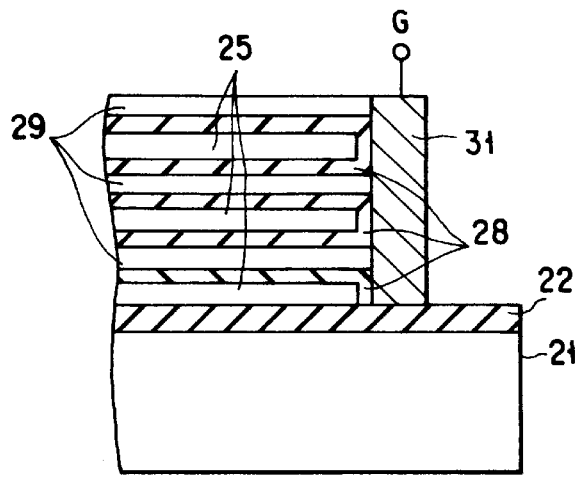
FIG. 7 is a sectional view taken along the line 7—7 in FIG. 5 and seen in the direction indicated by arrows.

FIG. 5 is a plan view showing the structure of the semiconductor device according to a first embodiment of the present invention, FIG. 6 is a sectional view taken along the line 6—6 in FIG. 5 and seen in the direction indicated by arrows, and FIG. 7 is a sectional view taken along the line 7—7 in FIG. 5 and seen in the direction indicated by arrows. This semiconductor device is constructed in such a manner that, on a substrate 21, an oxide film 22 is formed, and, on the oxide film 22, source electrodes 23 and a drain electrode 24 are formed each in a stripe-shaped state.

Between the source electrodes 23 and the drain electrode 24, high-resistance channel layers 25 composed of polycrystalline silicon are formed. Said channel layers 25 each should desirably be formed so thin as about 500 nm in thickness in view of enhancing the channel mobility. At one end of each channel layer 25 which (one end) is adjacent to the source electrode 23, a source layer 26 having a high impurity concentration is formed, while at the other end thereof which is adjacent to the drain electrode 24, a drain layer 27 having a high impurity concentration is formed.

On the source layer 26, the channel layer 25 and the drain layer 27, a buried type gate electrode 29 surrounded by an oxide film 28 is disposed.

In this way, between the source electrodes 23 and the drain electrode 24, a polycrystalline semiconductor layer 30 consisting of the source layer 26, the channel layer 25 and the drain layer 27 and the buried type gate electrode 29 surrounded by the oxide film 28 are disposed alternately.

Further, in partial regions between the source electrodes 23 and the drain electrode 24, gate wiring layers 31 are formed extending from the uppermost gate electrode 29 to a depth reaching the oxide film 22.

This gate wiring layers 31 are electrically connected to the gate electrodes 29 but electrically insulated from the channel layers 25 by the oxide films 28, as shown in FIG. 7.

In the semiconductor device according to this embodiment which is constructed as described above, the thin-film channel layers 25 composed of polycrystalline silicon are each sandwiched between the buried type gate electrodes 29, whereby, when the semiconductor device is in ON state, a high mobility can be realized with all the channel layers 25 rendered into a channel, so that the semiconductor device can be used as a switching element for portable equipment; and a low breakdown voltage and a low ON resistance can both be realized at the same time.

Further, even in case only one channel layer 25 is used, the semiconductor device can be expected to realize about the same degree of mobility as a monocrystalline MOSFET; but, for all this, this embodiment is constituted in such a manner that a plurality of such channel layers 25 are disposed electrically in parallel to one another, and therefore, an ON resistance lower than the ON resistance of a monocrystalline MOSFET can be realized.

Further, the respective channel layer 25 is so thin as 800 nm or less in thickness, so that the whole polycrystalline semiconductor layer in its thickness direction becomes a channel, so that, with each channel layer 25, the same degree of channel mobility as that of a monocrystalline silicon MOSFET can be achieved with ease and certainty, and therefore, the ON resistance can be further reduced.

(Second Embodiment)

Figure 8:
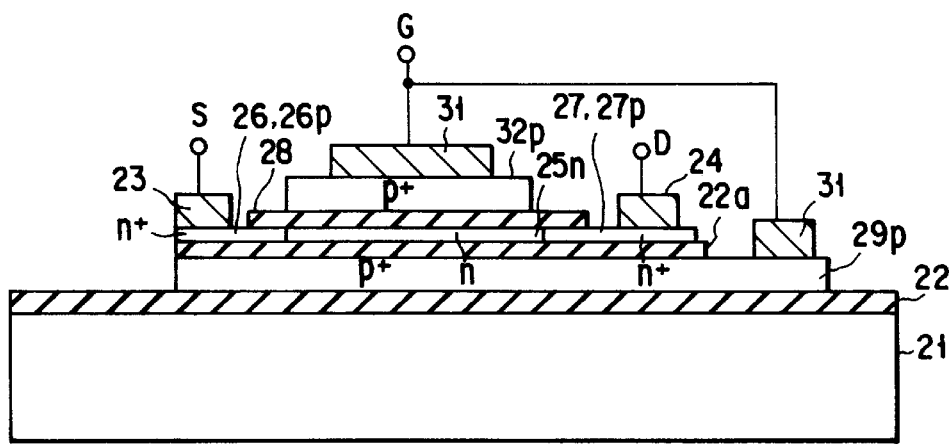
FIG. 8 is a sectional view showing the structure of the semiconductor device according to a second embodiment of the present invention.

FIG. 8 is a sectional view showing the structure of the semiconductor device according to a second embodiment of the present invention, wherein the same portions as those shown in FIGS. 5 to 7 are referenced by the same reference numerals and symbols to thereby omit the repetition of the detailed description thereof; in all the following drawings, the same reference numerals and symbols denote the same component portions.

This semiconductor device is an n-channel MOSFET which comprises one layer of polycrystalline silicon channel vertically sandwiched between gates unlike the multi-layer channel structure shown in FIGS. 5 to 7.

More concretely, this semiconductor device is constructed in such a manner that, on a substrate 21, an oxide film 22 and a first p+ type gate electrode 29p is formed. On the first p+ type gate electrode 29p, a gate wiring layer 31 and an oxide film 22a are selectively formed. On this oxide film 22a, an n+ type source layer 26, an n− type channel layer 25n, and an n+ type drain layer 27 are successively disposed in the lateral direction. On the n+ type source layer 26, a source electrode 23 is formed. On the n+ type drain layer 27, a drain electrode 24 is formed.

On a portion of the n+ type source layer 26, the n− type channel layer 25n and a portion of the n+ type drain layer 27, a second p+ type gate electrode 32p is formed through a gate oxide film 28. Further, the first and second p+ gate electrodes 29p and 32p are connected to each other through a gate wiring layer 31.

According to the above-described structure, the same effects as those of the first embodiment can also be achieved. Further, it is a matter of course that this embodiment can be changed to a p-channel MOSFET by changing the n+ type source layer 26 and the n+ type drain layer 27 into p+ type layers, that is, a p+ type source 26P and a p+ type drain layer 27P.

(Third Embodiment)

Figure 10:
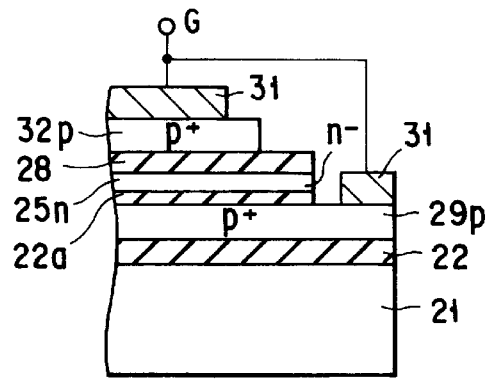
FIG. 10 is a sectional view taken along the line 10—10 in FIG. 9 and seen in the direction indicated by arrows.
Figure 9:
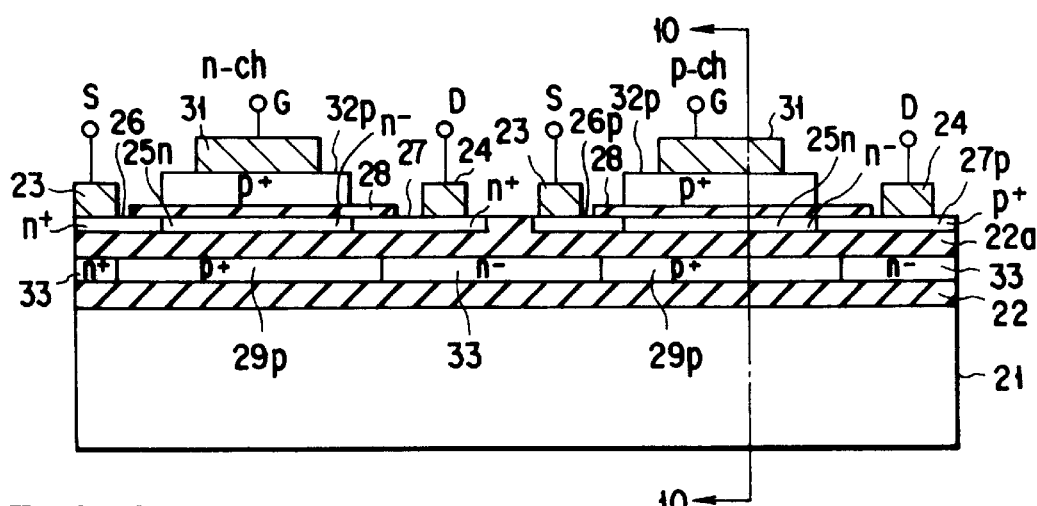
FIG. 9 is a sectional view showing the structure of the semiconductor device according to a third embodiment of the present invention.
Figure 11:
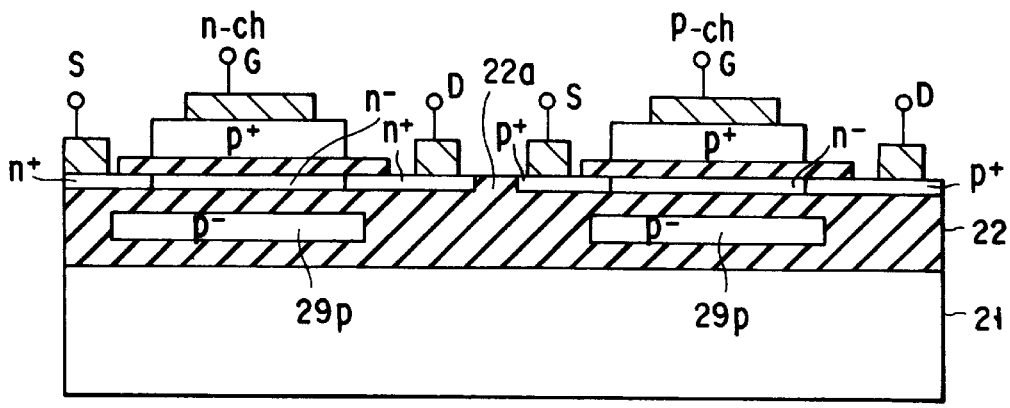
FIG. 11 is a sectional view showing the structure of a structural modification of the same embodiment.

FIG. 9 is a sectional view showing the structure of the semiconductor device according to a third embodiment of the present invention, and FIG. 10 is a sectional view taken along the line 10—10 in FIG. 9 and seen in the direction indicated by arrows.

This semiconductor device is a CMOS in which an n-channel MOSFET and a p-channel MOSFET are disposed in parallel.

More concretely, an oxide film 22 is formed on a substrate 21, and, on the oxide film 22, an n− type high-resistance layer 33 is formed. In this n− type high-resistance layer 33, a plurality of first p+ type gate electrodes are selectively formed. Here, the n− type high-resistance layer 33 is formed in such a manner that the amount of the impurity added is controlled so that said high-resistance layer 33 may become an n− type, and then, an impurity is diffused so that said layer 33 may selectively become a p+ type; and thus, the respective first p+ type gate electrodes 29p are formed. Since n− type high-resistance layers 33 exist between the respective first p+ gate electrodes 29p, said first p+ type gate electrodes 29p are electrically isolated from one another.

Further, on the n− type high-resistance layers 33 and the p+ type gate electrodes 29p, an oxide film 22a is formed, and, on this oxide film 22a, an n-channel MOSFET and a p-channel MOSFET are formed as in the foregoing case. Further, said n-channel MOSFET and said p-channel MOSFET are constituted in such a manner that the n-channel layers 25n thereof are both alike disposed in a state positioned on the first p+ type gate electrode 29p through the oxide film 22a.

According to this structure, also the same effects as those of the first embodiment can be obtained. Further, even in case this embodiment is modified in such a manner that the first p+ type gate electrodes 29p are separated from each other in the oxide film 22a by LOCOS, the same effects can be obtained.

(Fourth Embodiment)

Figure 12:
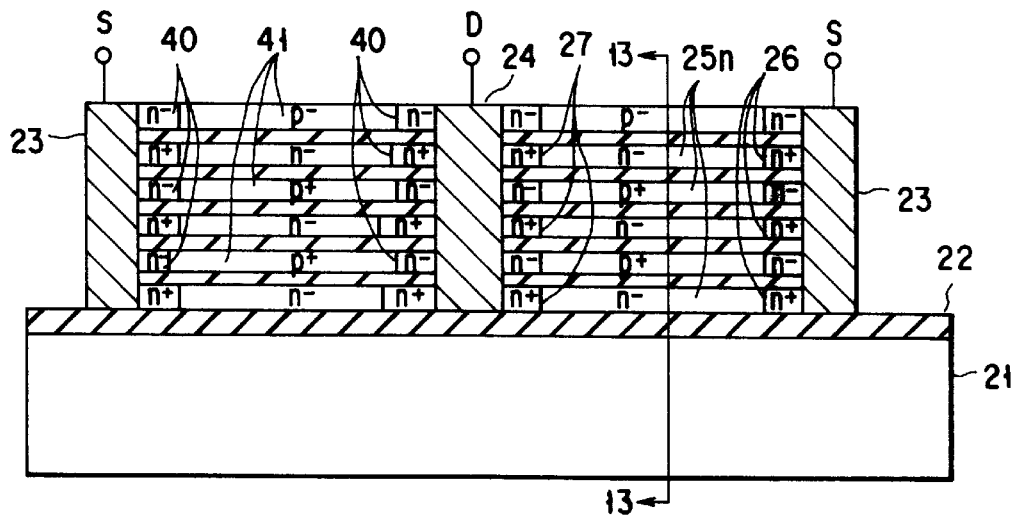
FIG. 12 is a sectional view showing the structure of the semiconductor device according to a fourth embodiment of the present invention.
Figure 13:
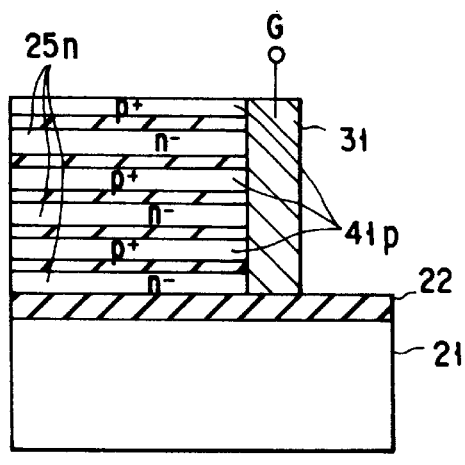
FIG. 13 is a sectional view taken along the line 13—13 in FIG.

FIG. 12 is a sectional view showing the structure of the semiconductor device according to a fourth embodiment of the present invention, and FIG. 13 is a sectional view taken along the line 13—13 in FIG. 12, said fourth embodiment being a modification of the structure shown in FIGS. 5 to 7.

That is, this embodiment is directed to an easier realization of the structure according to the first embodiment. More concretely, this embodiment is constructed in such a manner that, in place of the buried type gate electrodes 29, n− type high-resistance layers 40 are provided in the portions adjacent to the source electrodes 23 and the drain electrode 24, and further, p+ type gate electrodes 41p electrically insulated from said electrodes 23 and 24 are provided, as shown in FIG. 12 and FIG. 13.

Here, the p+ type gate electrodes 41p are composed of polycrystalline silicon with B (boron) added therein, and those portions of said gate electrodes 41p which are contacted with the source electrodes 23 and the drain electrode 24 are formed, without adding boron therein, into n− type high-resistance layers 40.

The n+ type source layers 26 and the n+ type drain layers 27 disposed at both ends of the n− type channel layers 25n are formed by injecting P (phosphorus) to a high concentration by ion implantation and by annealing them.

According to the above-described structure, the p+ type gate electrodes 41p are electrically insulated from the source electrodes 23 and the drain electrode 24 by the n− type high-resistance layers 40, and the n+ type source layers 26 and the n+ type drain layers 27 disposed at both ends of the channels layers 25 are connected to the source electrodes 23 and the drain electrode 24, respectively, so that, in addition to the effects of the first embodiment, there is obtained the effect that the step pertaining to the buried structure can be omitted; and thus, the manufacturing steps can be simplified.

(Fifth Embodiment)

Figure 14:
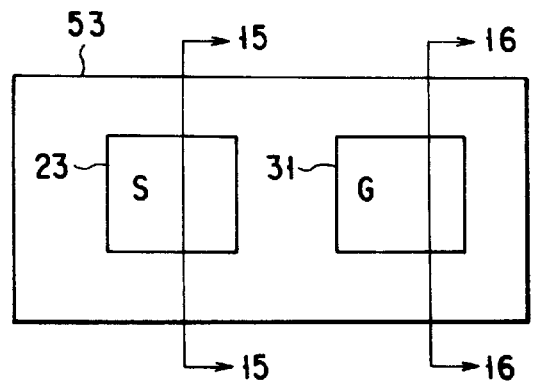
FIG. 14 is a plan view showing the structure of the semiconductor device according to a fifth embodiment of the present invention.
Figure 15:
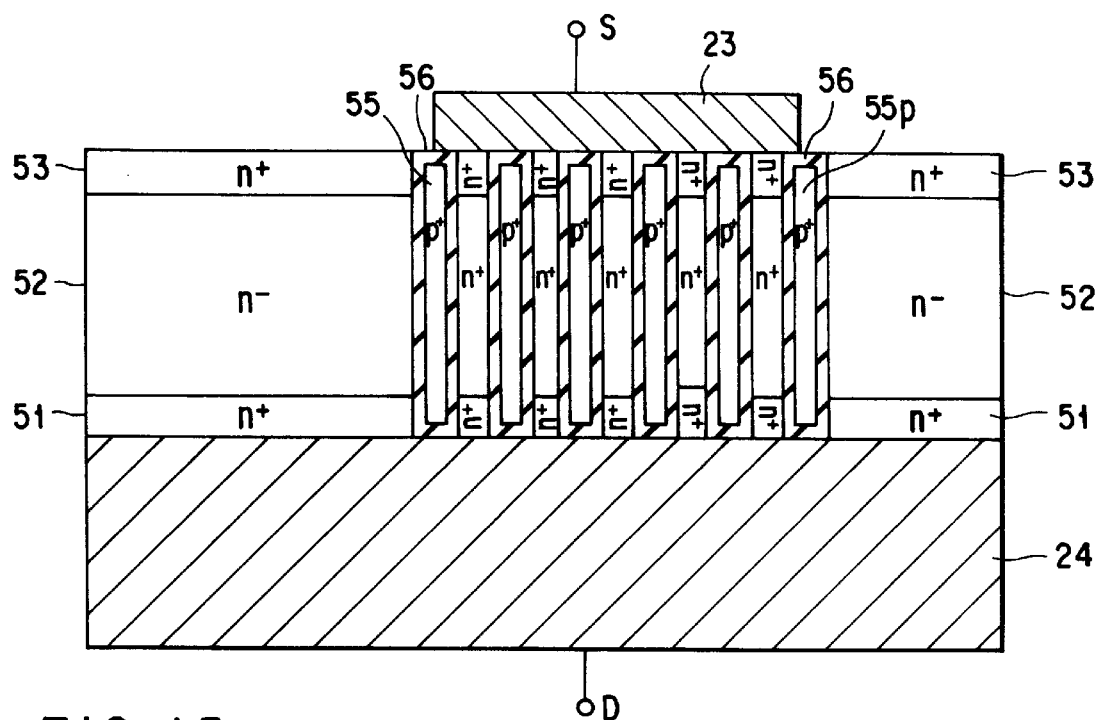
FIG. 15 is a sectional view taken along the line 15—15 in FIG .14 and seen in the direction indicated by arrows.
Figure 16:
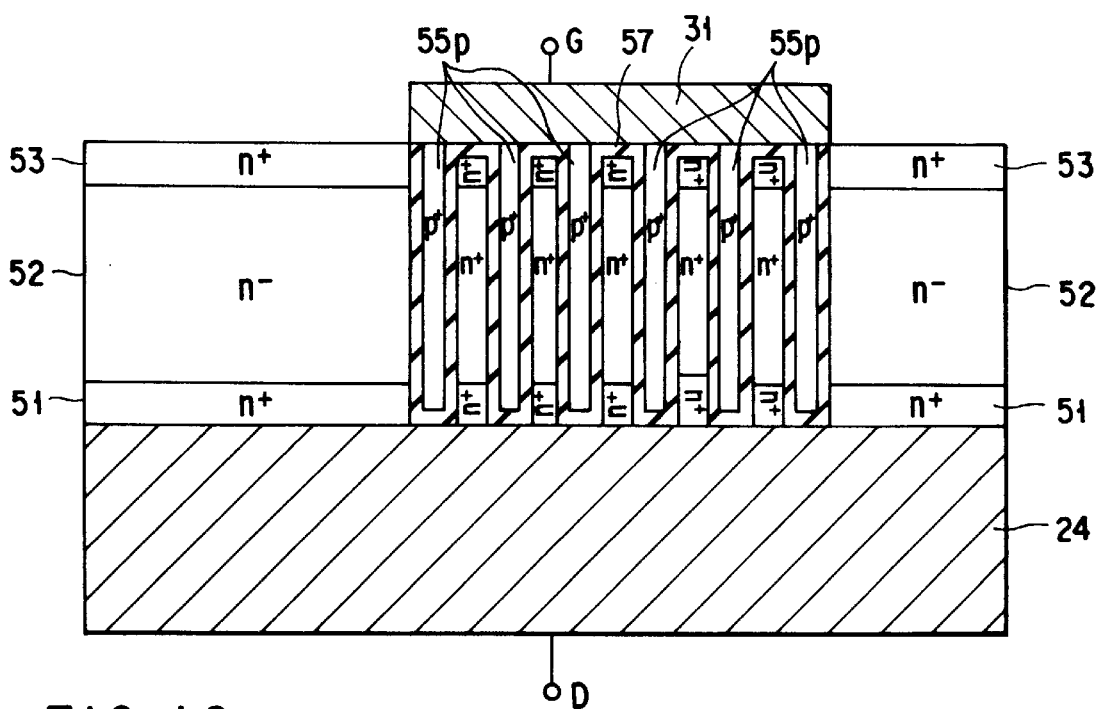
FIG. 16 is a sectional view taken along the line 16—16 in FIG. 14 and seen in the direction indicated by arrows.
Figure 17:
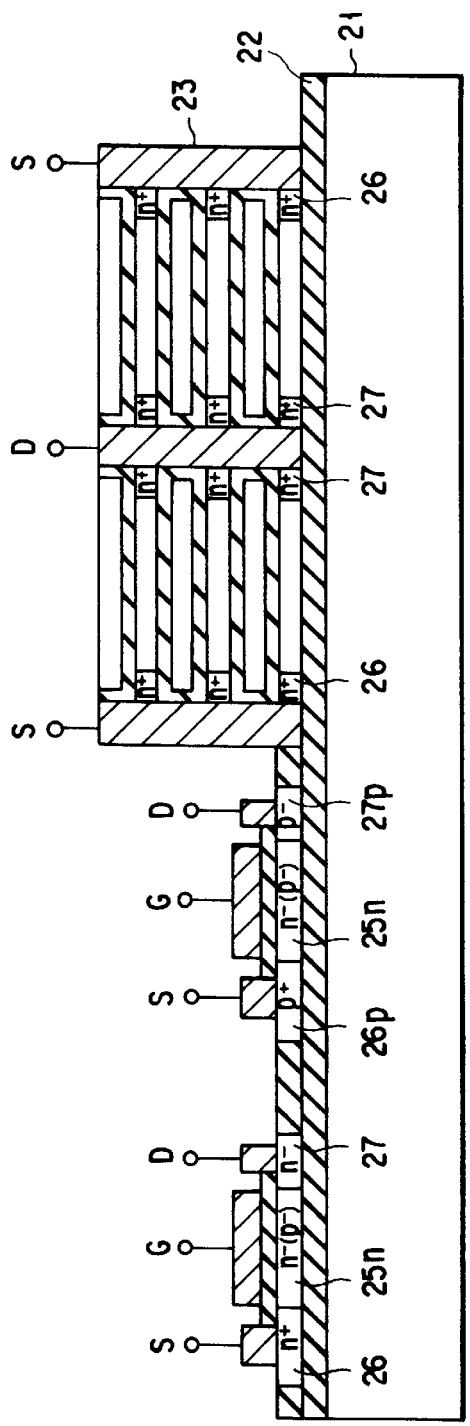
FIG. 17 is a sectional view showing the structure of a first modification of a sixth embodiment of the present invention.
Figure 18:
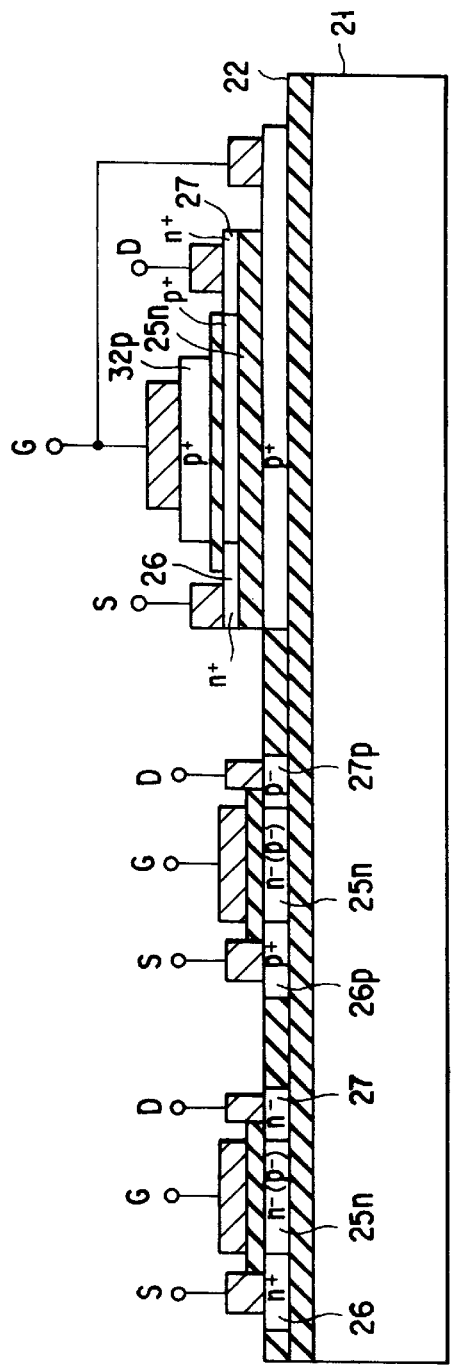
FIG. 18 is a sectional view showing of the structure of a second modification of the same embodiment.
Figure 19:
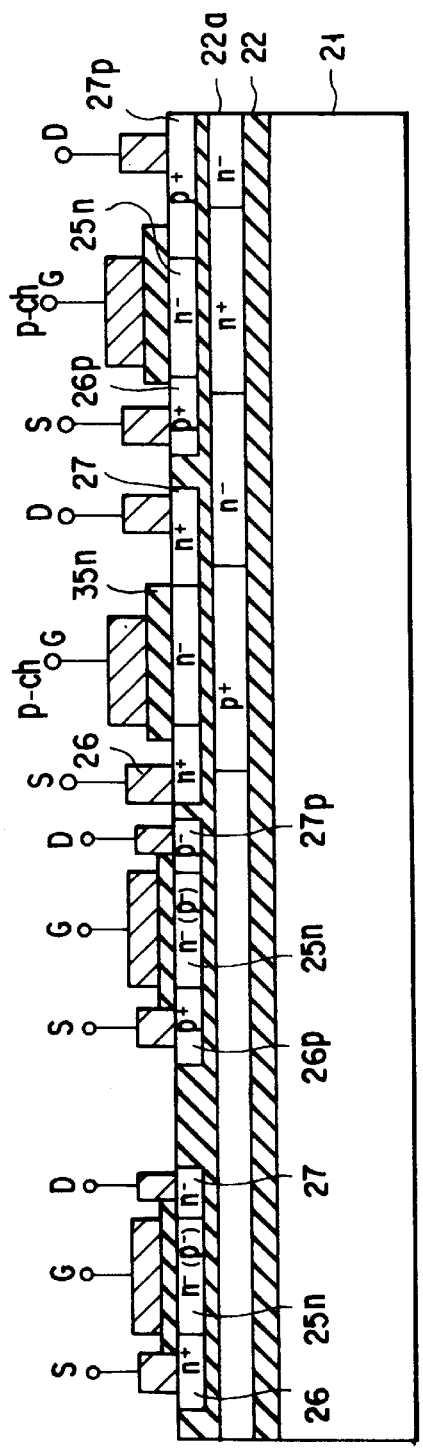
FIG. 19 is a sectional view showing the structure of a third modification of the same embodiment.
Figure 20:
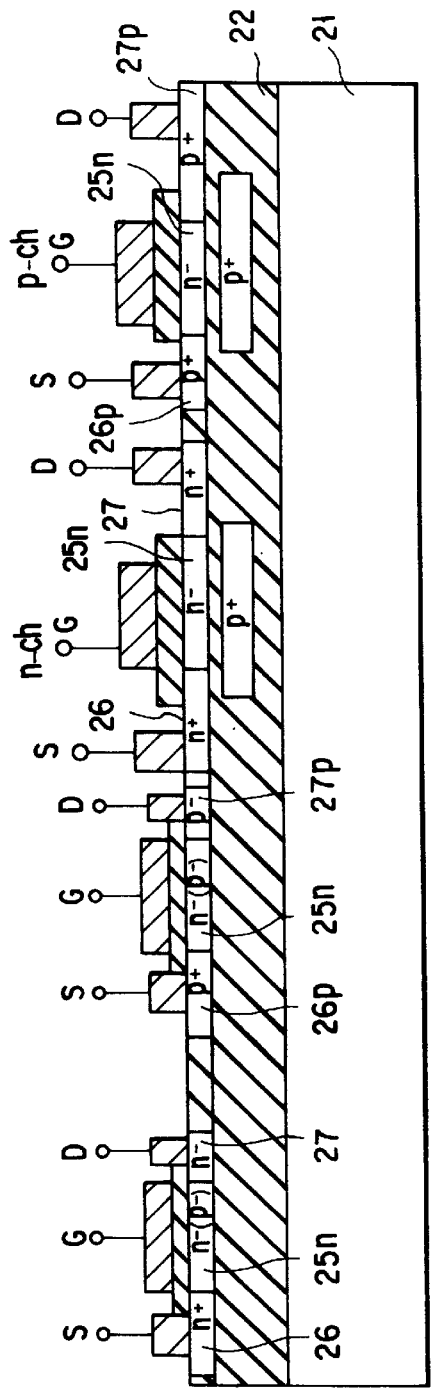
FIG. 20 is a sectional view showing the structure of yet another modification of the third modification of the same embodiment.
Figure 21:
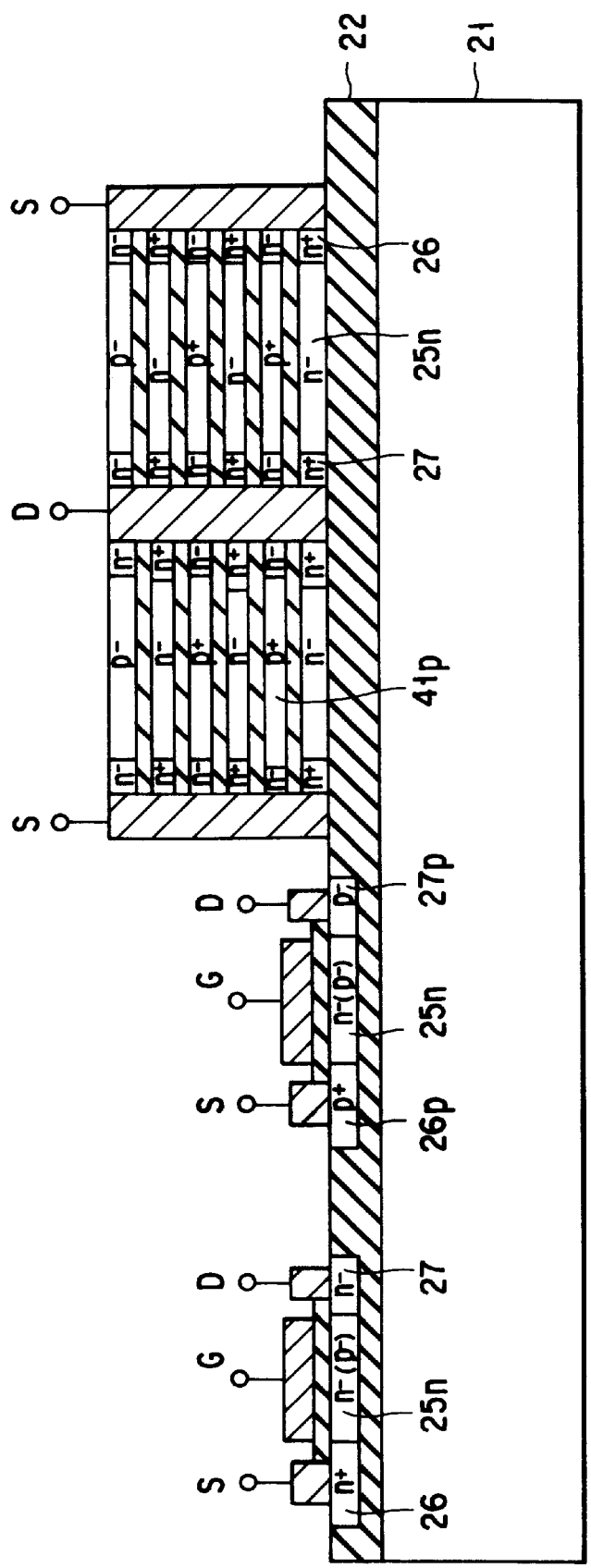
FIG. 21 is a sectional view showing the structure of a fourth modification of the same embodiment.

FIG. 14 is a plan view showing the structure of the semiconductor device according to a fifth embodiment of the present invention, FIG. 15 is a sectional view taken along the line 15—15 in FIG. 14 and seen in the direction indicated by arrows, and FIG. 16 is a sectional view taken along the line 16—16 in FIG. 14 and seen in the direction indicated by arrows.

This semiconductor device is a vertical type polycrystalline silicon MOSFET constructed in such a manner that, on a drain electrode 24 which is a base member, a polycrystalline silicon is deposited, trenches are bored, the surfaces of the trenches are oxidized, and then, the trenches are filled up with polycrystalline silicon which will form buried gates.

More concretely, on the drain electrode 24, a first n+ type polycrystalline silicon layer 51, an n− type polycrystalline silicon layer 52 and a second n+ type polycrystalline silicon layer 53 are successively formed. In the region of the second polycrystalline silicon layer 53 in which (region) gate electrodes are buried, trenches are selectively formed to a depth reaching the drain electrode 24 through the n− type polycrystalline silicon layer 52 and the first polycrystalline silicon layer 51. On the surfaces of the trenches, an oxide film 54 is formed. After the formation of the oxide film 54, p+ type electrodes 55p are formed in a state buried in the trenches. Then, as shown in FIG. 15, in the region in which a source electrode 23 is formed, an oxide film 56 is selectively formed on the gate electrodes 55p, and, as shown in FIG. 16, in the region in which a gate wiring layer 31 is formed, an oxide film 57 is selectively formed on the second n+ type polycrystalline silicon layer 53.

According to the above-described structure, also the same effects as those of the first embodiment can be obtained, and, further, due to the fact that the vertical element structure is adopted, a number of laminating steps for polycrystalline silicon layers can be omitted; and thus, the manufacturing steps can be simplified.

(Sixth Embodiment)

FIG. 17 to 21 are sectional views showing the structures of modifications of the semiconductor device according to the first to fourth embodiments of the present invention, wherein a CMOS circuit is formed on oxide an oxide film 22 or 22a, in parallel to the semiconductor device according to each of said embodiments.

Here, in the nMOS of the CMOS circuit and each semiconductor device, the n+ type source layers 26 and the n+ type drain layers 27 are formed at the same time.

Further, in the CMOS circuit and each semiconductor device, the n− type channel layers 25n are formed at the same time, respectively. Further, in the PMOS of the CMOS circuit and each semiconductor device, the p+ type source layers 26p, the p+ type drain layers 27p and the p+ type gate electrodes 32p are formed at the same time.

Figure 22:
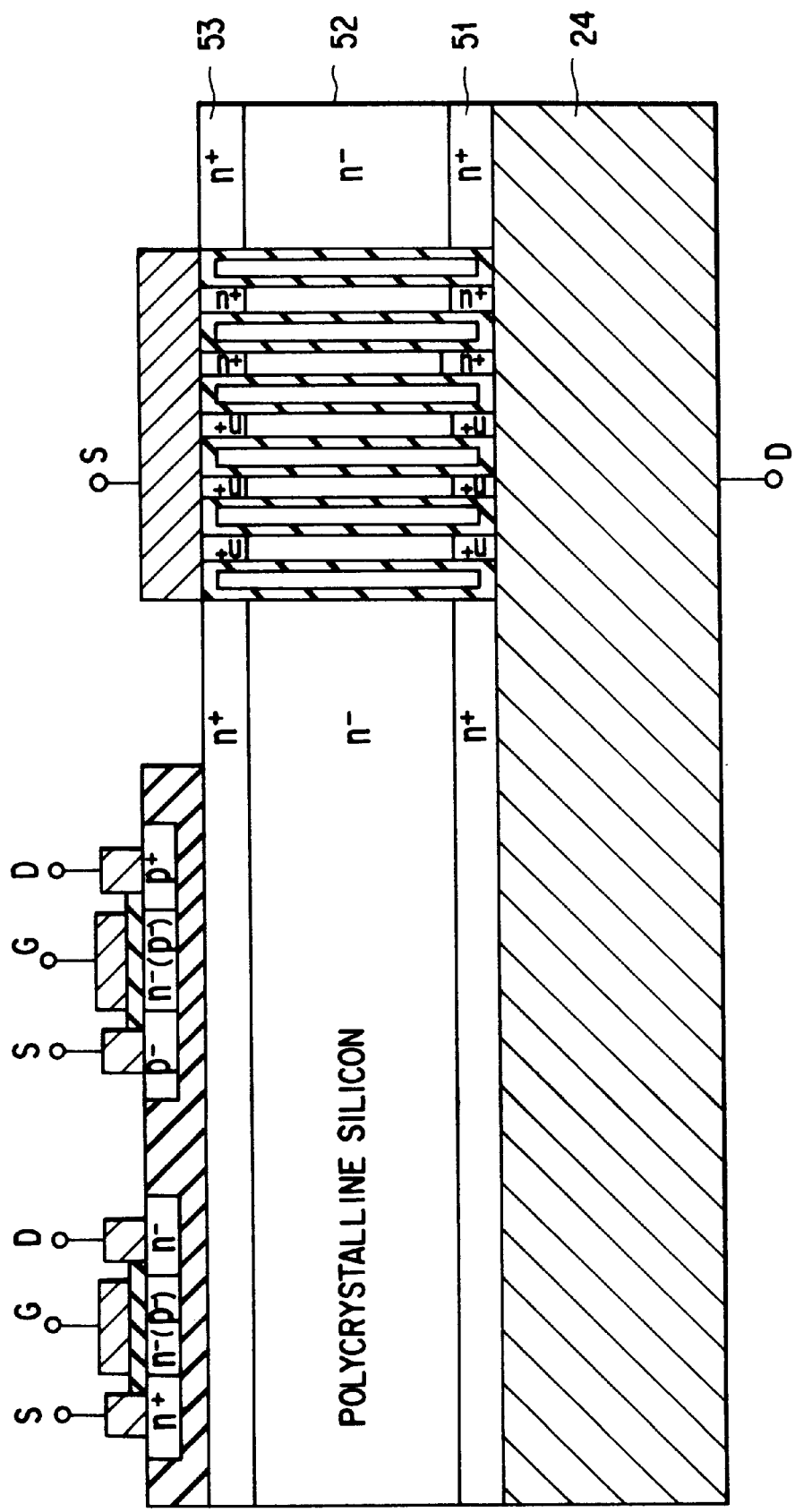
FIG. 22 is a sectional view showing the structure of a fifth modification of the same embodiment.

Therefore, according to this embodiment, there can be obtained the effect, in addition to the effects of the first to fourth embodiment, that an intelligent semiconductor device consisting of a control circuit comprising a CMOS and a power element can be realized under common use of the manufacturing steps. Further, with reference to the semiconductor device according to the fifth embodiment, a structure as shown in FIG. 22 results, so that the common use of the manufacturing steps for the CMOS and the power element cannot be realized, but, as in the case of this embodiment, an intelligent semiconductor device comprising a CMOS and a power element can be realized.

(Seventh Embodiment)

Figure 23:
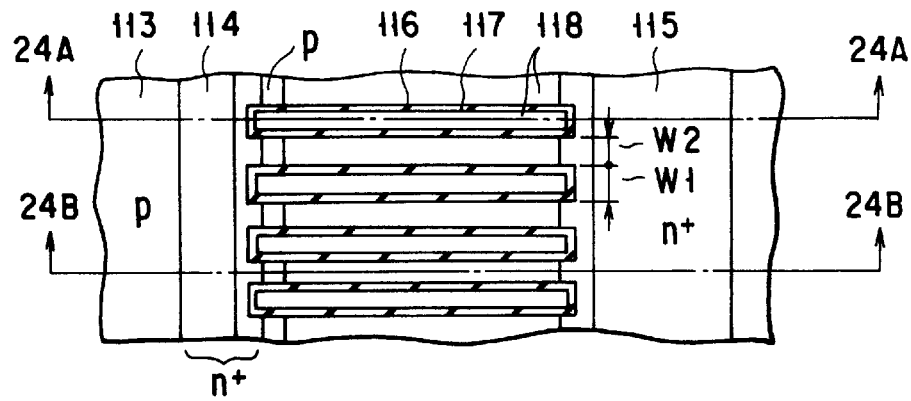
FIG. 23 is a plan view showing the structure of the lateral trench MOSFET according to a seventh embodiment of the present invention.
Figure 24A:
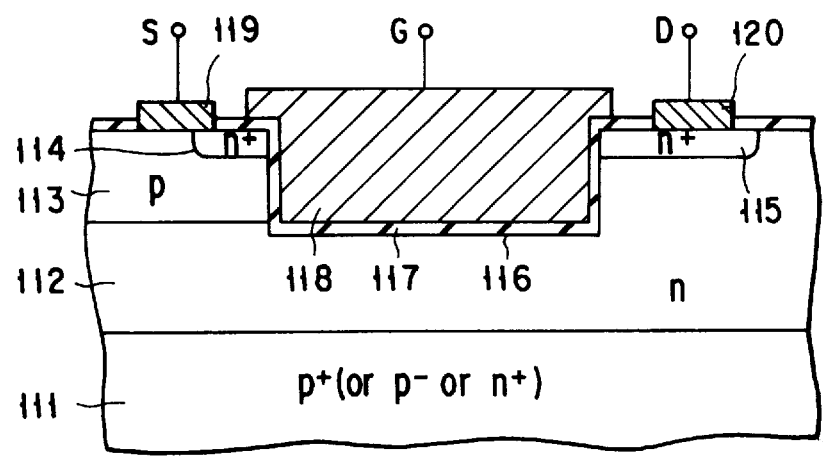
FIG. 24A is a sectional view taken along the line 24A—24A in FIG. 23 and seen in the direction indicated by arrows.
Figure 24B:
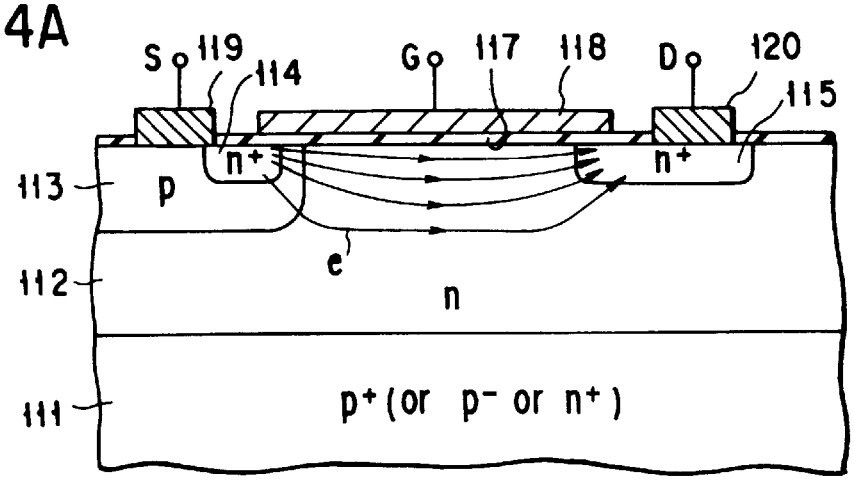
FIG. 24B is a sectional view taken along the line 24B—24B in FIG. 23 and seen in the direction indicated by arrows.

FIG. 23 is a plan view showing the structure of the lateral trench MOSFET according to a seventh embodiment of the present invention, FIG. 24A is a sectional view taken along the line 24A—24A in FIG. 23 and seen in the direction indicated by arrows, and FIG. 24B is a sectional view taken along the line 24B—24B in FIG. 23. This lateral trench MOSFET is constructed in such a manner that, on a p-type substrate 111, an n-type high-resistance layer 112 is formed. On the n-type high-resistance layer 112, a stripe-shaped p-type well layer 113 is selectively formed. On the surface of the p-type well layer 113, a stripe-shaped n-type source layer 114 is selectively formed. On the other hand, on a portion of the surface of the n-type high-resistance layer 112 which (portion) is positioned apart from the n-type source layer 114, a stripe-shaped n-type drain layer 115 is formed so as to be parallel to the n-type source 114.

In the intermediate region extending from the end portion of the n-type drain layer 115 to the end portion of the n-type source layer 114 through the n-type high-resistance layer 112 and the p-type well layer 113, a plurality of trenches 116 are formed extending through the p-type well layer 113 to an intermediate depth of the n-type high-resistance layer 112. Further, the respective trenches 16 each have a stripe-like planar shape perpendicular to the n-type source layer 114 and the n-type drain layer 115 and are disposed in parallel to one another. Further, as the plane orientation of the surfaces of the trenches 116, the (100) plane can be used.

Further, in an intermediate region between the drain and source and the respective trenches 116, gate electrodes 118 composed of polycrystalline silicon are formed through a gate insulation film 117. On the n-type source layer 114, a source electrode 119 is formed. On the n-type drain layer 115, a drain electrode 120 is formed.

Next, the operation of the lateral trench MOSFET which is constructed as described above will be explained below.

As already stated, if, when a positive voltage is applied to the drain electrode 120, and a negative voltage is applied to the source electrode 119, a positive voltage which is more positive than the voltage applied to the source is applied to the gate electrodes 118, then that surface portion of the p-type well layer 113 which is contacted with the gate electrodes 118 is inverted into the n conductivity type, so that electrons are injected from the n-type source layer 114 into the n-type high-resistance layer 112 through the inversion layer, thus flowing through the n-type high-resistance layer 112 towards the n-type drain layer 115 and thus reaching said n-type drain layer 115. That is, the element is brought into conduction.

In this case, also in the interior of the n-type high-resistance layer 112, a channel is formed along the trenches 116, so that the electrons e flows spreading inside as shown in FIG. 24B. Thus, depending on the width of the internal channel, the ON resistance can be decreased. The degree of decrease in this ON resistance, though it depends on the element design, can be expected to be 1/10 or less as compared with the case of the conventional planar structure.

Figure 25:
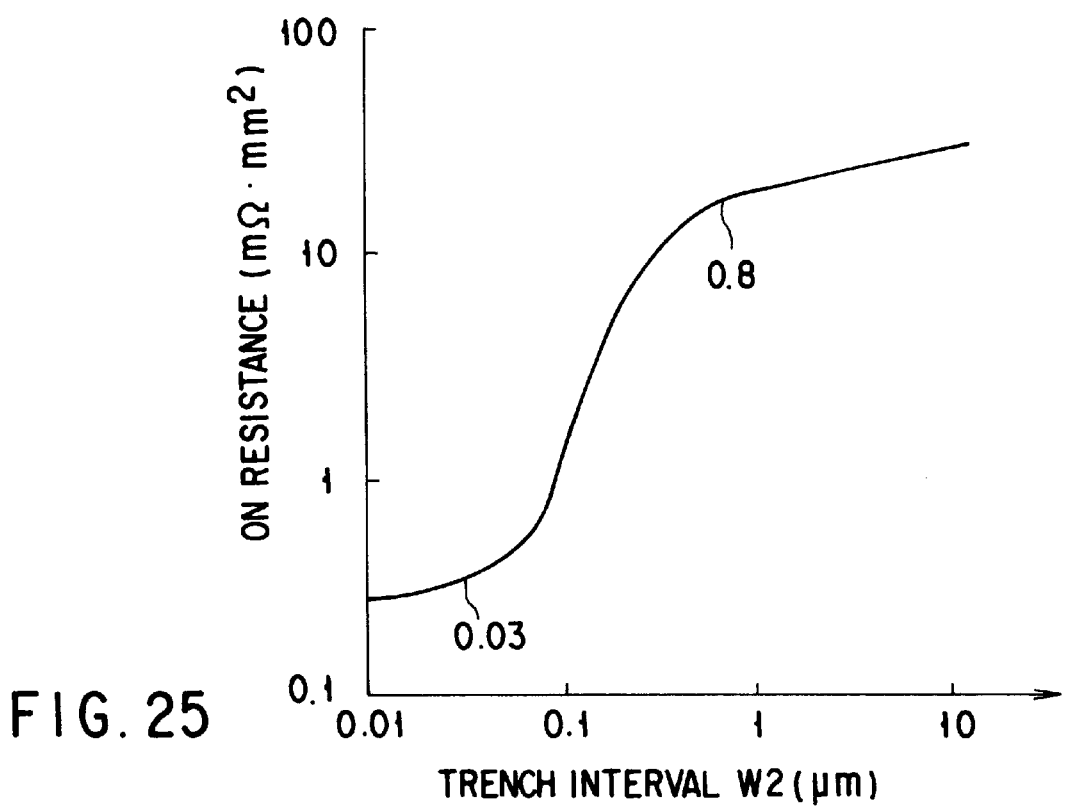
FIG. 25 is a schematic diagram showing, by the use of a logarithmic scale, the dependence on the trench interval of the ON resistance of the lateral trench MOSFET according to the same embodiment.

FIG. 25 is a graph showing, by the use of a logarithmic scale, the dependence on the trench interval of the ON resistance in the lateral trench MOSFET which is formed on the monocrystalline silicon. As shown, as the trench interval W2 is narrowed, the channel width per unit area increases, so that the ON resistance can be reduced. In particular, when the trench interval W2 is in the range of from 0.8 to 0.1 $\mu$m, the ON resistance assumes, practically, a sufficiently small value and thus desirable. However, In case the trench interval is less than 0.01 $\mu$m, the channel mobility is lowered due to the influence by the surface scattering to increase the ON resistance; and thus, such a trench interval is not desirable.

In this connection, the ON resistance of a conventional lateral planar MOSFET with a breakdown voltage of 30V is 40 m$\Omega \cdot$mm$^2$, and the ON resistance of a conventional vertical trench MOSFET is 30 m$\Omega \cdot$mm$^2$.

On the other hand, as the On resistance of the lateral trench MOSFET according to the present invention, a value of 1 m$\Omega \cdot$mm$^2$ or below can be expected if the trench interval W2 and the trench width W1 are both 0.1 μm. This value is smaller than 1/10 of that of a conventional vertical trench MOSFET. Further, if the trench width W2 and the trench width W1 are both alike 0.05 μm, then the ON resistance of the lateral trench MOSFET according to the present invention turns out to be 0.3 mΩ·mm$^2$; thus, it is clear that the ON resistance of the lateral trench MOSFET according to the present invention is decreased to 1/100 with reference to the ON resistance of the conventional vertical trench MOSFET.

Thus, it is apparent that the lateral trench MOSFET according to the present invention is overwhelmingly superior to vertical MOSFET using trenches of the same size. Further, in general, a lateral element is inferior in characteristics to a vertical element; and thus, it is all the more clarified that the ON resistance decreasing effect according to the present invention is very excellent.

Further, in the case of the lateral trench MOSFET according to the present invention, the ON resistance thereof can be decreased to a lower value than that of a general vertical element when said general vertical trench MOSFET has a breakdown voltage of about 60V or below. The reason therefor lies in that, in the case of the lateral trench MOSFET according to the present invention, the intervals between the trenches thereof can be reduced without limitation.

Figure 26:
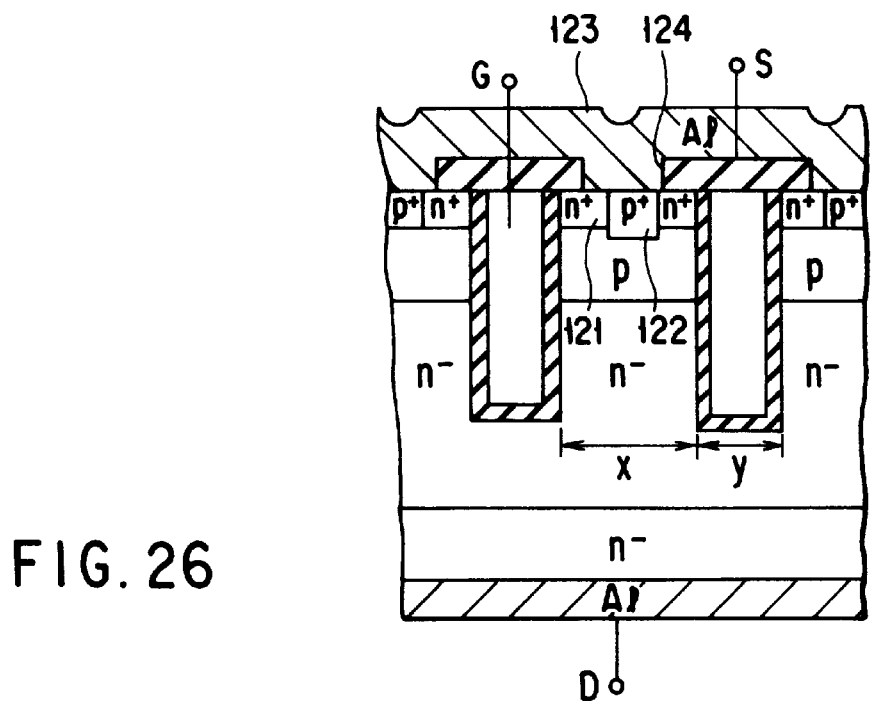
FIG. 26 is a sectional view of a conventional element for explaining the effects of the same embodiment.

For instance, in the case of a vertical trench MOSFET, an n-type source layer 121, a p-type contact layer 122 and a source electrode 123 need to be contacted in the upper portion as shown in FIG. 26. Here, it should be noted that, in the case of the vertical trench MOSFET, a contact hole for contact must be provided, so that the trench interval W2 cannot be narrowed to a value smaller than 3 μm in the existing state of the vertical trench MOSFET.

On the other hand, in the case of a lateral trench MOSFET, there is no such restriction, so that the trench interval can be narrowed even to about 0.1 μm; and thus, the channel width per unit area is more than five times as large as that of a vertical trench MOSFET. As a result, the ON resistance of the lateral trench MOSFET can be reduced as mentioned above.

As described above, according to the present invention, the ON resistance can be reduced without increasing the area of the element.

(Eighth Embodiment)

Figure 27:
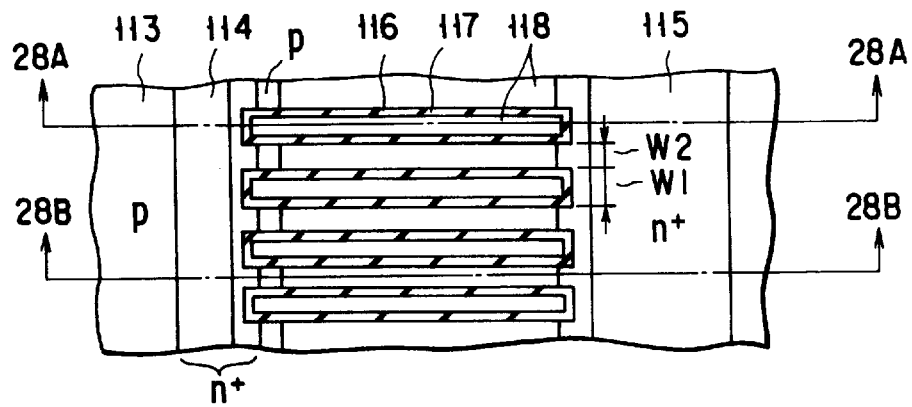
FIG. 27 is a plan view showing the structure of the lateral trench MOSFET according to an eighth embodiment of the present invention.
Figure 28A:
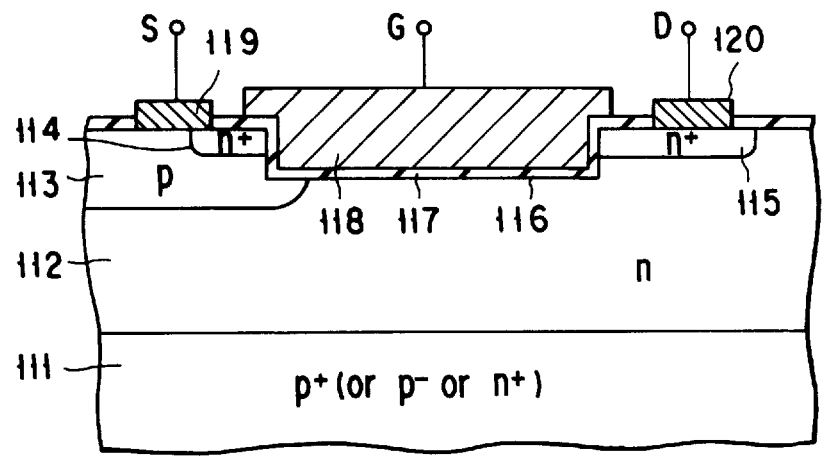
FIG. 28A is a sectional view taken along the line 28A—28A in FIG. 27 and seen in the direction indicated by arrows.
Figure 28B:
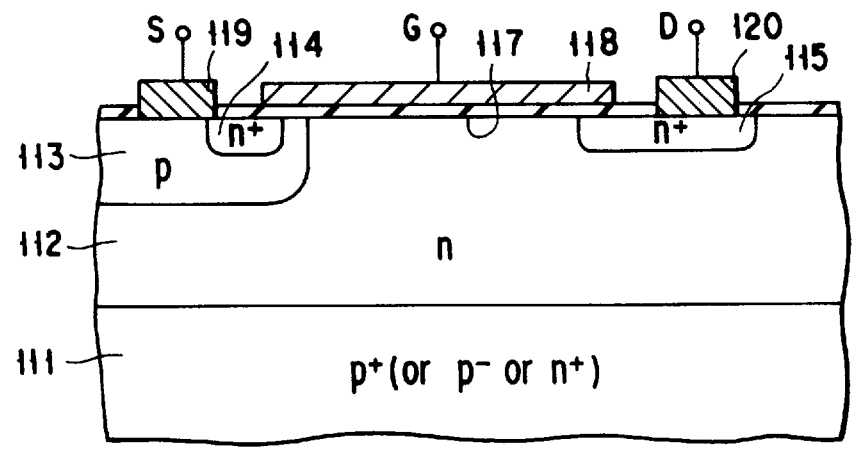
FIG. 28B is a sectional view taken along the line 28B—28B in FIG. 27 and seen in the direction indicated by arrows.

FIG. 27 is a plan view showing the structure of the lateral trench MOSFET according to an eighth embodiment of the present invention, FIG. 28A is a sectional view taken along the line 28A—28A in FIG. 27 and seen in the direction indicated by arrows, and FIG. 28B is a sectional view taken along the line 28B—28B in FIG. 27 and seen in the direction indicated by arrows. In FIG. 27, FIG. 28A and FIG. 28B, the same portions as those shown in FIG. 23 are referenced by the same reference numerals and symbols for omission of the repetition of the detailed description thereof; here, only different portions will be described. Further, in the description of the embodiments to follow, the repetition of the description of the same technical contents will also be avoided.

This embodiment is a structural modification of the seventh embodiment and is constituted in such a manner that, as shown, the depth d of the trenches 116 is set so as to be smaller than that of the p-type well 113, and the trench interval W2 and the trench width W1 are made further smaller.

By constructing the semiconductor device in this way, there can be obtained the effect, in addition to the effects of the seventh embodiment, that, when the trench interval W2 is set to 0.1 μm or less, all the portions of the n-type high-resistance layer 112 each sandwiched between the respective trenches become a channel to markedly reduce the ON resistance. This is the effect which can be achieved only by the lateral trench MOSFET.

(Ninth Embodiment)

Figure 29:
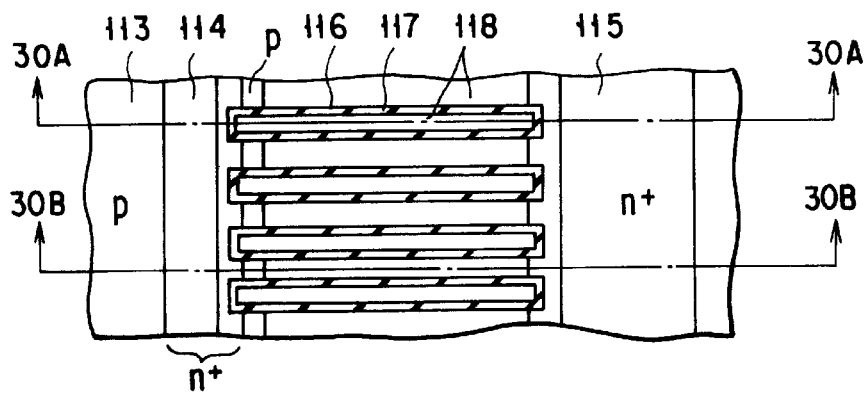
FIG. 29 is a plan view showing the structure of the lateral trench MOSFET according to a ninth embodiment of the present invention.
Figure 30A:
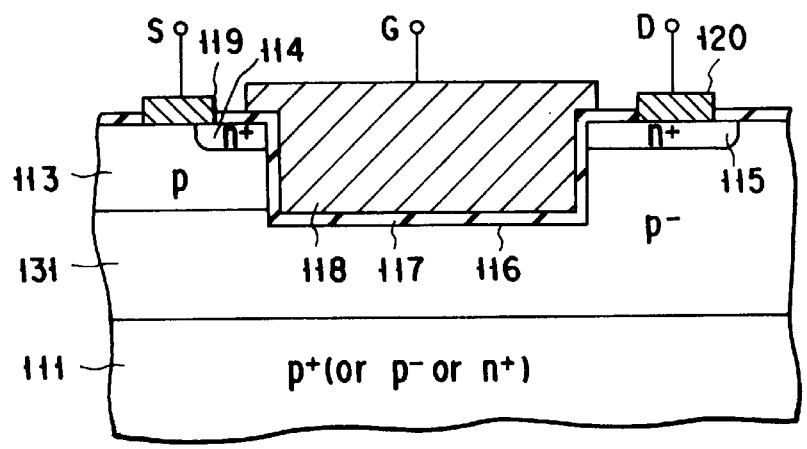
FIG. 30A is a sectional view taken along the line 30A—30A in FIG. 29 and seen in the direction indicated by arrows.
Figure 30B:
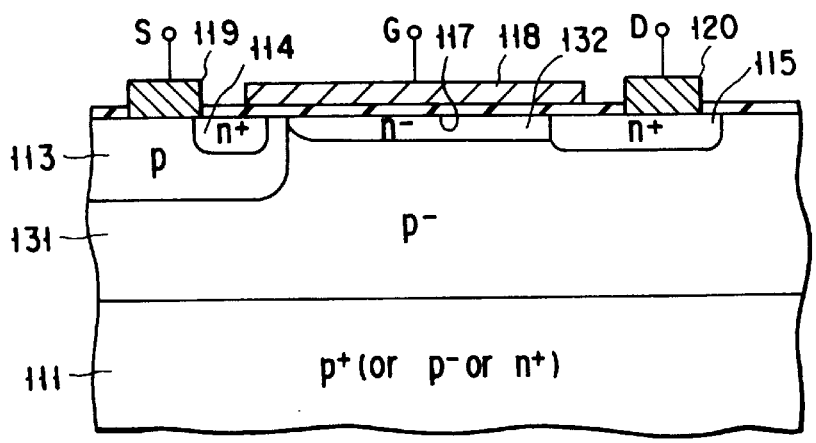
FIG. 30B is a sectional view taken along the line 30B—30B in FIG. 29 and seen in the direction indicated by arrows.

FIG. 29 is a plan view showing the structure of the lateral trench MOSFET according to a ninth embodiment of the present invention, FIG. 30A is a sectional view taken along the line 30A—30A in FIG. 29 and seen in the direction indicated by arrows, and FIG. 30B is a sectional view taken along the line 30B—30B in FIG. 29 and seen in the direction indicated by arrows.

This embodiment is a structural modification of the seventh embodiment and is constructed in such a manner that, in place of the n-type high-resistance layer 112, a p-type high-resistance layer 131 is formed. Further, in that surface portion of the p-type high-resistance layer 131 which lies between the p-type well layer 113 and the n-type drain layer 115, an n-type RESURF (Reduced Surface Field) diffused layer 132 is formed.

According to this structure, there can be obtained the effect, in addition to the effects of the seventh embodiment, that the breakdown voltage can be enhanced due to the electric field relaxation caused by the n-type RESURF diffused layer 132.

(Tenth Embodiment)

Figure 31:
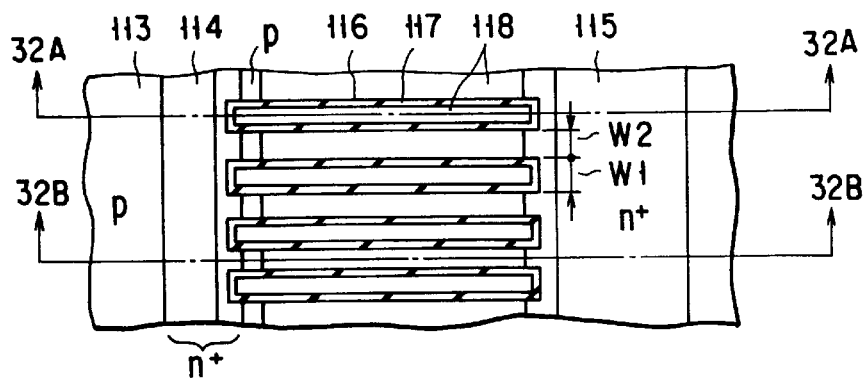
FIG. 31 is a plan view showing the structure of the lateral trench MOSFET according to a tenth embodiment of the present invention.
Figure 32A:
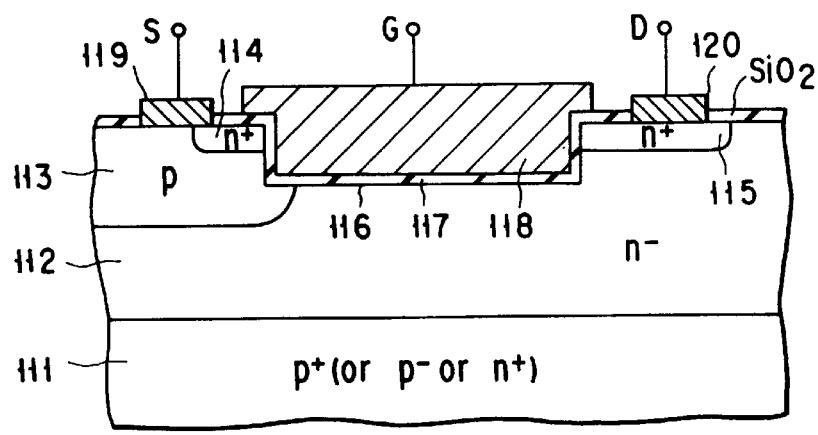
FIG. 32A is a sectional view taken along the line 32A—32A in FIG. 31 and seen in the direction indicated by arrows.
Figure 32B:
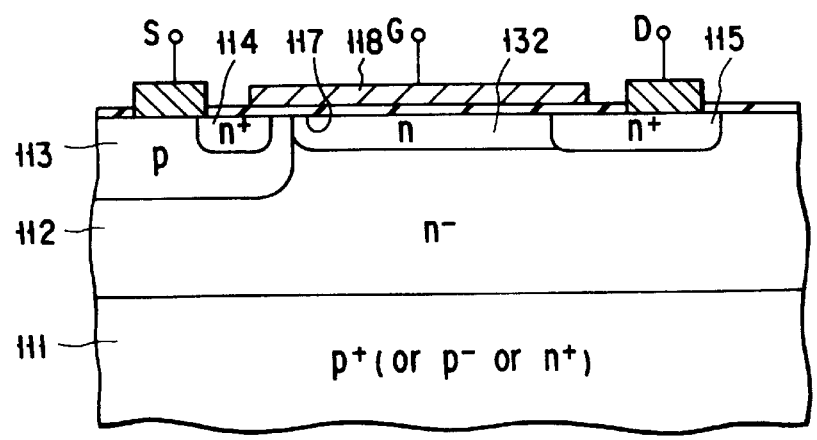
FIG. 32B is a sectional view taken along the line 32B—32B in FIG. 31 and seen in the direction indicated by arrows.

FIG. 31 is a plan view showing the structure of the lateral trench MOSFET according to a tenth embodiment of the present invention, FIG. 32A is a sectional view taken along the line 32A—32A in FIG. 31 and seen in the direction indicated by arrows, and FIG. 32B is a sectional view taken along the line 32B—32B in FIG. 31 and seen in the direction indicated by arrows.

This embodiment is a structural modification of the seventh embodiment and is constituted in such a manner that, in that surface portion of the n-type high-resistance layer 112 which lies between the p-type well layer 113 and the n-type drain layer 115, an n-type RESURF diffused layer 132 is formed.

According to this structure, there can be obtained effect, in addition to the effects of the seventh embodiment, that the breakdown voltage can be enhanced due to the electric field relaxation caused by the n-type RESURF diffused layer 132.

Further, this embodiment is also applicable as a structural modification of the eighth embodiment.

(Eleventh Embodiment)

Figure 33:
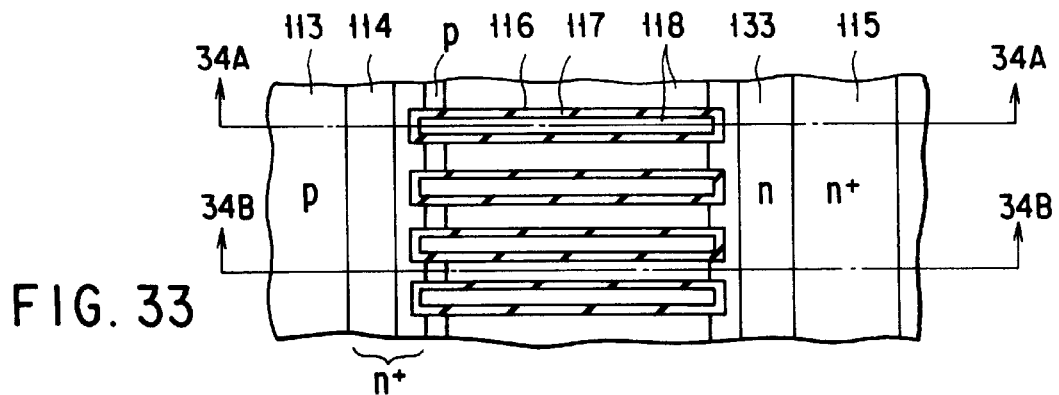
FIG. 33 is a plan view showing the structure of the lateral trench MOSFET according to an eleventh embodiment of the present invention.
Figure 34A:
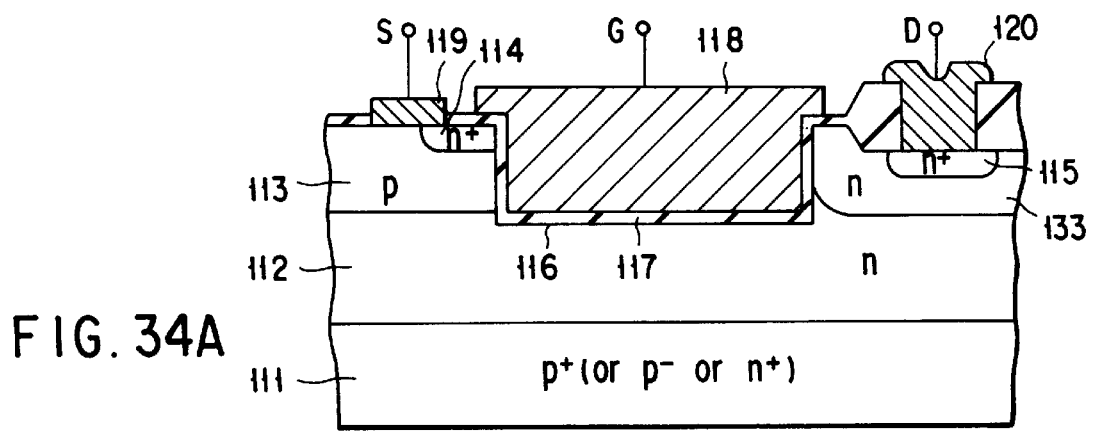
FIG. 34A is a sectional taken along the line 34A—34A in FIG.
Figure 34B:
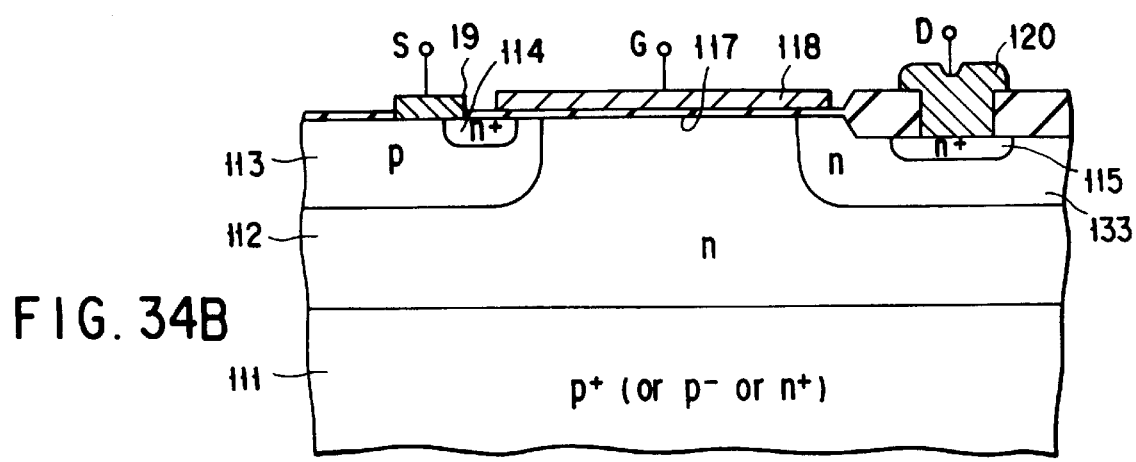
FIG. 34B is a sectional view taken along the line 34B—34B in FIG. 33 and seen in the direction indicated by arrows.
Figure 35:
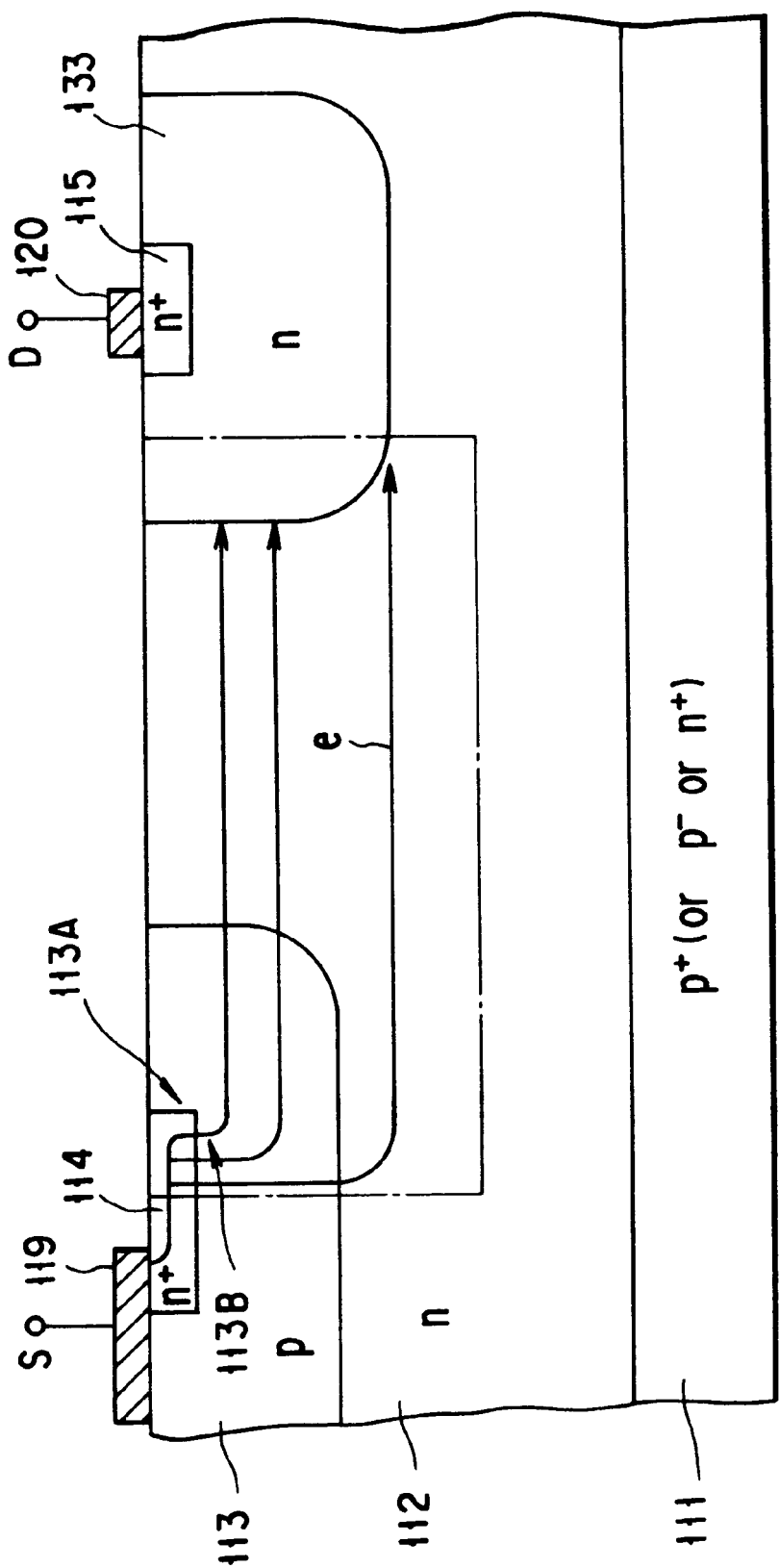
FIG. 35 is a schematic diagram for explaining the optimum mode of the same embodiment.

FIG. 33 is a plan view showing the structure of the lateral trench MOSFET according to an eleventh embodiment of the present invention, FIG. 34A is a sectional view taken along the line 34A—34A in FIG. 33 and seen in the direction indicated by arrows, and FIG. 34B is a sectional view taken along the line 34B—34B in FIG. 33 and seen in the direction indicated by arrows.

This embodiment is a structural modification of the seventh embodiment and is constituted in such a manner that, between the n-type drain layer 115 and the n-type high-resistance layer 112, an offset layer 133 which has a resistance higher than that of the n-type high-resistance layer 112 is formed.

According to this structure, there can be obtained the effect, in addition to the effects of the seventh embodiment, that the breakdown voltage of the element can be enhanced by the resistance component of the n-type offset layer 133. In this connection, it is added that this embodiment is applicable to any of the seventh to tenth embodiments.

Further, a supplementary explanation is made with reference to the case where, in this embodiment, the p-type well layer 113 is formed by diffusion without using the Diffusion Self-Alignment (DSA) method, and thereafter, the n-type source layer 114 is formed by diffusion. In this case, as for the concentration of the portions (113A and 113B) of the p-type well layer 113 which lie in the vicinity of the junction thereof with the n-type source layer 114, the concentration of the portion 113B lying under the n-type source layer 114 is lower than that of the portion 113A lying adjacent to the side face of the n-type source layer 114. Due to this, electrons e are injected into the channel from the portion 113B which has a lower threshold voltage value. Accordingly, the portions 113B between the respective trenches 116 are formed large in size, whereby the electrons can be easily injected to reduce the element resistance.

(Twelfth Embodiment)

Figure 36:
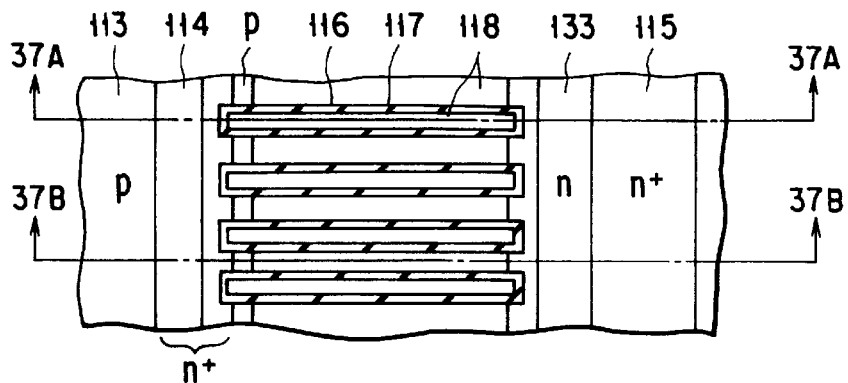
FIG. 36 is a plan view showing the structure of the lateral trench MOSFET according to a twelfth embodiment of the present invention.
Figure 37A:
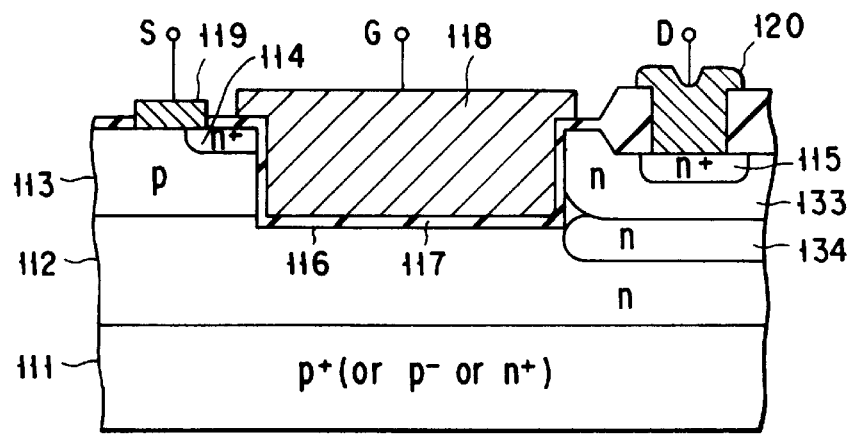
FIG. 37A is a sectional view taken along the line 37A—37A in FIG. 36 and seen in the direction indicated by arrows.
Figure 37B:
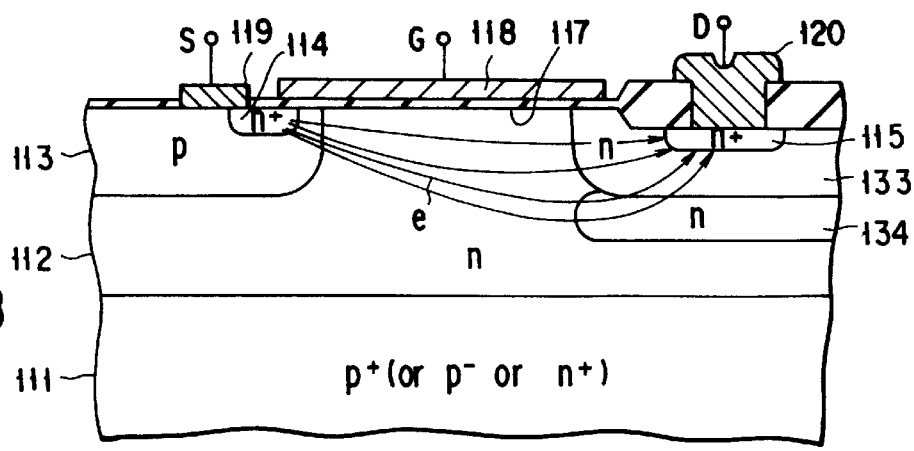
FIG. 37B is a sectional view taken along the line 37B—37B in FIG. 36 and seen in the direction indicated by arrows.

FIG. 36 is a plan view showing the structure of the lateral trench MOSFET according to a twelfth embodiment of the present invention, FIG. 37A is a sectional view taken along the line 37A—37A in FIG. 36 and seen in the direction indicated by arrows, and FIG. 37B is a sectional view taken along the line 37B—37B in FIG. 36 and seen in the direction indicated by arrows.

This embodiment is a structural modification of the eleventh embodiment and is constituted in such a manner that, directly under the n-type offset layer 133, there is formed an n-type buried layer 134 having a resistance lower than that of the n-type high-resistance layer 112. In this case, the n-type buried layer 134 is formed in such a manner that the end of said n-type buried layer 134 which (end) is closer to the source is located at approximately the same position— with reference to the vertical direction—as the end of the n-type offset layer 133 which (end) is closer to the source.

According to this structure, it is ensured that, in the conductive state of the element, the electrons e injected into the n-type high-resistance layer 112 pass by the side faces of the trenches 116 to reach the n-type buried layer 134 and then flow through the n-type buried layer 134 and through the n-type offset layer 133 to the n-type drain layer 115.

That is, as a result of providing the n-type buried layer 134 directly under the n-type offset layer 133, the electrons flow into the n-type buried layer 134, sufficiently spreading within the channel width along the side faces of the trenches 116, and therefore, the ON resistance can be further reduced.

Here, it is added that, according to this embodiment, the n-type drain layer 115 is formed at a position lower than the position of the n-type source layer, as shown in FIG. 37A and FIG. 37B, in order to spread the stream of electrons, but this is a modified structure; it is a matter of course that the position of the n-type drain layer 115 can be brought up to the same plane as the position of the n-type source layer.

(Thirteenth Embodiment)

Figure 38:
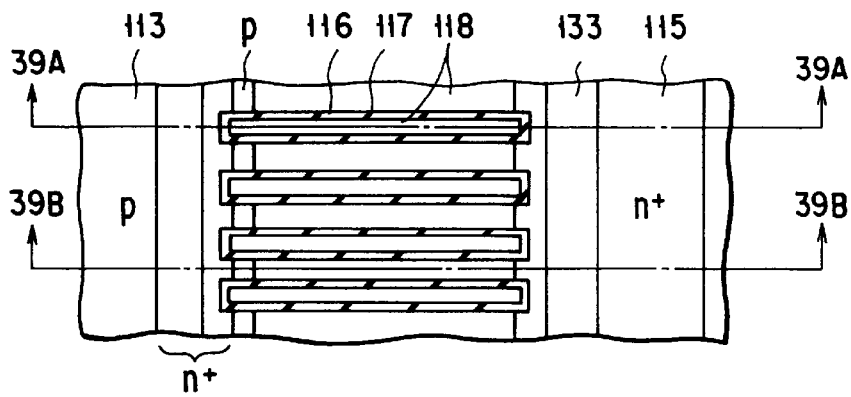
FIG. 38 is a plan view showing the structure of the lateral trench MOSFET according to a thirteenth embodiment of the present invention.
Figure 39A:
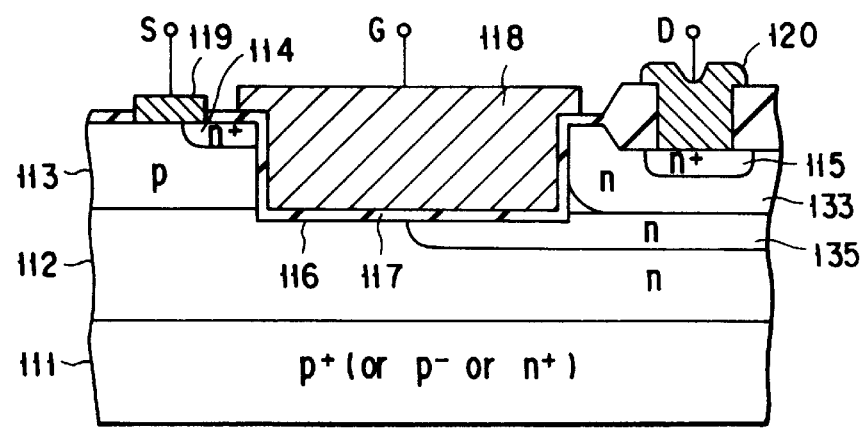
FIG. 39A is a sectional taken along the line 39A—39A in FIG. 38 and seen in the direction indicated by arrows.
Figure 39B:
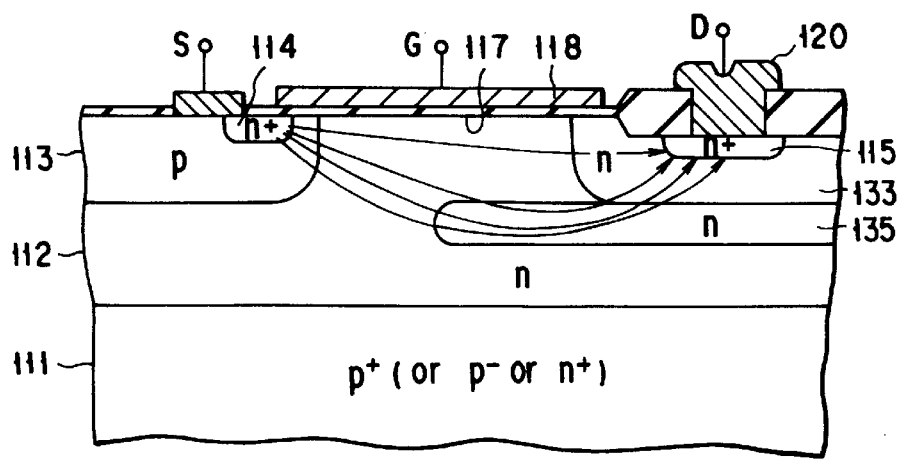
FIG. 39B is a sectional view taken along the line 39B—39B in FIG. 38 and seen in the direction indicated by arrows.

FIG. 38 is a plan view showing the structure of the lateral trench MOSFET according to a thirteenth embodiment of the present invention, FIG. 39A is a sectional view taken along the line 39A—39A in FIG. 38 and seen in the direction indicated by arrows, and FIG. 39B is a sectional view taken along the line 39B—39B in FIG. 38 and seen in the direction indicated by arrows.

This embodiment is a structural modification of the twelfth embodiment and is constituted in such a manner that the low-resistance n-type buried layer 135 formed directly under the n-type offset layer 133 is provided in a state extended as far as the vicinity of the middle point between the drain and source.

According to this structure, the electrons e flow into the n-type buried layer 135, sufficiently spreading within the channel width along the side faces of the trenches as in the case of the twelfth embodiment, so that the ON resistance can be further reduced. Moreover, since, in the case of this embodiment, the n-type buried layer 135 is provided in a state extending as far as the vicinity of the middle point between the drain and the source, the degree of spreading the stream of electrons e can be enhanced as compared with the case of the twelfth embodiment, and thus, the ON resistance can be further decreased.

Further, in the case of the twelfth and thirteenth embodiments, the ON resistance can be decreased in proportion as the n-type buried layers 134 and 135 are extended towards the source side, but it is also desirable to form the n-type offset layer 133 in a state extending more deeply or downwards to enhance the breakdown voltage.

(Fourteenth Embodiment)

Figure 40:
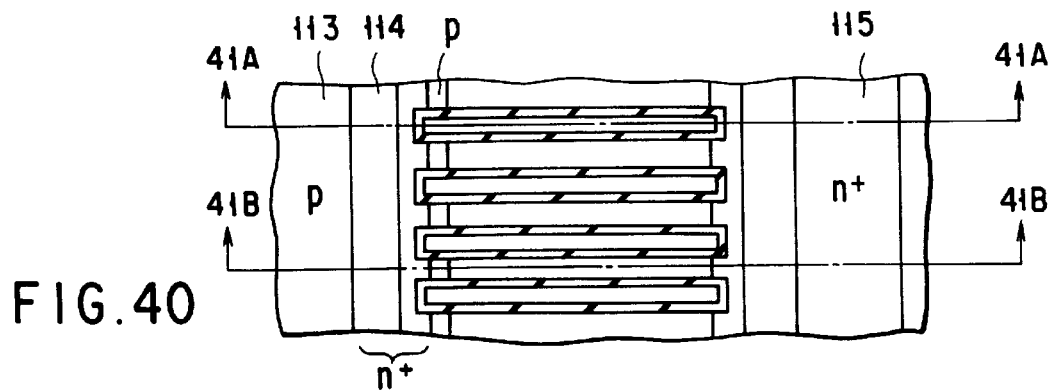
FIG. 40 is a plan view showing the structure of the lateral trench MOSFET according to a fourteenth embodiment of the present invention.
Figure 41A:
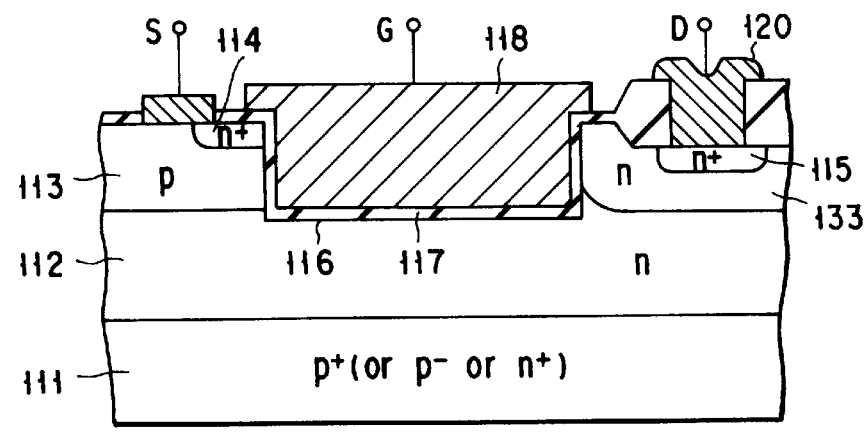
FIG. 41A is a sectional view taken along the line 41A—41A in FIG. 40 and seen in the direction indicated by arrows.
Figure 41B:
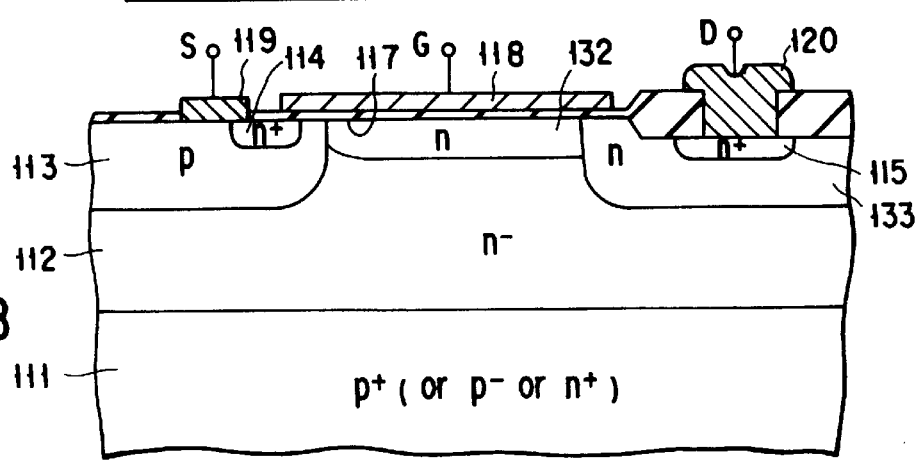
FIG. 41B is a sectional view taken the line 41B—41B in FIG. 40 and seen in the direction indicated by arrows.

FIG. 40 is a plan view showing the structure of the lateral trench MOSFET according to a fourteenth embodiment of the present invention, FIG. 41A is a sectional view taken along the line 41A—41A in FIG. 40 and seen in the direction indicated by arrows, and FIG. 41B is a sectional view taken along the line 41B—41B in FIG. 40 and seen in the direction indicated by arrows.

This embodiment is a structural modification of the seventh embodiment and, more specifically, comprises a structural combination of the tenth and eleventh embodiments. According to this embodiment, the n-type offset layer 133 having a resistance higher than that of the n-type high-resistance layer 112 is formed between the n-type drain layer 115 and the n-type high-resistance layer 112, and, on that portion of the surface of the n-type high-resistance layer 112 which lies between the p-type well layer 113 and the n-type offset layer 133, an n-type RESURF diffused layer 132 is formed.

According to this structure, the effects of the seventh, the tenth and eleventh embodiments can be achieved all together. That is, the ON resistance can be decreased without increasing the element area, and further, the breakdown voltage of the element can be increased.

(Fifteenth Embodiment)

Figure 42:
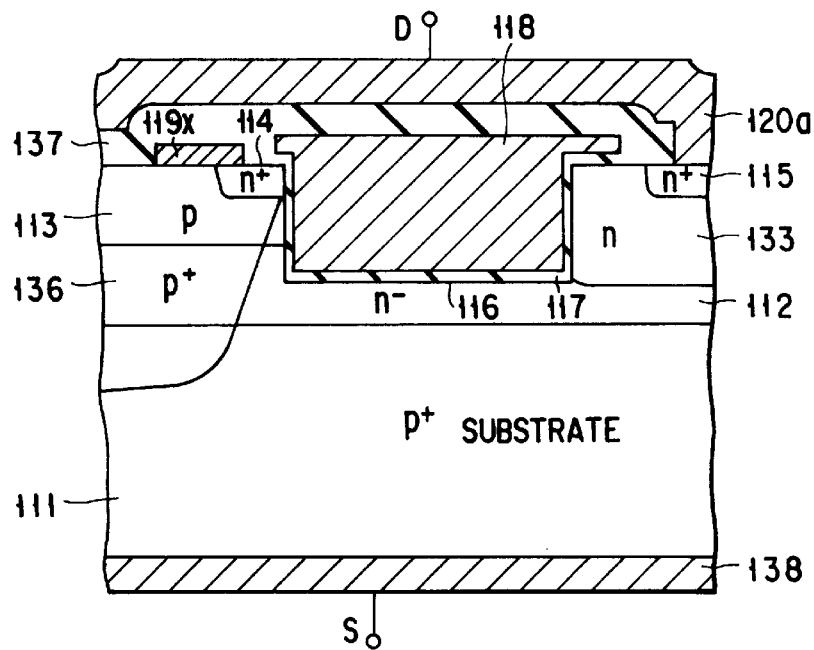
FIG. 42 is a sectional view showing the vertical trench MOSFET according to fifteenth embodiment of the present invention.

FIG. 42 is a sectional view showing the structure of the vertical trench MOSFET according to a fifteenth embodiment of the present invention. This vertical trench MOSFET is a structural modification of the eleventh embodiment and, more specifically, constituted in such a manner that, in the surface of the p-type well layer 113, a p-type diffused layer 136 is selectively formed extending as far as a depth reaching the p-type substrate 111, and the source electrode 119 is replaced by a mere metal layer 119$x$ covered with an insulation layer 137 so that said source layer 119$x$ cannot be connected to the electric circuit (not shown), and at the same time, a source electrode 138 is newly formed on the rear surface of the p-type substrate 111. Further, a drain electrode 120$a$ is formed completely covering the upper surface of the insulation layer 137 in a state contacted with the drain layer 115.

That is, the p-type well 113 and the p-type substrate 111 are electrically connected to each other through the p-type diffused layer 136, whereby the source electrode 138 is formed on the rear surface of the p-type substrate. According to this structure, the two-layer wiring on the upper surface is disused, so that the wiring resistance which poses a problem in connection with an aluminum (Al) wiring etc. can be decreased; and thus, this structure is very suited for large-current elements.

Figure 43:
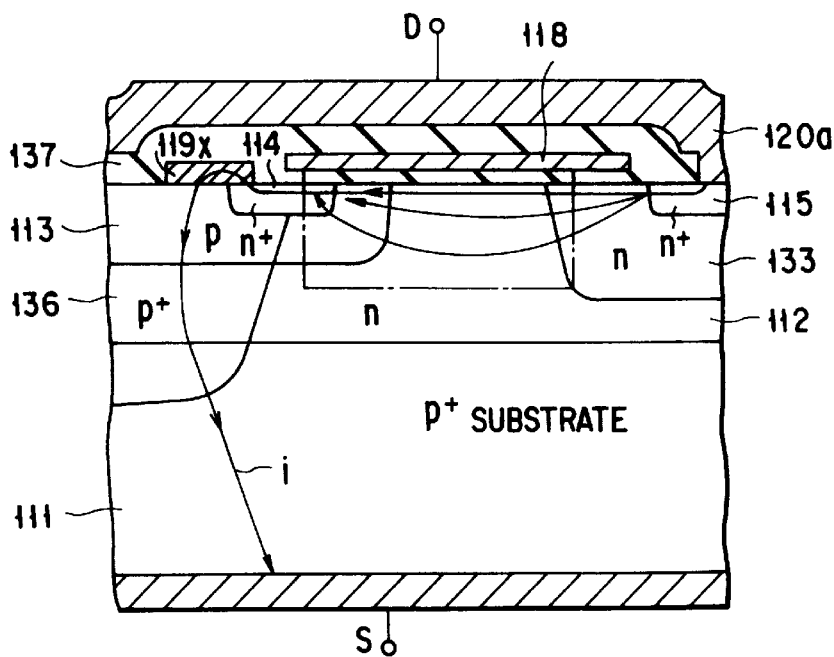
FIG. 43 is a schematic diagram for explaining the current passage in the same embodiment.

As for the operation of this embodiment, if predetermined voltages are applied to the respective electrodes 120$a$, 138, and 118 as already described, then, as shown in FIG. 43, a current i flows from the drain electrode 120*a* to the p-type well layer 113 through the drain layer 115, the n-type offset layer 133, and the channel extending along the side surfaces of the trenches 116; and then, from said p-type well 113, the current i flows to the p-type substrate 111 through the n-type source layer 114 and the metal layer 119*x* and then through the p-type well layer 113 and the p-type diffused layer 136; and then, the current i flows to the source electrode 138.

As described above, according to this embodiment, there can be obtained the effect, in addition of the effects of the eleventh embodiment, that a structure very much suited for large-current elements can be realized. The drain layer 115 can be replaced by p-type layer to constitute an IGBT.

(Sixteenth Embodiment)

Figure 44:
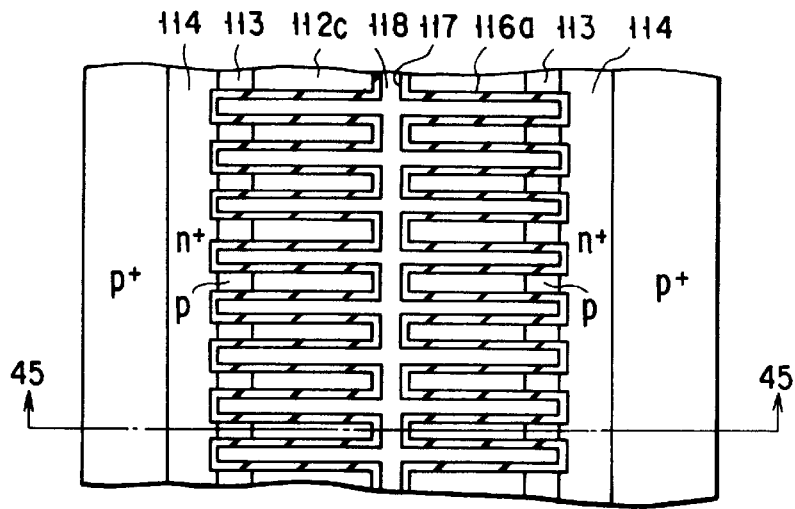
FIG. 44 is a plan view showing the structure of the vertical trench MOSFET according to a sixteenth embodiment of the present invention.
Figure 45:
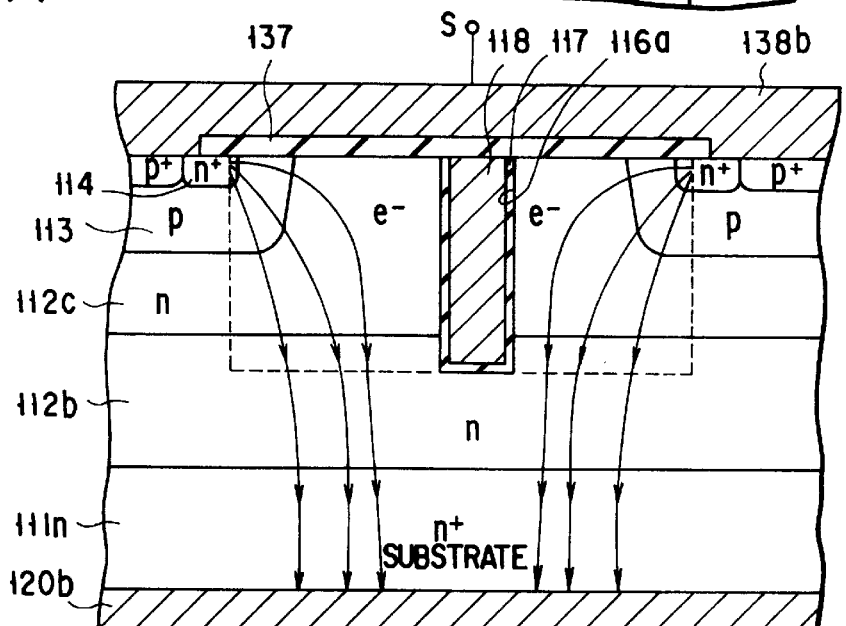
FIG. 45 is a sectional view taken along the line 45—45 in FIG. 44 and seen in the direction indicated arrows.

FIG. 44 is a plan view showing the structure of the vertical trench MOSFET according to a sixteenth embodiment of the present invention, and FIG. 45 is a sectional view taken along the line 45—45 in FIG. 44 and seen in the direction indicated by arrows.

This vertical trench MOSFET is constituted in such a manner that, on an n-type substrate 111*n*, an n-type buffer layer 112*b* and an n-type epitaxial layer 112*c* are successively formed. On the surface of the n-type epitaxial layer 112*c*, stripe-shaped well layers 113 are selectively formed in a state extending approximately in parallel to each other. On the surface of the p-type well layers 113, stripe-shaped n-type source layers 114 are selectively formed so as to be approximately parallel to each other.

Here, in the intermediate region extending from the end of the n-type source layer 114 at one side to the end of the n-type source layer 114 at the other side through the p-type well layer 113 at said one side, the epitaxial layer 112*c* and through the p-type well layer 113 at said other side, trenches 116*a* are formed in a state extending through the p-type well layer 113 and the n-type epitaxial layer 112*c* to an intermediate depth of the n-type buffer layer 112. The planar shape of these trenches 116*a* is of a continuous and approximately cross-shape; more concretely, the trenches 116*a* are of a stripe-like planar shape extending in a direction approximately perpendicular to the respective n-type source layers 114; and, through the center portions of said trenches, a stripe-like planar shape extends approximately in parallel to the respective n-type source layers 114.

Further, in each of the trenches 116*a*, a gate electrode 118 composed of polycrystalline silicon is formed through a gate insulation film 117 composed of SiO$_2$. Further, on the intermediate region between the respective sources, an insulation layer 137 composed of SiO$_2$ is formed extending also over the upper surfaces of the gate electrodes 118. A source electrode 138*b* is formed extending over the whole surface of the insulation layer 137 in a state contacted with the n-type source layers 114. On the other hand, on the surface at the opposite side, with reference to the source electrode 138*b*, of the n-type substrate 111*n*, a drain electrode 120*b* is formed.

According to the above structure, it is ensured that, in the state in which the element is conducting, the electrons e fed from the source electrode 138*b* are injected into the n-type epitaxial layer 112*c* through the n-type source layer 114 and via the inversion layer in the interface, with the trenches 116*a*, of the p-type well layer 113; the electrons e then reach the n-type buffer layer 112*b*, passing along the side faces of the trenches 116*a*; and thus, the electrons e flow to the drain electrode 120*b* via the n-type substrate 111*n*.

Thus, this embodiment can also achieves the same effects as those of the fifteenth embodiment.

Figure 46:
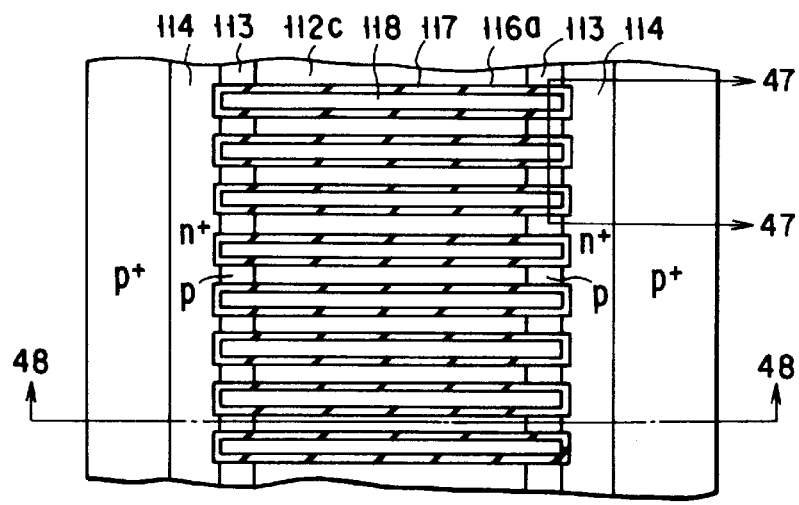
FIG. 46 is a plan view showing the structure of a modification of the same embodiment.
Figure 47:
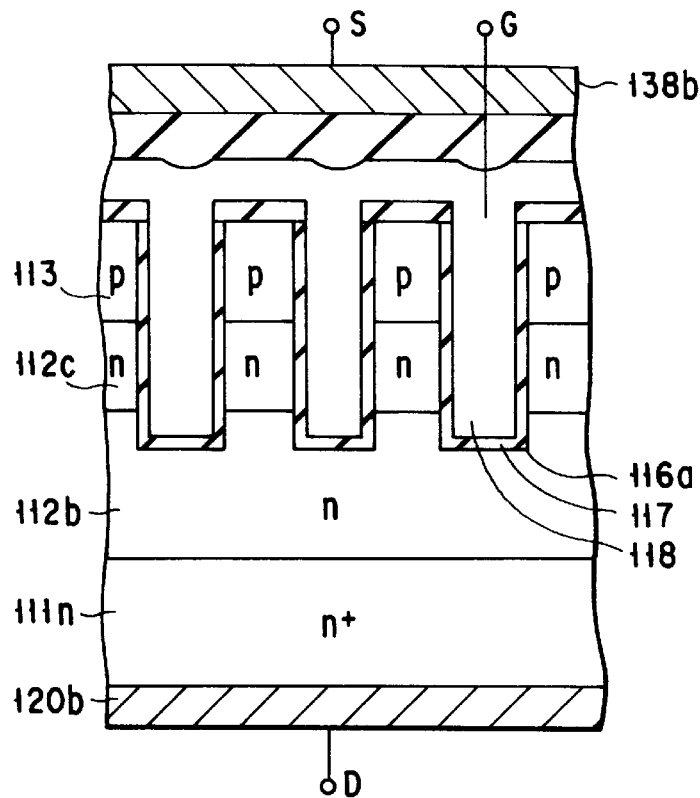
FIG. 47 is a sectional view taken along the line 47—47 in FIG. 46 and seen in the direction indicated by arrows.
Figure 48:
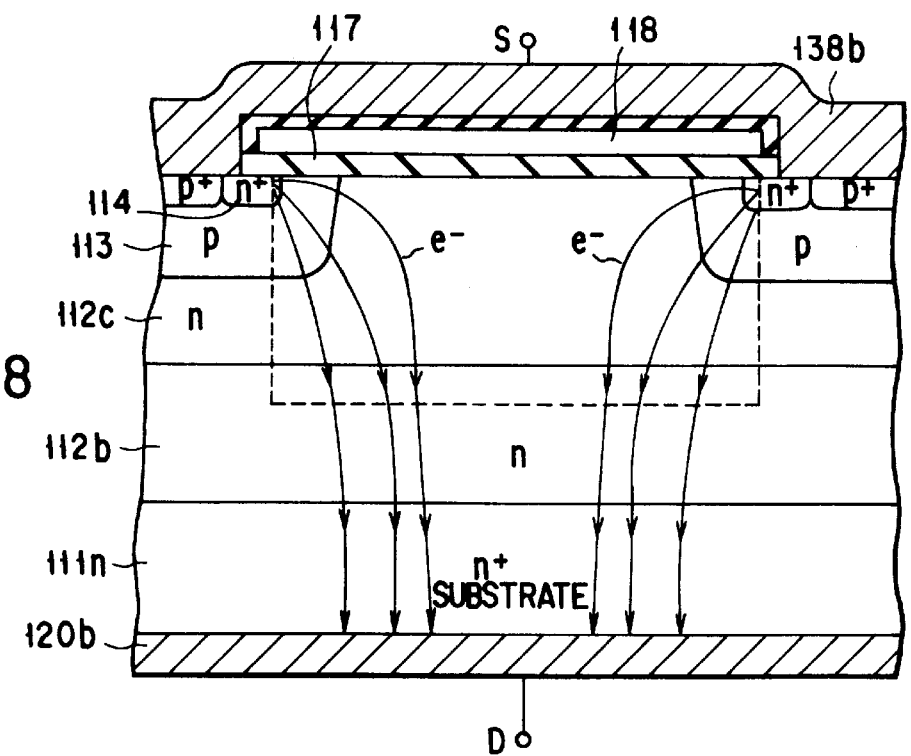
FIG. 48 is a sectional view taken along the line 48—48 in FIG. 46 and seen in the direction indicated by arrows.
Figure 49:
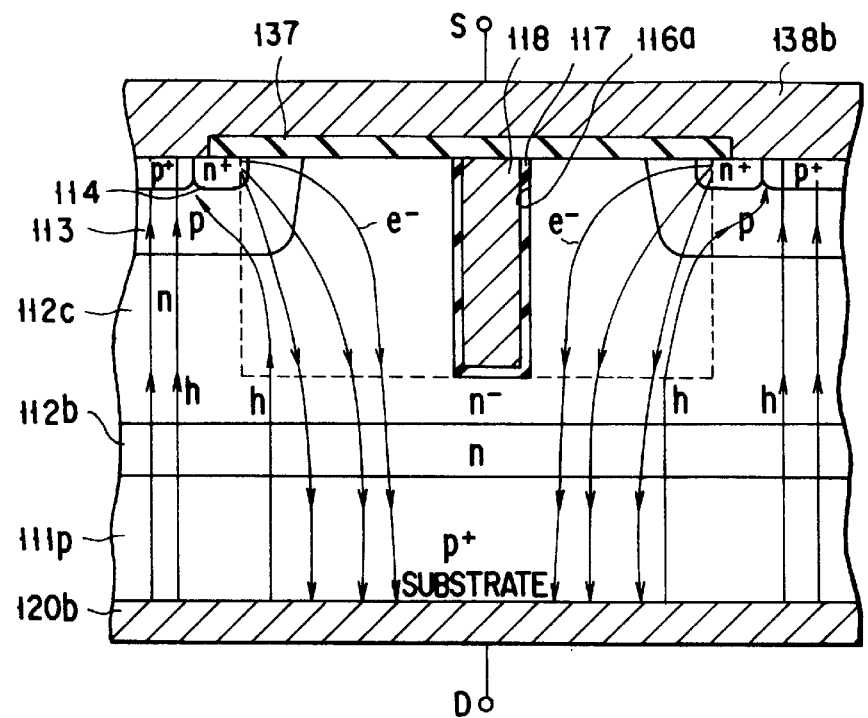
FIG. 49 is a sectional view showing the structure of a modification of the same embodiment.
Figure 50:
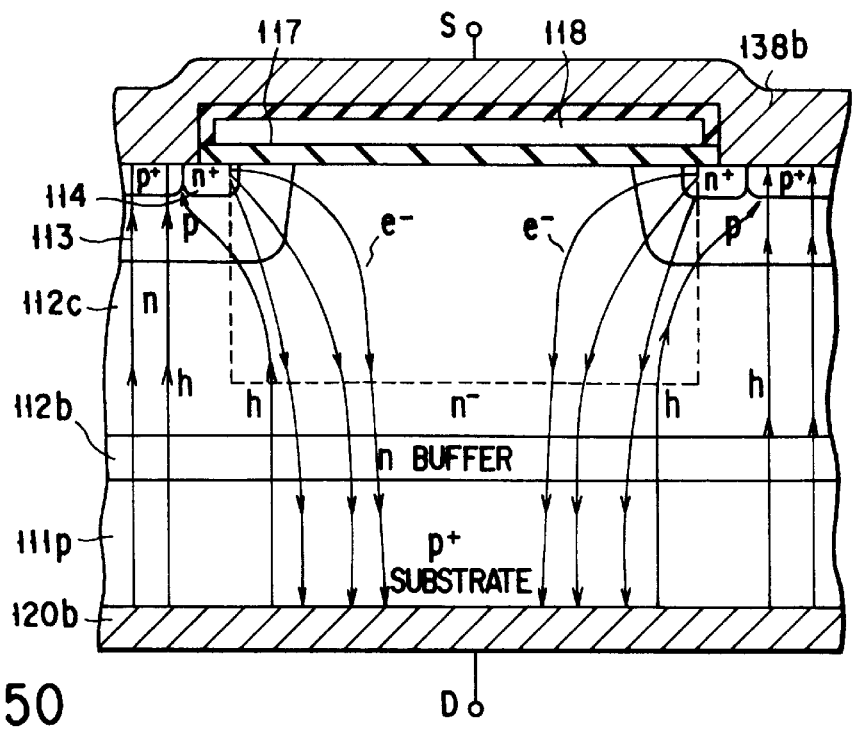
FIG. 50 is a sectional view showing the structure of yet another modification of said modification of the same embodiment.

Further, this embodiment can alternatively be modified in such a manner that, as shown in FIG. 46 which is a plan view, in FIG. 47 which is a sectional view taken along the line 47—47 in FIG. 46 and seen in the direction indicated by arrows, and in FIG. 48 which is a sectional view taken along the line 48—48 in FIG. 46 and seen in the direction indicated by arrows, the trench extending through the centers of the respective trenches in a direction approximately perpendicular to the respective trenches is omitted. According to this structure, also the same effects as those of the sixteenth embodiment can be obtained. Further, this embodiment and its modification can further alternatively be modified into an IGBT (Insulated Gate Bipolar Transistor) in such a manner that, as shown in the sectional views of FIG. 49 or FIG. 50, the n+ type substrate 111*n* is replaced by a p+ type substrate 111*p*.

(Seventeenth Embodiment)

Figure 51:
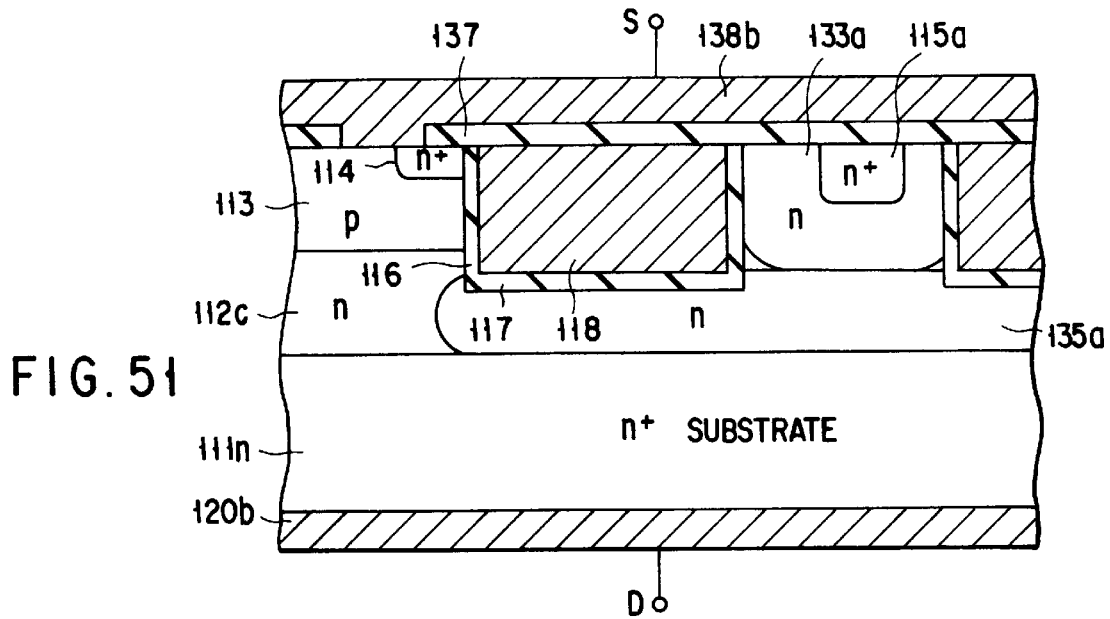
FIG. 51 is plan view showing the structure of the vertical trench MOSFET according to a seventeenth embodiment of the present invention.

FIG. 51 is a sectional view showing the structure of the vertical trench MOSFET according to a seventeenth embodiment of the present invention. This vertical trench MOSFET is constituted in such a manner that, on an n-type substrate 111*n*, an n-type epitaxial layer 112*c* is formed, and, selectively formed in the interface between the n-type epitaxial layer 112*c* and the n-type substrate 111*n* is a stripe-shaped n-type buried layer 135*a* which has a resistance lower than that of the n-type epitaxial layer 112*c*. In the surface of the n-type epitaxial layer 112*c*, a stripe-shaped n-type offset layer 133*a* is selectively formed extending approximately in parallel to the n-type buried layer 135*a* and to a depth reaching said n-type buried layer 135*a*. In the surface of the n-type offset layer 133*a*, a stripe-shaped n-type low-resistance layer 115*a* is selectively formed so as to be approximately in parallel to the n-type offset layer 133*a*.

On the other hand, in a surface region of the n-type epitaxial layer 112*c* which is different from the region in which the n-type offset layer 133*a* is formed, a stripe-shaped p-type well layer 113 is selectively formed so as to be approximately in parallel to said n-type offset layer 133*a*. The end portion of said p-type well layer 113 lies on the end portion of the n-type buried layer 135*a* through the n-type epitaxial layer 112*c*. In the surface of the p-type well layer 113, an n-type source layer 114 is selectively formed so as to be approximately parallel to the p-type well layer 113.

Here, in the intermediate region extending from the end of the n-type source layer 114 to the n-type offset layer 133*a* through the p-type well layer 113 and the n-type epitaxial layer 112*c*, a plurality of trenches 116 are formed extending to a depth reaching the n-type buried layer 135*a* through the p-type well layer 113 and the n-type epitaxial layer 112*c*. Further, the respective trenches 116 each have a stripe-shaped planar shape approximately perpendicular to the n-type source layer 114 and the n-type low-resistance layer 115*a* and are disposed approximately in parallel to one another.

Further, in each trench 116, a gate electrode 118 is formed through a gate insulation film 117. Further, on the intermediate region—including the upper surfaces of the gate electrodes 118—between the n-type source region 114 and the n-type low-resistance layer 115*a*, an insulation layer 137 is formed. A source electrode 138*b* is formed covering the whole upper surface of the insulation layer 137 in a state contacted with the n-type source layer 114. On the other hand, on the opposite surface, with reference to the source electrode 138*b*, of the n-type substrate 111*n*, a drain electrode 120*b* is formed.

Figure 52:
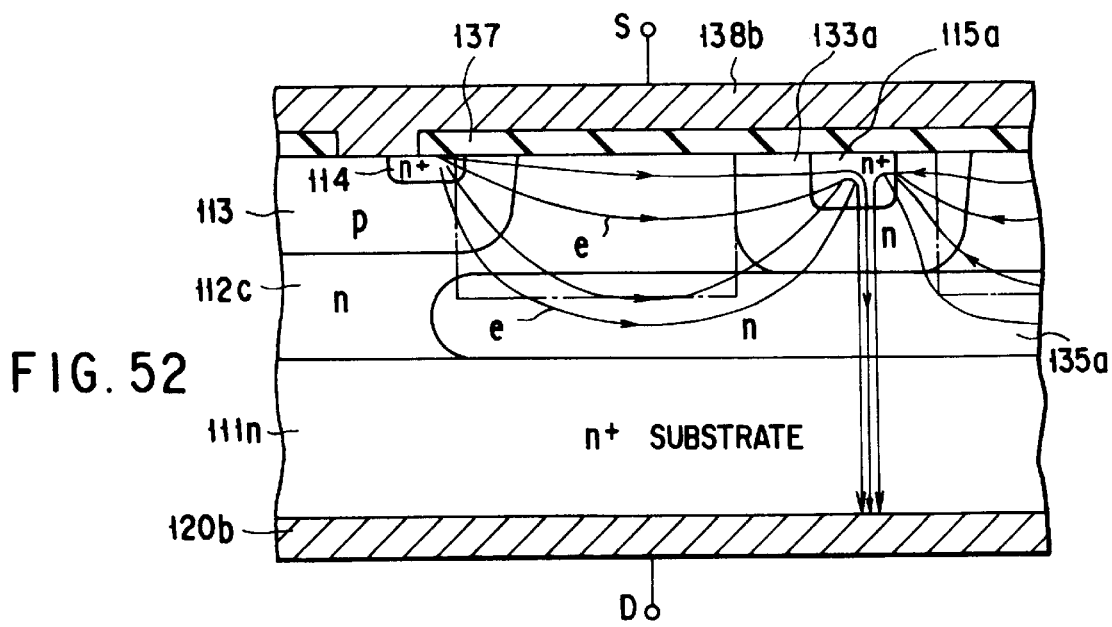
FIG. 52 is a schematic diagram for explaining the current passage in the same embodiment.

According to the structure described above, it is ensured that, in the state in which the element is in condition, the electrons e fed from the source electrode 138*b* are injected into the n-type epitaxial layer 112c via the n-type source layer 114 and then through the inversion layer in the surface of the p-type well layer 113, and then pass along the channel on the side faces of the trenches 116 and through or not through the n-type buried layer 135a to the n-type offset layer 133a, from which said electrons e reach the n-type low-resistance layer 115a, as shown in FIG. 52. These electrons e flow from the n-type low-resistance layer 115a to the n-type substrate 111 via the n-type offset layer 133a and the n-type buried layer 135a, and then flows from the n-type substrate 111n to the drain electrode 120b.

Therefore, according to this embodiment, the same effects as those of the fifteenth embodiment can also be obtained. Further, due to the provision of the n-type buried layer 135a, the electrons e can be made to flow into the n-type low-resistance layer 115a in a state sufficiently spread within the channel width on the side faces of the trenches, so that the ON resistance can be decreased.

Further, the structures shown in FIGS. 42 to 52 can be realized by the use of either monocrystalline silicon or polycrystalline silicon. However, in case monocrystalline silicon is used, the manufacture can be more easily carried out.

(Eighteenth Embodiment)

Figure 53:
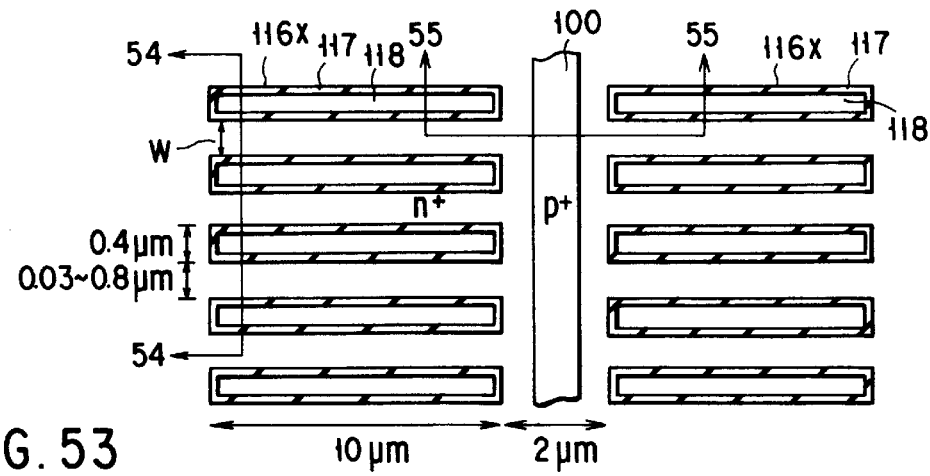
FIG. 53 is a plan view showing the surface structure of the semiconductor layer of the vertical trench MOSFET according to an eighteenth embodiment of the present invention.
Figure 54:
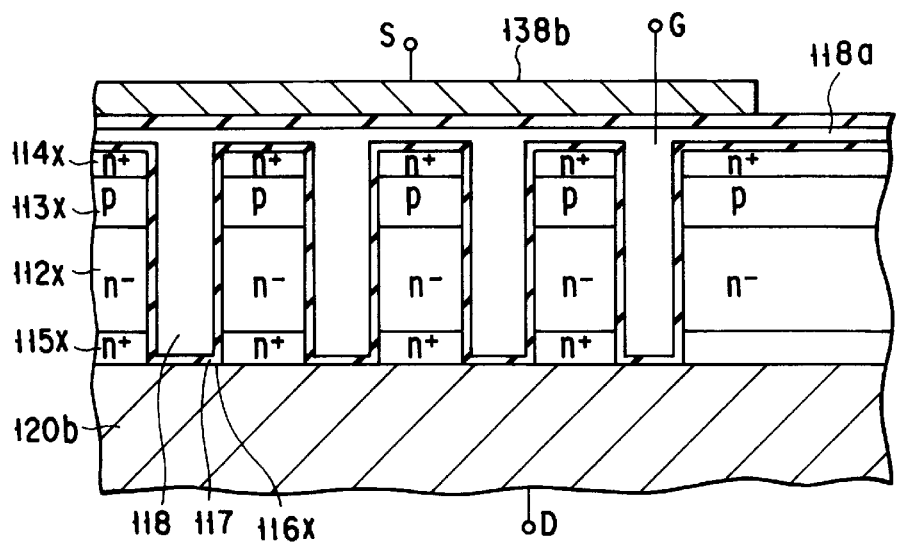
FIG. 54 is a sectional view taken along the line 54—54 in FIG. 53 and seen in the direction indicated by arrows.
Figure 55:
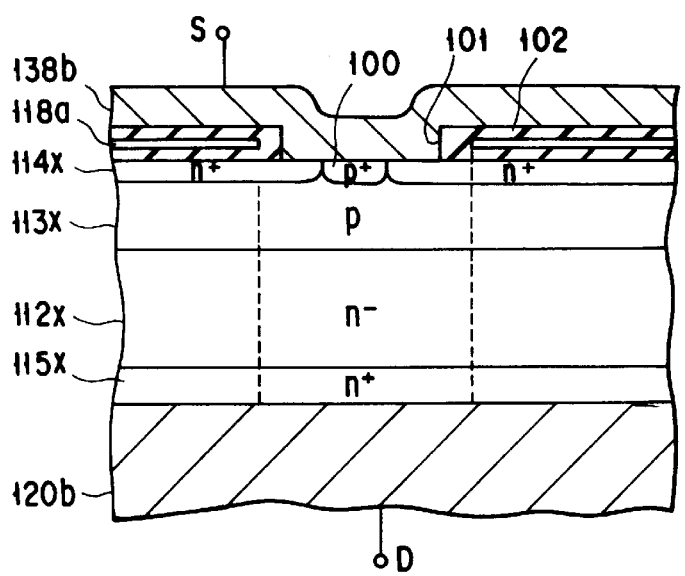
FIG. 55 is a sectional view taken along the line 55—55 in FIG. 53 and seen in the direction indicated by arrows.

FIG. 53 is a plan view showing the surface structure of the semiconductor layer of the vertical trench MOSFET according to an eighteenth embodiment of the present invention, FIG. 54 is a sectional view taken along the line 54—54 in FIG. 53 and seen in the direction indicated by arrows, and FIG. 55 is a sectional view taken along the line 55—55 in FIG. 53 and seen in the direction indicated by arrows.

This semiconductor device is of the structure in which the trench intervals can be shortened, and the semiconductor layer is formed of polycrystalline silicon in view of eliminating a parasitic npn transistor operation.

More specifically, as shown in FIG. 54 and 55, on a drain electrode 120 comprised of a metal layer, an n+ type drain layer 115x having a thickness of 0.2 $\mu$m, an n-type base layer 112x having a thickness of 0.5 $\mu$m, p− type base layer 113x having a thickness of 0.3 $\mu$m, and a p+ type contact layer 100, and a n+ type source layer 114x having a thickness of 2 $\mu$m are successively formed. Here, the p+ type contact layer 100 has a straight-line planar shape and is selectively formed in the surface of the p-type base layer 113x. Further, the n+ type source layer 114x is selectively formed in a surface region of the p-type base layer 113x which (surface region) is different from the surface region in which the p+ type contact layer 100 is formed.

In the n+ type source layer 114x, there are formed a plurality of trenches 116x which have a longitudinal direction approximately perpendicular to the longitudinal direction of the p+ type contact layer 100 and have a depth reading the drain electrode 120b. The trenches 116x each have a width of 0.4 $\mu$m and a length of 10 $\mu$m, and, between the laterally adjacent trenches, an interval W of 0.4 $\mu$m is provided, and, between the longitudinally adjacent trenches, an interval of 2 $\mu$m is given. Further, formed within said interval of 2 $\mu$m is the straight p+ contact layer 100 extending in a direction approximately perpendicular to the longitudinal direction of the trenches 116x.

Further, the above-indicated dimension values are given merely by way of example; for instance, the interval W between the respective trenches can be optionally set to any value between 0.03 and 0.8 $\mu$m. Within each of the trenches 116x, a gate electrode 118 is formed in a state buried therein through an insulation film 117.

Further, a source electrode 138b is formed so as to be contacted with the p+ type contact layer 100 and that portion of the n+ type source layer 114x which lies in the vicinity of the p+ type contact layer 100.

Next, the method for the manufacture of the semiconductor device described above.

On the metal layer used as the drain electrode 120b, an n+ type amorphous silicon layer with a thickness of 0.2 $\mu$m and an n− type high-resistance layer with a thickness of 1 $\mu$m are successively deposited.

Subsequently, by performing an annealing treatment under the condition that the temperature is 600° C. and the time spent is 20 hours, whereby the amorphous silicon is changed into polycrystalline silicon, which is formed into the n+ type drain 115x. Then, boron is injected by ion implantation at 100 kev, and As and boron are injected by ion implantation at 15 keV, whereby the n− type high-resistance layer with a thickness of 1 $\mu$m is formed into a laminated structure consisting of the n− type base layer 112x with a thickness of 0.5 $\mu$m, the p-type layer 113x with a thickness of 0.3 $\mu$m, the n+ type source layer 114x with a thickness of 0.2 $\mu$m and the p+ type contact layer 100 with a thickness of 0.3 $\mu$m.

Then, in accordance with the known manufacturing method using monocrystalline silicon, a MOSFET of the trench structure is manufactured. For instance, by the use of the RIE method, the plurality of trenches 116xextending from the surface of the n+ type source layer 114x to the drain electrode 120b are selectively formed. Subsequently, the insulation film 117 is formed over the whole surface of the substrate, and thereafter, onto the portions of the insulation film 117 lying in the respective trenches 116x, polycrystalline silicon is put in to form the buried gate electrodes 118. The polycrystalline silicon is removed from the surface without a region so as to connect the respective gate electrodes 118. Next, the polycrystalline silicon is changed to low-resistance by diffusing phosphorus, Moreover, on the substrate, an inter-layer insulation layer 102 is selectively formed with a contact hole 101 for exposing the p+ type contact layer 100 and the region lying in the vicinity thereof. Thereafter, the source electrode 138b is formed in contact with the p+ type contact layer 100 and that portion of the n+ type source layer 114x which lies in the vicinity of the p+ type contact layer 100.

As described above, according to this embodiment, the trench type gate electrodes 118 and the contact region of the source electrode 138b are formed in a state separated from each other, so that a narrow trench interval W of 0.5 $\mu$m or less can be realized, and the semiconductor layer is formed of polycrystalline silicon, so that a high switching speed and the cut-off of a large current can be realized at the same time.

That is, by manufacturing a vertical MOSFET by the use of polycrystalline silicon, the amplification factor of the parasitic npn transistor becomes substantially zero, so that the MOSFET can cut off a large current, and the switching speed can be enhanced.

To give a supplementary explanation, the structure according to this embodiment has the defect, in the case of using monocrystalline silicon, that the parasitic transistor operates in a portion apart from the portion where the p-type base layer 113x and the n+ type source layer 114x are short-circuited, so that the switching speed is slow, and a large current cannot be cut off.

For instance, in the MOSFET of the structure according to this embodiment, the current which can be cut off is 1 A in case the MOSFET is composed of monocrystalline silicon. On the other hand, in the MOSFET of the structure according to this embodiment, the current which can be cut off is 20 A in case the MOSFET is composed of polycrystalline silicon; and thus, it is possible to cut off a current more than 20 times as large as the current which can be cut off in the case of the MOSFET composed of monocrystalline silicon.

Further, in the case of a MOSFET composed of polycrystalline silicon, the parasitic transistor does not operate, so that it is possible to make the switching speed at the time of turn-off faster than that in the case of a MOSFET composed of monocrystalline silicon.

Further, the longitudinal direction of the p+ type contact layer 100 and the longitudinal direction of the respective trenches 116x are set in a relationship approximately perpendicular to each other, so that the electrons injected from the source electrode 138b can smoothly flow through the channel region between the trenches.

(Nineteenth Embodiment)

The structures according to the seventh to eighteenth embodiments described above are the basic structures of the present invention pertaining to the trench structure. Next, of the embodiments pertaining to the trench structure, those which each have a source layer and a drain layer in a well layer will be described by the following examples of monocrystalline silicon.

Figure 56:
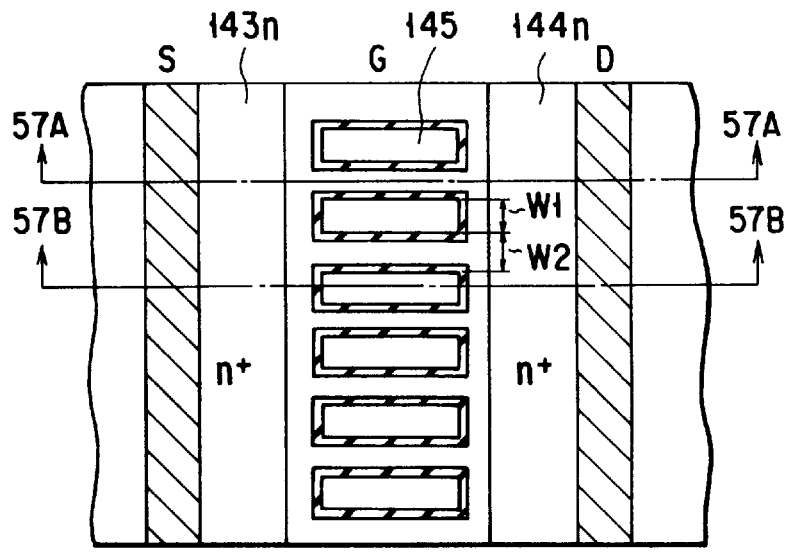
FIG. 56 is a plan view showing the structure of the lateral trench MOSFET according to a nineteenth embodiment of the present invention.
Figure 57A:
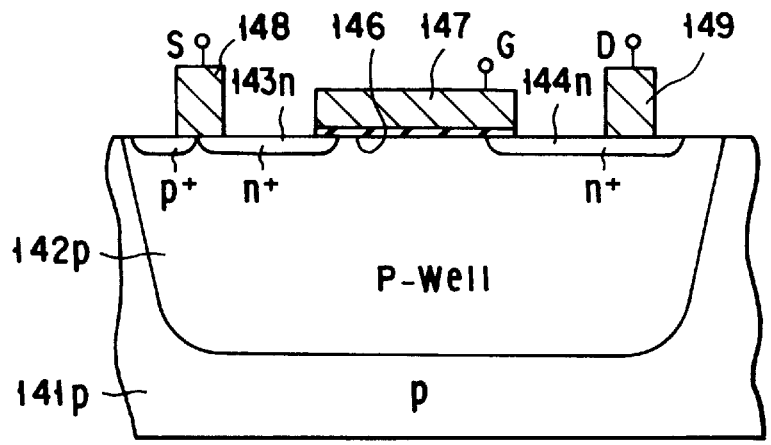
FIG. 57A is a sectional view taken along the line 57A—57A in FIG. 56 and seen in the direction indicated by arrows.
Figure 57B:
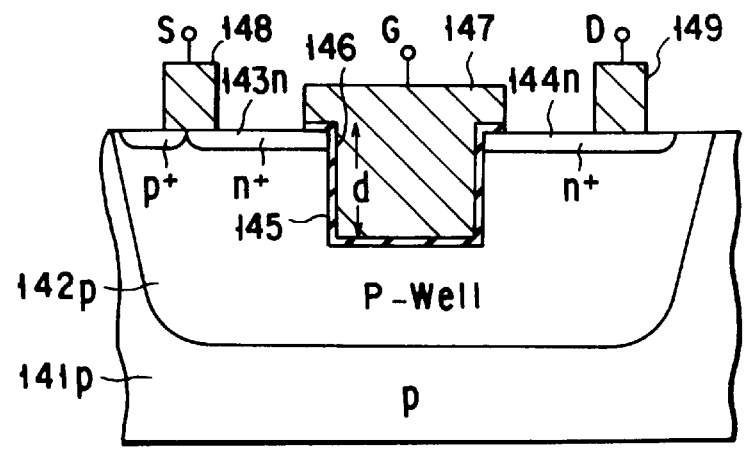
FIG. 57B is a sectional view taken along the line 57B—57B in FIG. 56 and seen in the direction indicated by arrows.

FIG. 56 is a plan view showing the structure of the lateral trench MOSFET according to a nineteenth embodiment of the present invention, FIG. 57A is a sectional view taken along the line 57A—57A in FIG. 56 and seen in the direction indicated by arrows, and FIG. 57B is a sectional view taken along the line 57B—57B in FIG. 56 and seen in the direction indicated by arrows.

This lateral trench MOSFET is constituted in such a manner that, on a p-type substrate 141p, a p-type well layer 142p is selectively formed. In the surface of the p-type well layer 141p, a stripe-shaped n-type source layer 143n is selectively formed, and, at a position apart from said n-type source layer 143n, a stripe-shaped n-type drain layer 144n is selectively formed so as to be parallel to the n-type source layer 143n.

In the intermediate region extending from the end of the n-type drain layer 144n to the p-type well layer 142p and the end of the n-type source 143n, a plurality of trenches 145 are formed in a state extending to an intermediate depth of the p-type well layer 142p. Further, the trenches 145 each have a stripe-like planar shape perpendicular to the n-type source layer 143n and the n-type drain layer 144n and are disposed approximately in parallel to one another.

Further, in the intermediate region between the drain and source and in the respective trenches 145, gate electrodes 147 are formed through gate insulation films 146. On the n-type source layer 143, a source electrode 148 is formed. On the n-type drain layer 144n, a drain electrode 149 is formed.

According to this constitution, if a voltage which is more positive than the source voltage is applied to the gate electrodes 147 when a positive voltage is applied to the drain electrode 149, and a negative voltage is applied to the source electrode 148 as already mentioned, then the surface portion of the p-type well layer 142p which lies adjacent to the gate electrodes 147 is inverted into the n conductivity type, so that electrons flow from the n-type source layer 143 to the n-type drain layer 144n through the inversion layer. That is, the element is brought into conduction.

In this case, in the p-type well layer 142p, a channel is formed along the trenches 145, and thus, a current flows in a state spreading inside as already mentioned. Thus, in accordance with the width of the channel within the p-type well layer 142p, the ON resistance can be decreased.

Here, if it is assumed that the width of each trench 145 is W1, the interval between the respective trenches 145 is W2, and the depth of the trenches is d, then the channel width per unit area can be increased to (W1+W2+2d)/(W1+W2) times as large as that of the conventional device.

Figure 58:
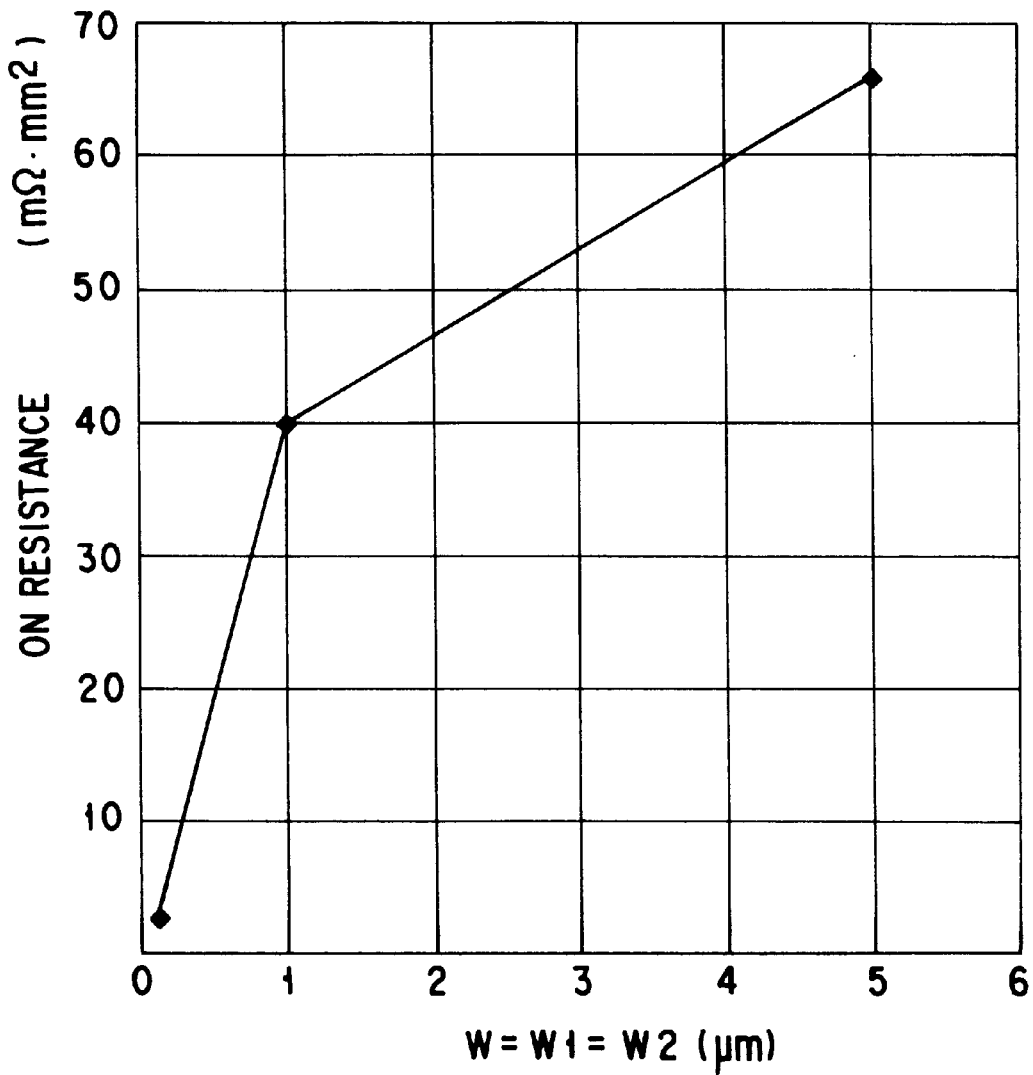
FIG. 58 is schematic diagram showing the relationship between the ON resistance and the trench size in the same embodiment.

FIG. 58 shows the relationship between the ON resistance and W when, for instance, W1=W2=W, and the depth d=1 $\mu$m. If W becomes narrower as shown, the channel width per unit area increases, so that the ON resistance is decreased. Further, in case W2 is 0.6 $\mu$m or below, the portion sandwiched between the trenches 145 becomes perfectly depleted, so that the electric field in the direction perpendicular to the channel is gone, and the decrease of the ON resistance becomes conspicuous. However, when W2 is below 0.03 $\mu$m. the effect of the scattering by the irregularities of the surface is increased, the ON resistance ceases to decrease. Further, in case W2 is narrower than 0.01 $\mu$m, the ON resistance is increased. Thus, it is desirable for W2 to lie within the range of 0.01 to 0.8 $\mu$m as already mentioned.

As described above, according to this embodiment, the n-type source layer 143n and the n-type drain layer 144n are provided in the p-type well layer 142p, but the same effects as those of the seventh embodiment can also be obtained.

(Twentieth Embodiment)

Figure 59:
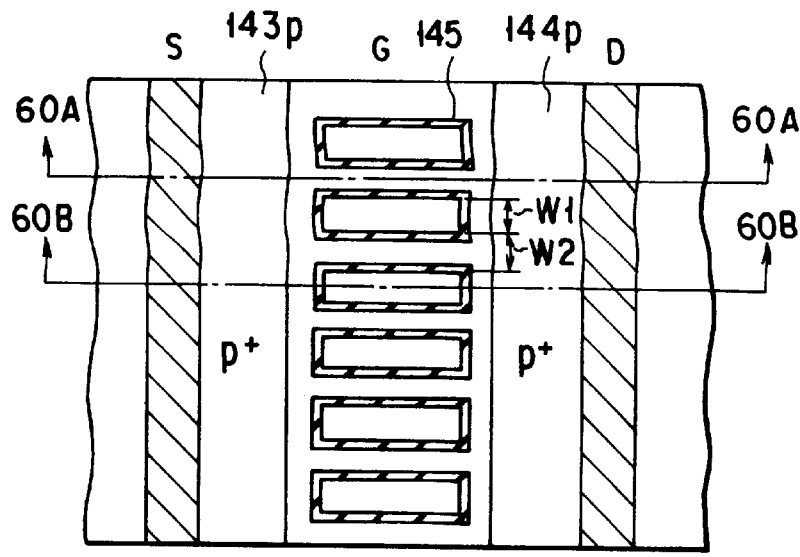
FIG. 59 is a plan view showing the structure of the lateral trench MOSFET according to a twentieth embodiment of the present invention.
Figure 60A:
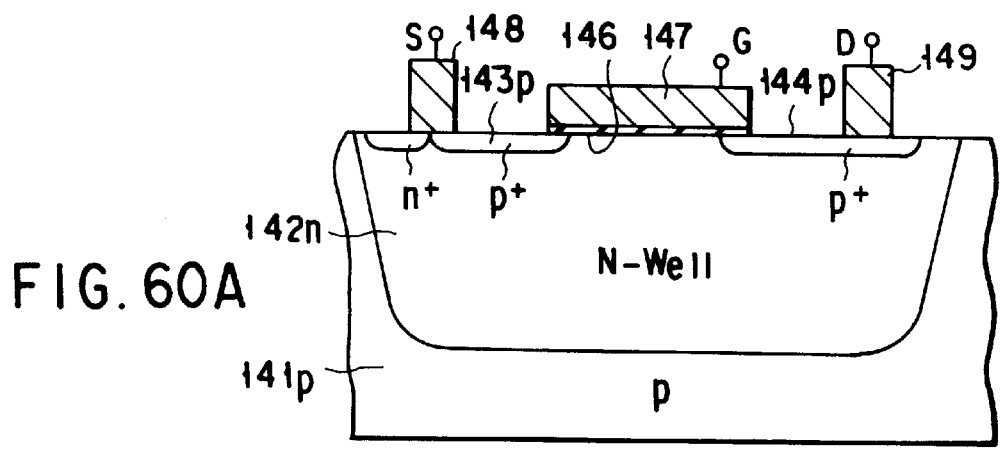
FIG. 60A is a sectional view taken along the line 60A—60A in FIG. 59 and seen in the direction indicated by arrows.
Figure 60B:
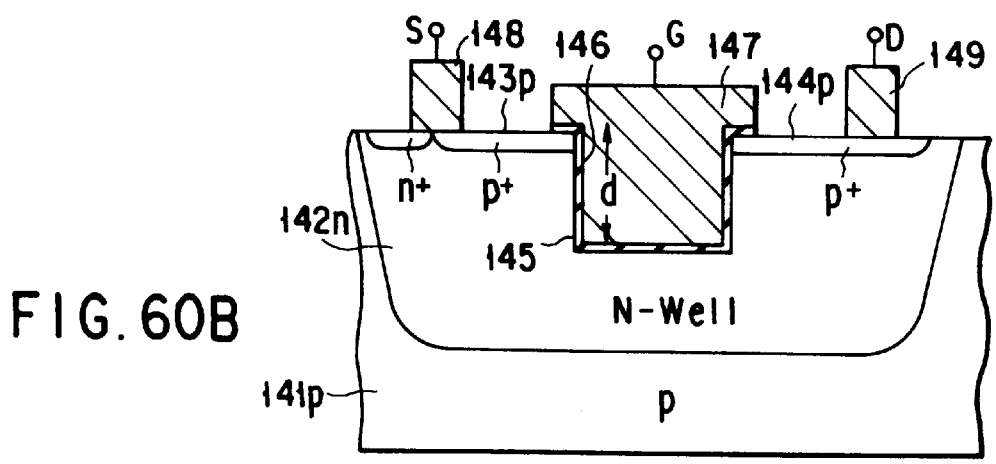
FIG. 60B is a sectional view taken along the line 60B—60B in FIG. 59 and seen in the direction indicated by arrows.

FIG. 59 is a plan view showing the structure of the lateral trench MOSFET according to the twentieth embodiment of the present invention, FIG. 60A is a sectional view taken along the line 60A—60A in FIG. 59 and seen in the direction indicated by arrows, and FIG. 60B is a sectional view taken along the line 60B—60B in FIG. 59 and seen in the direction indicated by arrows.

This embodiment is a structural modification of the nineteenth embodiment; that is, this embodiment is constituted in such a manner that the conductivity types of the p-type well layer 142p, the n-type source layer 143n and the n-type drain layer 144n in the nineteenth embodiment are inverted; and more specifically, in this embodiment, an n-type well layer 142n, a p-type source layer 143p, and a p-type drain layer 144p are provided in place of the p-type well layer 142p, the n-type source layer 143n and the n-type drain layer 144n, respectively.

This embodiment, which is constituted as described above, can also achieve the same effects as those of the nineteenth embodiment. Further, this embodiment, coupled with the nineteenth embodiment, can constitute a bridge circuit or a push-pull circuit.

(Twenty-first Embodiment)

Figure 61:
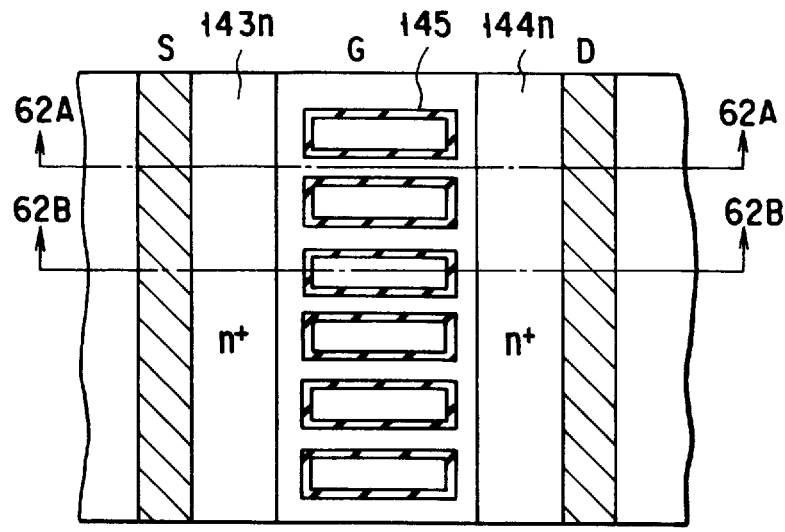
FIG. 61 is a plan view showing the structure of the lateral trench MOSFET according to a twenty-first embodiment of the present invention.
Figure 62A:
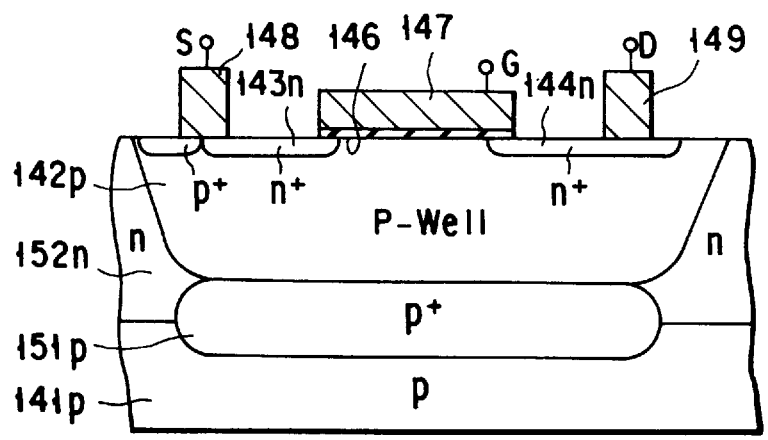
FIG. 62A is a sectional view taken along the line 62A—62A in FIG. 61 and seen in the direction indicated by arrows.
Figure 62B:
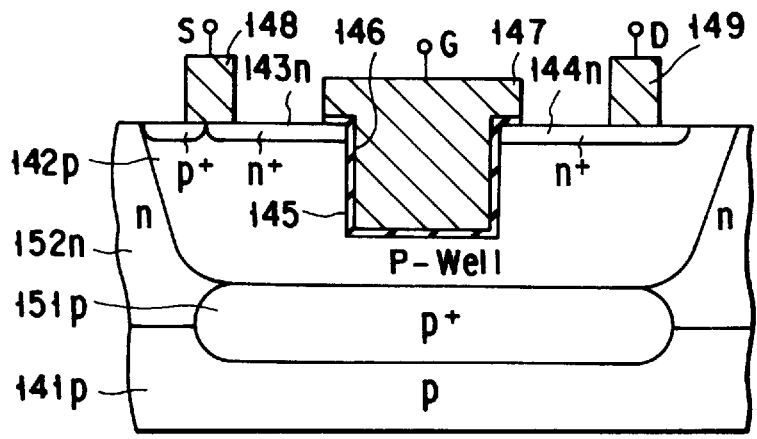
FIG. 62B is a sectional view taken along the line 62B—62B in FIG. 61 and seen in the direction indicated by arrows.

FIG. 61 is a plan view showing the structure of the lateral trench MOSFET according to a twenty-first embodiment of the present invention, FIG. 62A is a sectional view taken along the line 62A—62A in FIG. 61 and seen in the direction indicated by arrows, and FIG. 62B is a sectional view taken along the line 62B—62B in FIG. 61 and seen in the direction indicated by arrows.

This embodiment is a structural modification of the nineteenth embodiment; in this embodiment, the structure of the region adjacent to the p-type well layer in the nineteenth embodiment is modified. More specifically, this embodiment is constituted in such a manner that, in the surface of the p-type substrate, a low-resistance p-type buried layer 151p is formed; on this p-type buried layer 151p, an n-type epitaxial layer 152n is formed; and, in the surface of the n-type epitaxial layer 152n, the p-type well layer 142p is formed so as to reach the p-type buried layer 151p. The structure within the p-type well layer 142p is the same as that of the twelfth embodiment.

According to this structure, the same effects as those of the nineteenth embodiment can also be achieved.

(Twenty-second Embodiment)

Figure 63:
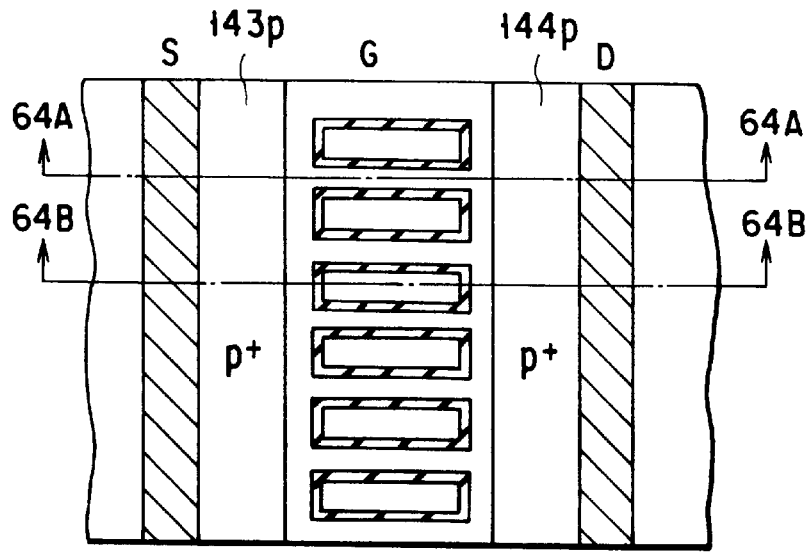
FIG. 63 is a plan view showing the structure of the lateral trench MOSFET according to a twenty-second embodiment of the present invention.
Figure 64A:
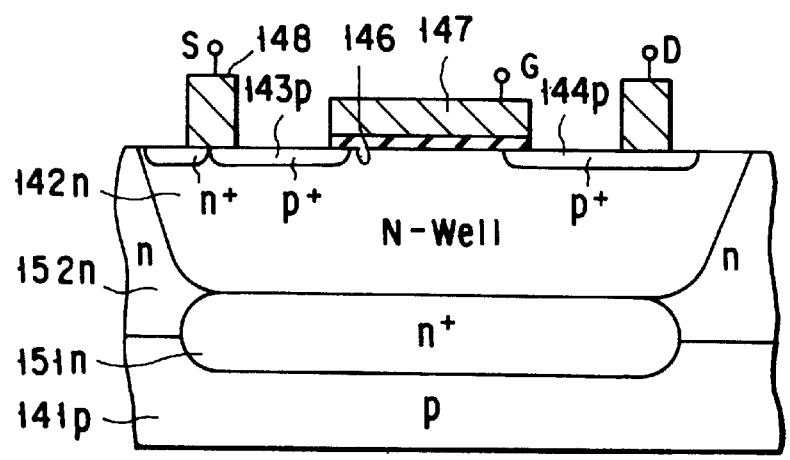
FIG. 64A is a sectional view taken along the line 64A—64A in FIG. 63 and seen in the direction indicated by arrows.
Figure 64B:
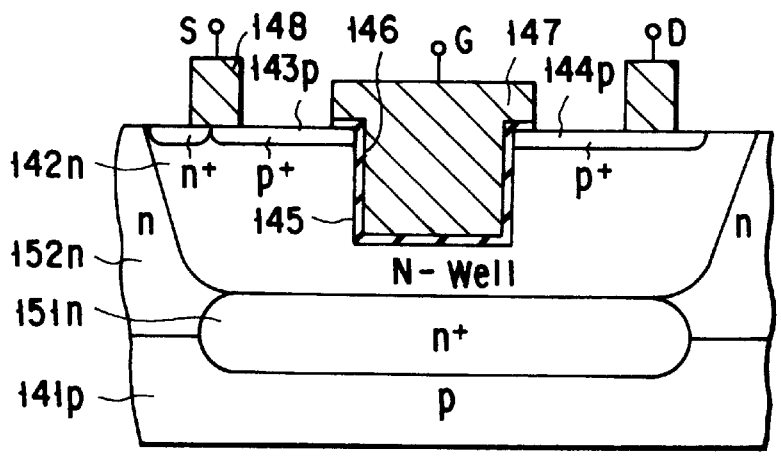
FIG. 64B is a sectional view taken along the line 64B—64B in FIG. 63 and seen in the direction indicated by arrows.

FIG. 63 is a plan view showing the structure of the lateral trench MOSFET according to a twenty-second embodiment of the present invention, FIG. 64A is a sectional view taken along the line 64A—64A in FIG. 63 and seen in the direction indicated by arrows, and FIG. 64B is a sectional view taken along the line 64B—64B in FIG. 63 and seen in the direction indicated by arrows.

This embodiment is a structural modification of the twenty-first embodiment; that is, this embodiment is constituted in such a manner that the conductivity types of the p-type buried layer 151p, the p-type well layer 142p, the n-type source layer 143n and the n-type drain layer 144n in the twenty-first embodiment are inverted, respectively. More specifically, in this embodiment, an n-type buried layer 151n, an n-type well layer 142n, a p-type source layer 143p and a p-type drain layer 144p are provided in place of the p-type buried layer 151p, the p-type well layer 142p, the n-type source layer 144n and the n-type drain layer 144n in the twenty-first embodiment.

According to this structure, the same effects as those of the twenty-first embodiment can also be achieved. Further, this embodiment, coupled with the twenty-first embodiment, can constitute a bridge circuit or a push-pull circuit.

(Twenty-third Embodiment)

Figure 65:
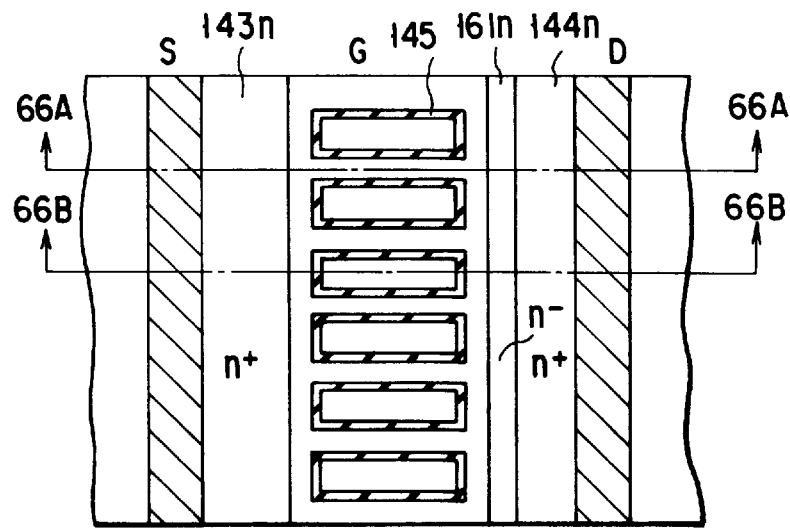
FIG. 65 is a plan view showing the structure of the lateral trench MOSFET according to a twenty-third embodiment of the present invention.
Figure 66A:
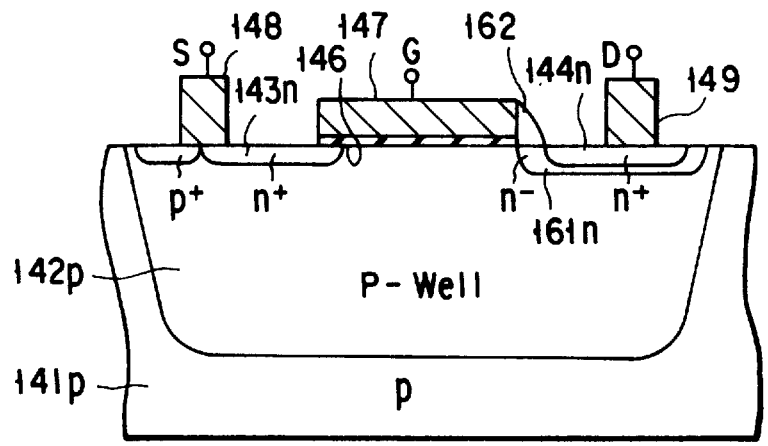
FIG. 66A is a sectional view taken along the line 66A—66A in FIG. 65 and seen in the direction indicated by arrows.
Figure 66B:
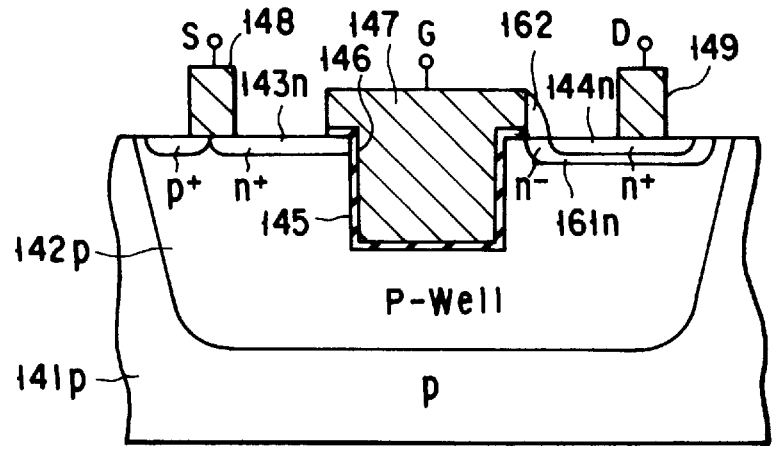
FIG. 66B is a sectional view taken along the line 66B—66B in FIG. 65 and seen in the direction indicated by arrows.

FIG. 65 is a plan view showing the structure of the lateral trench MOSFET according to a twenty-third embodiment of the present invention, FIG. 66A is a sectional view taken along the line 66A—66A in FIG. 65 and seen in the direction indicated by arrows, and FIG. 66B is a sectional view taken along the line 66B—66B in FIG. 65 and seen in the direction indicated by arrows.

This embodiment is a structural modification of the nineteenth embodiment; more specifically, this embodiment is constituted in such a manner that, between the n-type drain layer 144n and the p-type well layer 142p, there is provided an n-type offset layer 161n having a resistance higher than that of the n-type drain layer 144n.

Here, the n-type offset layer 161n can be formed in self-aligning manner by the use of the gate electrode 147 as a mask. Further, the n-type drain layer 144n can be formed in such a manner that, for instance, after the formation of the n-type offset layer 161n, an oxide film is formed at least on the gate electrodes 147 and the n-type offset layer 161, and then, the oxide film is removed by the use of RIE to form side walls 162—comprising the oxide film—for the gate electrodes 147; and further, by the use, as a mask, of the gate electrode 147 and the side wall 162 thereof, said n-type drain layer 144n can be formed in self-aligning manner by diffusion.

According to this structure, the same effects as those of the nineteenth embodiment can also be achieved. Further, in the case of this embodiment, it is ensured that, even if the gate insulation film 146 becomes thin, and the p-type well layer 142p becomes highly concentrated as compared with the nineteenth embodiment, the electric field at the end of the drain under the gate can be relaxed, so that the breakdown voltage can be maintained.

(Twenty-fourth Embodiment)

Figure 67:
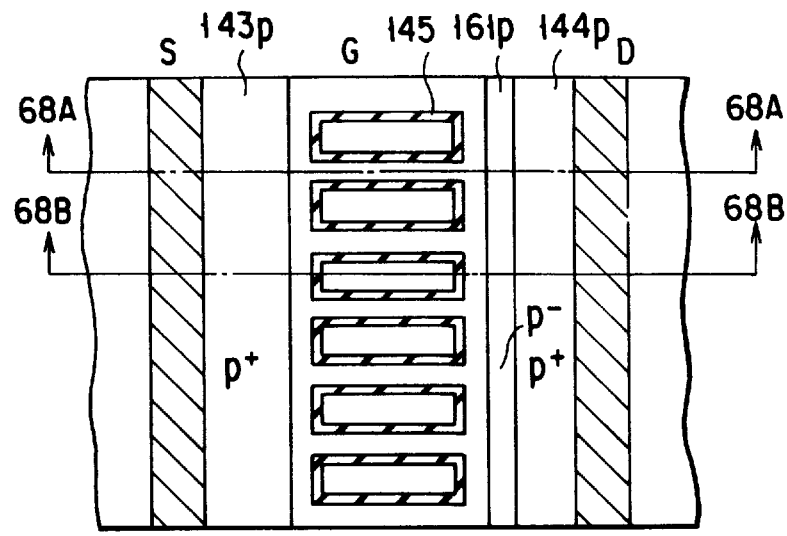
FIG. 67 is a plan view showing the structure of the lateral trench MOSFET according to a twenty-fourth embodiment of the present invention.
Figure 68A:
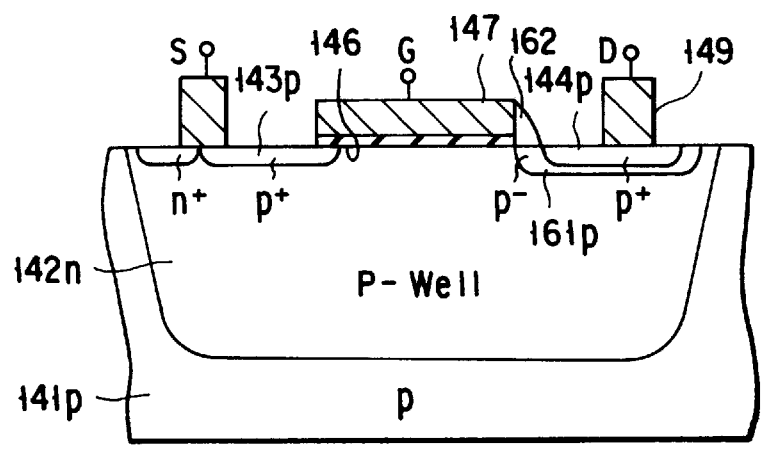
FIG. 68A is a sectional view taken along the line 68A—68A in FIG. 67 and seen in the direction indicated by arrows.
Figure 68B:
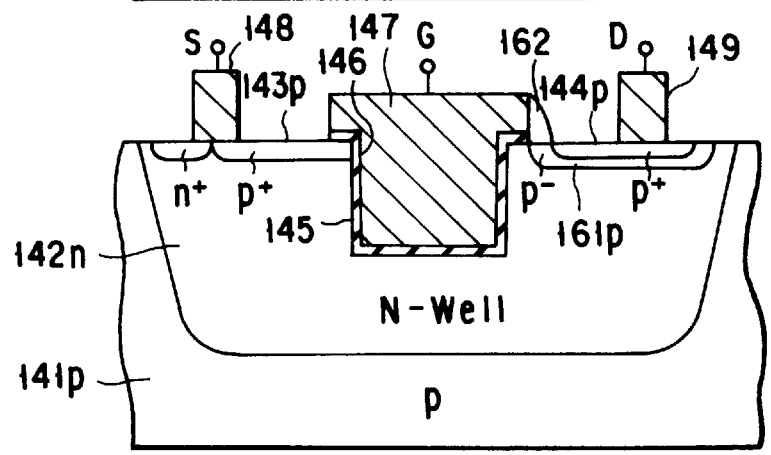
FIG. 68B is a sectional view taken along the line 68B—68B in FIG. 67 and seen in the direction indicated by arrows.

FIG. 67 is a plan view showing the structure of the lateral trench MOSFET according to a twenty-fourth embodiment of the present invention, FIG. 68A is a sectional view taken along the line 68A—68A in FIG. 67 and seen in the direction indicated by arrows, and FIG. 68B is a sectional view taken along the line 68B—68B in FIG. 67 and seen in the direction indicated by arrows.

This embodiment is a structural modification of the twenty-third embodiment. This embodiment is constituted in such a manner that the conductivity types of the p-type well layer 142p, the n-type source layer 143n, the n-type offset layer 161n and the n-type drain layer 144n in the twenty-third embodiment are inverted. More specifically, in this embodiment, an n-type well layer 142n, a p-type source layer 143p, a p-type offset layer 161p and a p-type drain layer 1441p are provided in place of the p-type well layer 142p, the n-type source layer 143n, the n-type offset layer 161n and the n-type drain layer 144n.

According to this structure, the same effects as those of the twenty-third embodiment can also be achieved. Further, this embodiment, coupled with the twenty-third embodiment, can constitute a bridge circuit or a push-pull circuit.

(Twenty-fifth Embodiment)

Figure 69:
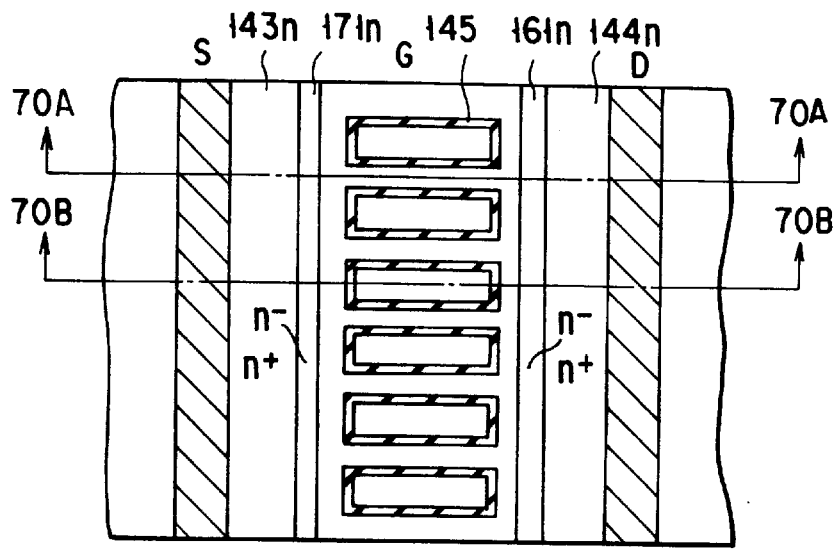
FIG. 69 is a plan view showing the structure of the lateral trench MOSFET according to a twenty-fifth embodiment of the present invention.
Figure 70A:
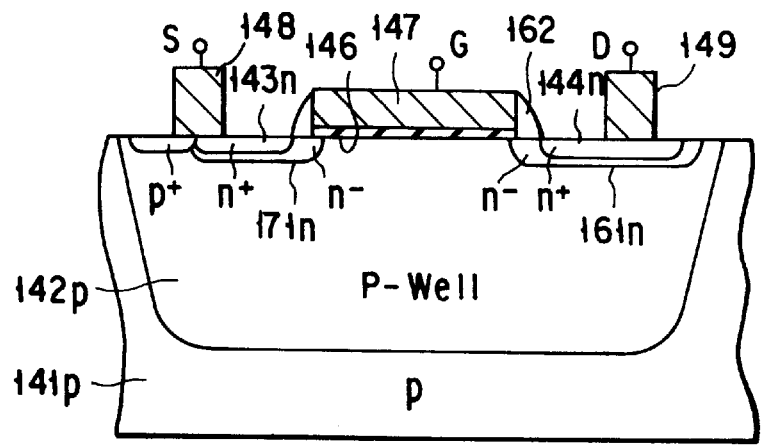
FIG. 70A is a sectional view taken along the line 70A—70A in FIG. 69 and seen in the direction indicated by arrows.
Figure 70B:
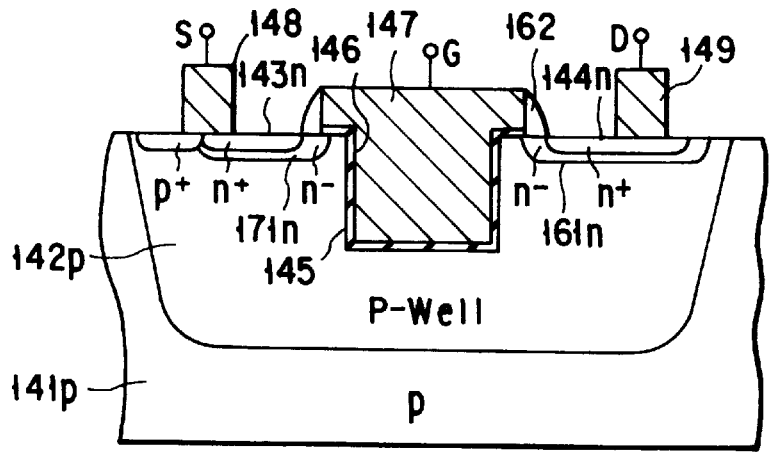
FIG. 70B is a sectional view taken along the line 70B—70B in FIG. 69 and seen in the direction indicated by arrows.

FIG. 69 is a plan view showing the structure of the lateral trench MOSFET according to a twenty-fifth embodiment of the present invention, FIG. 70A is a sectional view taken along the line 70A—70A in FIG. 69, and FIG. 70B is a sectional view taken along the line 70B—70B in FIG. 69 and seen in the direction indicated by arrows.

This embodiment is a structural modification of the twenty-third embodiment. More specifically, this embodiment is constituted in such a manner that, between the n-type source layer 143n and the p-type well layer 142p, there is provided an n-type low-concentration layer 171n which has a resistance higher than the resistance of the n-type source layer 143n.

Here, the n-type low-concentration layer 171n is formed, simultaneously with the formation of the afore-said n-type offset layer 161n, by the use of manufacturing steps similar to those for the above-mentioned n-type offset layer 161n. Further, similarly, the n-type source layer 143n is formed simultaneously with the formation of the afore-said n-type drain layer 144n, by the use of manufacturing steps similar to those for the n-type drain layer 144n.

According to this structure, the same effects as those of the twenty-third embodiment can also be achieved. Further, in the case of this embodiment, the n-type source layer 143n and the n-type drain layer 144n can be formed at the same time, so that the number of manufacturing steps can be reduced.

(Twenty-six Embodiment)

Figure 71:
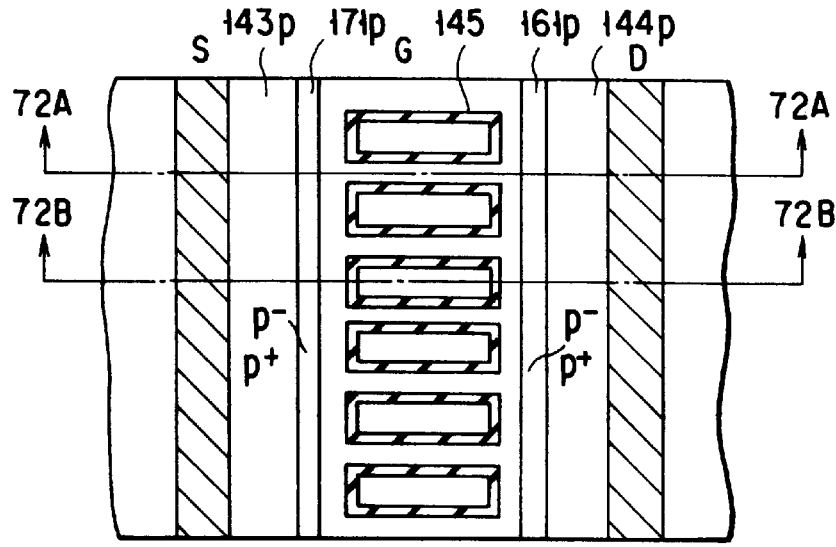
FIG. 71 is a plan view showing the structure of the lateral trench MOSFET according to a twenty-sixth embodiment of the present invention.
Figure 72A:
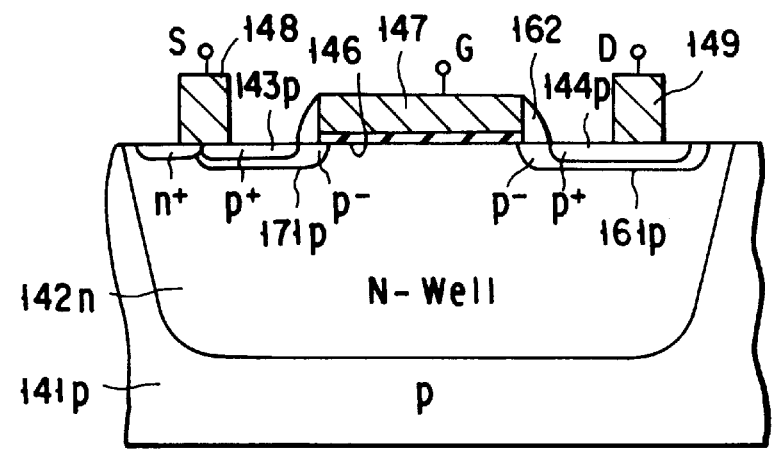
FIG. 72A is a sectional view taken along the line 72A—72A in FIG. 71 and seen in the direction indicated by arrows.
Figure 72B:
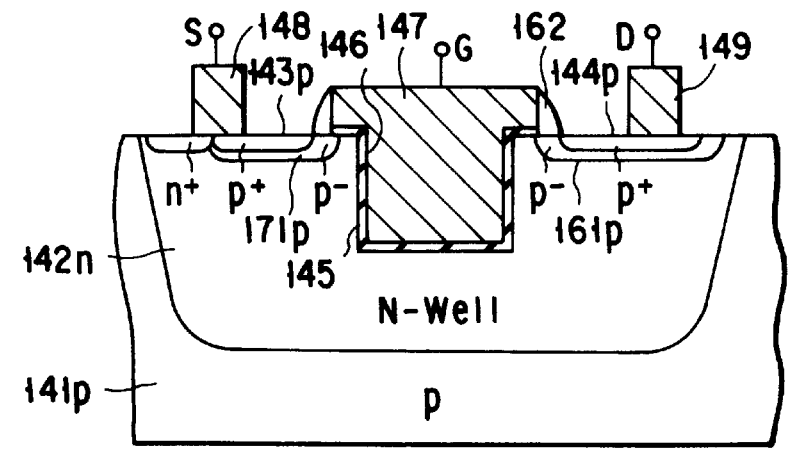
FIG. 72B is a sectional view taken along the line 72B—72B in the FIG. 71 and seen in the direction indicated by arrows.

FIG. 71 is a plan view showing the structure of the lateral trench MOSFET according to the twenty-sixth embodiment of the present invention, FIG. 72A is a sectional view taken along the line 72A—72A in FIG. 71 and seen in the direction indicated by arrows and seen in the direction indicated by arrows, and FIG. 72B is a sectional view taken along the line 72B—72B in FIG. 71 and seen in the direction indicated by arrows.

This embodiment is a structural embodiment of the twenty-fifth embodiment. This embodiment is constituted in such a manner that the conductivity types of the p-type well layer 142p, the n-type source layer 143n, the n-type low-concentration layer 171n, the n-type offset layer 161n and the n-type drain layer 144n are inverted. More specifically, in this embodiment, an n-type well layer 142n, a p-type source layer 143p, a p-type low-concentration layer 171p, a p-type offset layer 161p and a p-type drain layer 144p are provided in place of the p-type well layer 142p, the n-type source layer 143n, the n-type low-concentration layer 171n, the n-type offset layer 161n and the n-type drain layer 144n in the twenty-fifth embodiment.

According to this structure, the same effects as those of the twenty-fifth embodiment can also be achieved. Further, this embodiment, coupled with the twenty-fifth embodiment, can constitute a bridge circuit or a push-pull circuit.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirits or scope of the general inventive concept as defined by the appended claims and their equivalents.

For instance, in the foregoing embodiments, the p conductivity type is referred to as the first conductivity type, and the n conductivity type is referred to as the second conductivity type, but, in said embodiments, the conductivity types referred to can all be inverted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a drain electrode;

a drain layer of a second conductivity type formed on said drain electrode;

a high-resistance layer of the second conductivity type formed on said drain layer of the second conductivity type, said high-resistance layer of the second conductivity type having a resistance higher than that of said drain layer of the second conductivity type;

base layers of a first conductivity type selectively formed in said high-resistance layer of the second conductivity type and disposed approximately in parallel to each other;

source layers of the second conductivity type selectively formed in the surface of said base layers of the first conductivity type and disposed approximately parallel to each other;

a source electrode formed on said source layers of the second conductivity type; and gate electrodes formed in a buried state through gate insulation films in a plurality of trenches formed, and in the surface portion between said source layers of the second conductivity type through base layers of the first conductivity type and into said high-resistance layer of the second conductivity type, said trenches extending to an intermediate depth of said high-resistance layer of the second conductivity type;

wherein said trenches each have a surface longitudinal shape extending in a direction approximately perpendicular to that of said source layers of the second conductivity type.

2. The semiconductor device according to claim 1, wherein:

said trenches are connected through the center portions of each other, and said surface shape of said trenches is of a continuous and approximately cross-shape.

3. The semiconductor device according to claim 1, comprising:

said base and source layers having a stripe shape extending in a longitudinal direction; and said gate electrodes extending in a direction substantially perpendicular to said longitudinal direction.

4. The semiconductor device of claim 1, wherein:

said base layers comprise a first pair of parallel disposed regions separated by a portion of said high-resistance layer extending in a longitudinal direction;

said source layers comprise a second pair of parallel disposed regions respectively formed in said first pair of regions extending in said longitudinal direction; and said gate regions extend between said first and second pair of regions in said portion of said high-resistance layer in a direction substantially perpendicular to said longitudinal direction.

5. A semiconductor device comprising:

a drain electrode;

a drain layer of a first conductivity type formed on said drain electrode;

a high-resistance layer of a second conductivity type formed on said drain layer of the first conductivity type, said high-resistance layer of the second conductivity type having a resistance higher than that of said drain layer of the first conductivity type;

base layers of the first conductivity type selectively formed in said high-resistance layer of the second conductivity type and disposed approximately in parallel to each other;

source layers of the second conductivity type selectively formed in the surface of said base layers of the first conductivity type and disposed approximately parallel to each other;

source electrode formed on said source layers of the second conductivity type; and gate electrodes formed in a buried state through gate insulation films in a plurality of trenches formed, and in the surface portion between said source layers of the second conductivity type through base layers of the first conductivity type and into said high-resistance layer of the second conductivity type, said trenches extending to an intermediate depth of said high-resistance layer of the second conductivity type;

wherein said trenches each have a surface longitudinal shape extending in a direction approximately perpendicular to that of said source layers of the second conductivity type.

6. The semiconductor device according to claim 5, wherein:

said trenches are connected through the center portions of each other, and said surface shape of said trenches is of a continuous and approximately cross-shape.

7. The semiconductor device according to claim 5, comprising:

said base and source layers having a stripe shape extending in a longitudinal direction; and said gate electrodes extending in a direction substantially perpendicular to said longitudinal direction.

8. The semiconductor device of claim 5, wherein:

said base layers comprise a first pair of parallel disposed regions separated by a portion of said high-resistance layer extending in a longitudinal direction;

said source layers comprise a second pair of parallel disposed regions respectively formed in said first pair of regions extending in said longitudinal direction; and said gate regions extend between said first and second pair of regions in said portion of said high-resistance layer in a direction substantially perpendicular to said longitudinal direction.

* * * * *